US012755937B2

(12) United States Patent
Nagashima et al.

(10) Patent No.: US 12,755,937 B2
(45) Date of Patent: Oct. 6, 2026

(54) PLASMA PROCESSING APPARATUS

(71) Applicant: Tokyo Electron Limited, Tokyo (JP)

(72) Inventors: Nozomu Nagashima, Miyagi (JP); Daisuke Yoshikoshi, Miyagi (JP); Kunihiko Yamagata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 53 days.

(21) Appl. No.: 19/002,994

(22) Filed: Dec. 27, 2024

(65) Prior Publication Data

US 2025/0149307 A1 May 8, 2025

Related U.S. Application Data

(63) Continuation of application No. PCT/JP2023/017793, filed on May 11, 2023.

(Continued)

(51) Int. Cl.
*H01J 37/32* (2006.01)

(52) U.S. Cl.
CPC .. *H01J 37/32174* (2013.01); *H01J 37/32091* (2013.01); *H01J 37/3211* (2013.01);
(Continued)

(58) Field of Classification Search
CPC ........... H01J 37/32174; H01J 37/32091; H01J 37/3211; H01J 37/32146; H01J 37/32568;
(Continued)

(56) References Cited

U.S. PATENT DOCUMENTS

2014/0084698 A1* 3/2014 Asanuma ................. H04B 5/79 307/104
2015/0138031 A1 5/2015 van Gils et al.
2021/0005474 A1* 1/2021 Hong .................. H10P 72/3204

FOREIGN PATENT DOCUMENTS

JP 2013055129 A 3/2013
JP 2014176155 A * 9/2014 ............. H02J 50/70
(Continued)

OTHER PUBLICATIONS

Machine Translation of JP2014176155A (Year: 2014).*
(Continued)

*Primary Examiner* — Alexander H Taningco
*Assistant Examiner* — Pedro C Fernandez
(74) *Attorney, Agent, or Firm* — XSENSUS LLP

(57) ABSTRACT

Provided is a plasma processing apparatus comprising: a plasma processing chamber; a substrate support; a high frequency power supply; an electrode or an antenna electrically connected to the high frequency power supply; a power consuming member disposed within the plasma processing chamber or the substrate support; an electricity storage unit electrically connected to the power consuming member; a power transmitting coil provided outside the plasma processing chamber; a power receiving coil electrically connected to the electricity storage unit and capable of receiving power from the power transmitting coil; at least one metal case that provides a shielded space and accommodates the power transmitting coil and the power receiving coil within the shielded space; and at least one ferrite material that is disposed within the shielded space and is provided to close a space in which the power transmitting coil and the power receiving coil are disposed.

12 Claims, 71 Drawing Sheets

Related U.S. Application Data

(60) Provisional application No. 63/356,713, filed on Jun. 29, 2022.

(52) U.S. Cl.
CPC .. *H01J 37/32146* (2013.01); *H01J 37/32568* (2013.01); *H01J 37/32651* (2013.01); *H01J 2237/334* (2013.01)

(58) Field of Classification Search
CPC ............... H01J 37/32651; H01J 37/321; H01J 37/32577; H01J 37/32; H01J 37/32183; H01J 37/32697; H01J 37/32724; H01J 37/32715; H01J 2237/334; H05H 1/46; H10P 14/60; H10P 50/00; H02J 7/90; H02J 50/10
See application file for complete search history.

(56) References Cited

FOREIGN PATENT DOCUMENTS

| | | | | | |
|---|---|---|---|---|---|
| JP | 2015-173027 | A | | 10/2015 | |
| JP | 2017054646 | A | * | 3/2017 | |
| KR | 20210154579 | A | * | 12/2021 | ........ H01J 37/32183 |
| WO | 2014132518 | A1 | | 9/2014 | |

OTHER PUBLICATIONS

Machine Translation of JP2017054464A (Year: 2017).*
Machine Translation of KR20210154579A (Year: 2021).*
International Search Report and Written Opinion mailed on Jul. 11, 2023, received for PCT Application PCT/JP2023/017793, filed on May 11, 2023, 8 pages including English Translation.

* cited by examiner

PLASMA PROCESSING APPARATUS

CROSS-REFERENCE TO RELATED APPLICATIONS

This application is a bypass continuation application of International Application No. PCT/JP2023/017793 having an international filing date of May 11, 2023 and designating the United States, the International Application being based upon and claiming the benefit of priority from the U.S. Provisional Patent Application No. 63/356,713 filed on Jun. 29, 2022, the entire contents of each are incorporated herein by reference.

TECHNICAL FIELD

An exemplary embodiment of the present disclosure relates to a plasma processing apparatus.

BACKGROUND

The plasma processing apparatus is used in the plasma processing. The plasma processing apparatus includes a chamber and a substrate support (mounting table) disposed within the chamber. The substrate support has a base (lower electrode) and an electrostatic chuck that holds a substrate. A temperature adjustment element (for example, a heater) for adjusting the temperature of the substrate is provided inside the electrostatic chuck. In addition, a filter is provided between the temperature adjustment element and a power supply for the temperature adjustment element to attenuate or block high frequency noise entering lines such as power-feeding lines and/or signal wires from high frequency electrodes and/or other electrical members within the chamber. One type of such plasma processing apparatus is disclosed in Japanese Laid-open Patent Publication No. 2015-173027.

SUMMARY

An exemplary embodiment of the present disclosure provides a technology that enables improvement of power transmission efficiency and suppression of high frequency leakage between a power transmitting coil and a power receiving coil.

In accordance with an aspect of the present disclosure, there is provided a plasma processing apparatus comprising: a plasma processing chamber; a substrate support disposed within the plasma processing chamber; a high frequency power supply configured to generate high frequency power; an electrode or an antenna electrically connected to the high frequency power supply to receive the high frequency power for generating a plasma from a gas within the plasma processing chamber; a power consuming member disposed within the plasma processing chamber or the substrate support; an electricity storage unit electrically connected to the power consuming member; a power transmitting coil provided outside the plasma processing chamber; a power receiving coil electrically connected to the electricity storage unit and capable of receiving power from the power transmitting coil by electromagnetic induction coupling; at least one metal case that provides a shielded space and accommodates the power transmitting coil and the power receiving coil within the shielded space; and at least one ferrite material that is disposed within the shielded space and is provided to close a space in which the power transmitting coil and the power receiving coil are disposed.

Figure 23A:
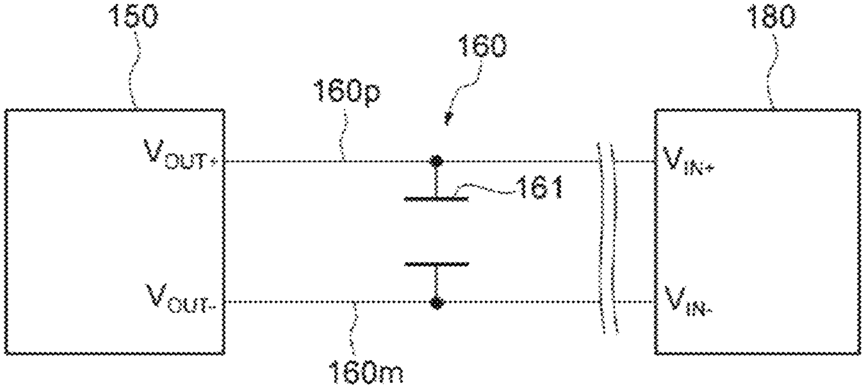
Figure 23B:
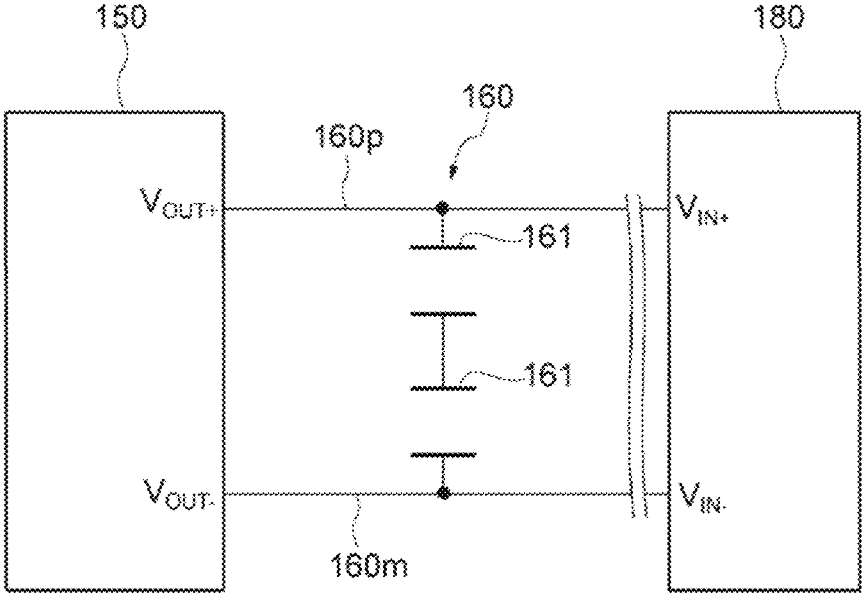

Each of FIGS. 23A and 23B is a diagram illustrating an electricity storage unit according to one exemplary embodiment.

Figure 24:
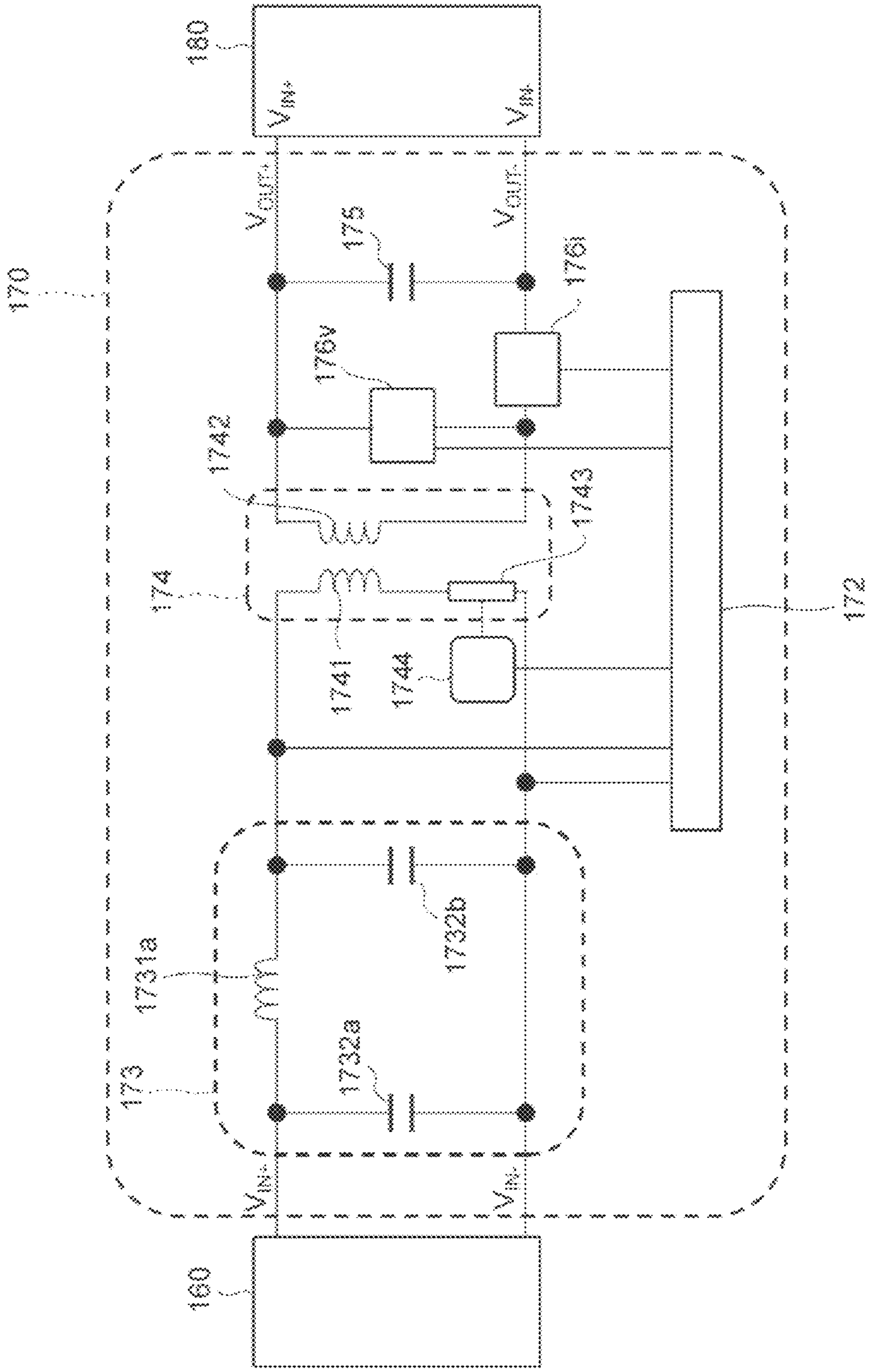

FIG. 24 is a diagram illustrating a voltage control converter according to one exemplary embodiment.

Figure 25:
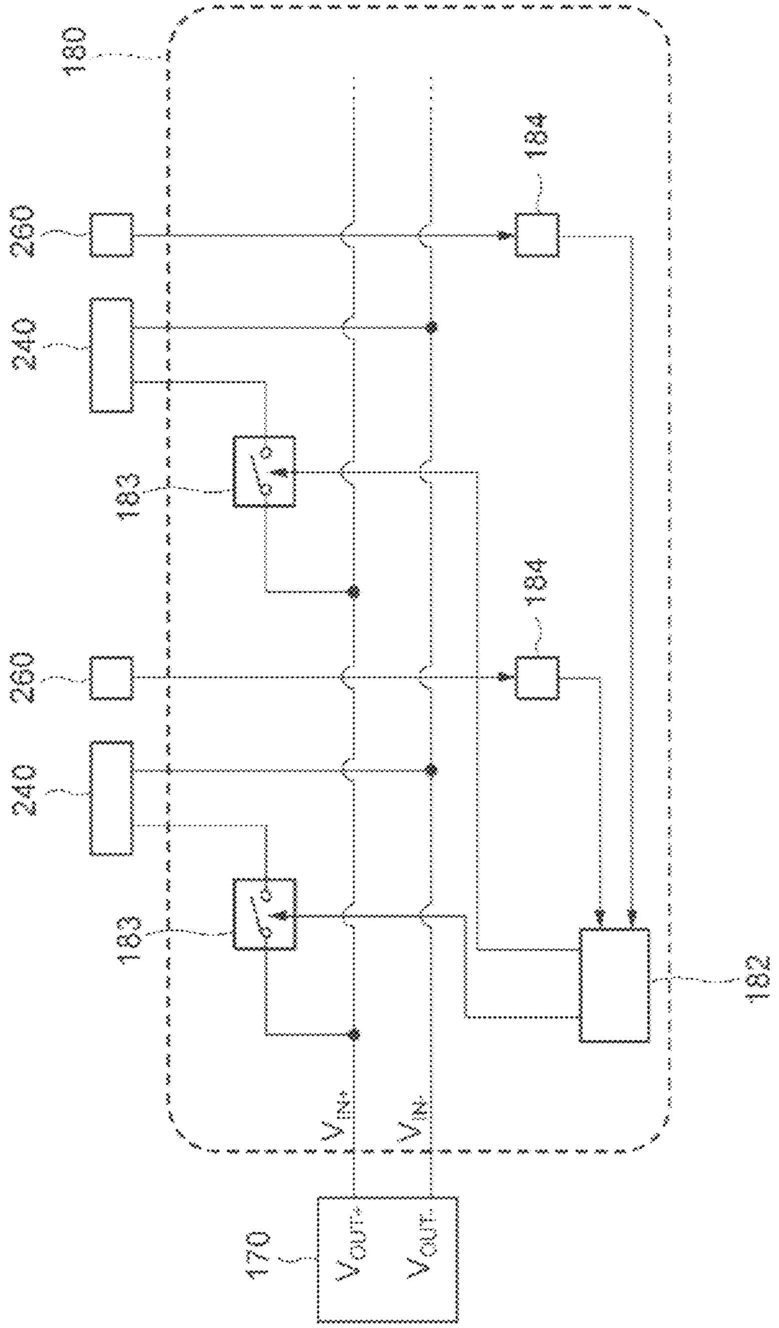

FIG. 25 is a diagram illustrating a constant voltage controller according to one exemplary embodiment.

Figure 26:
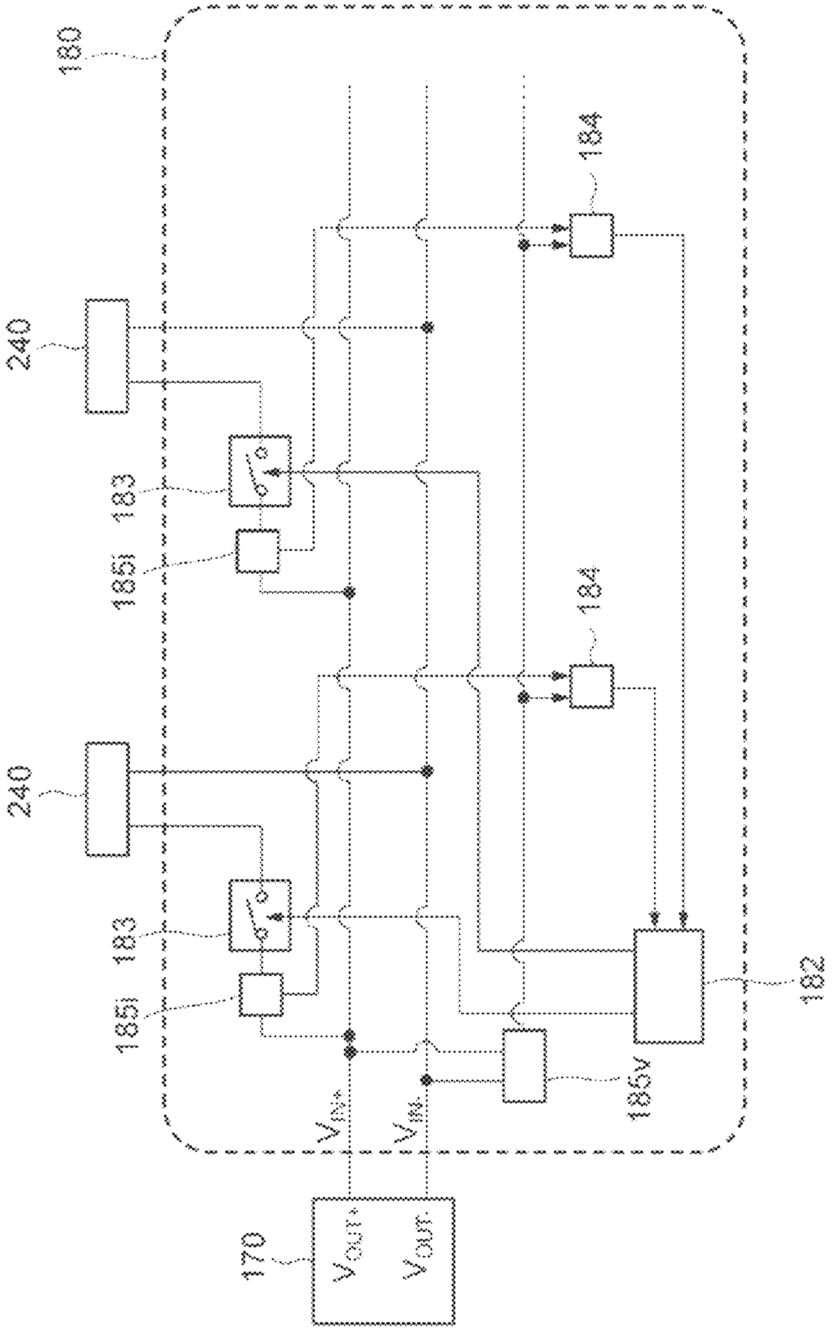

FIG. 26 is a diagram illustrating a constant voltage controller according to another exemplary embodiment.

Figure 27:
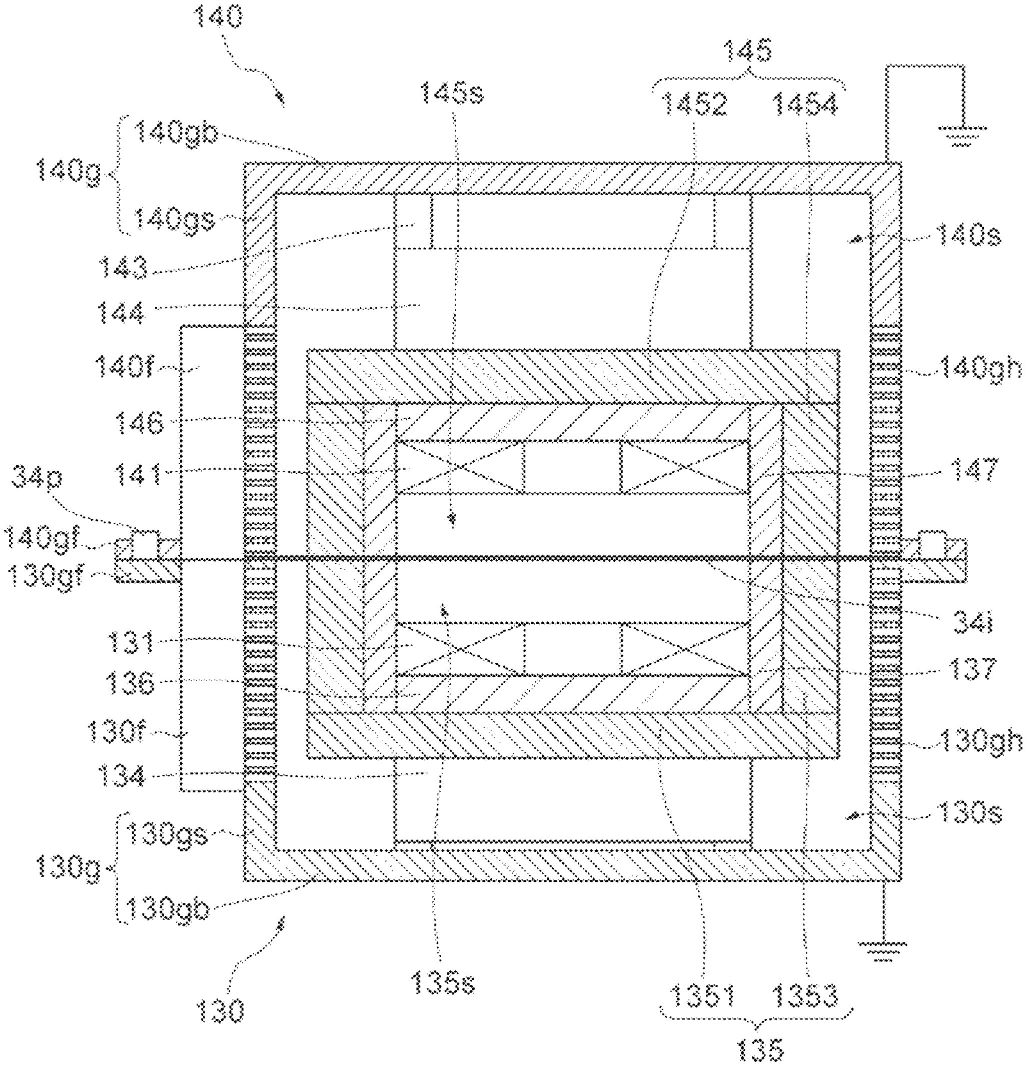

FIG. 27 is a diagram illustrating a power transmitting coil unit and a power receiving coil unit according to another exemplary embodiment.

Figure 28:
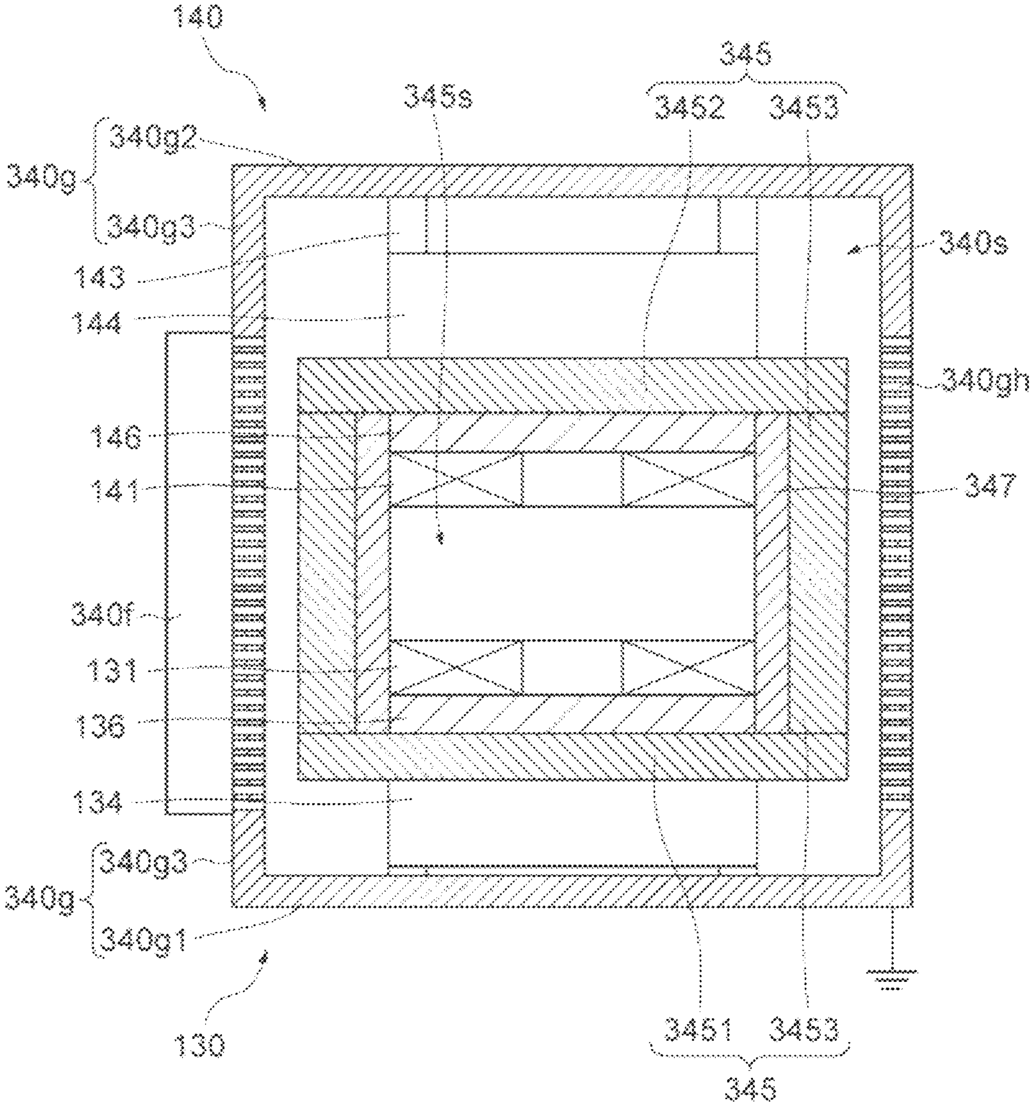

FIG. 28 is a diagram illustrating a power transmitting coil unit and a power receiving coil unit according to yet another exemplary embodiment.

Figure 29:
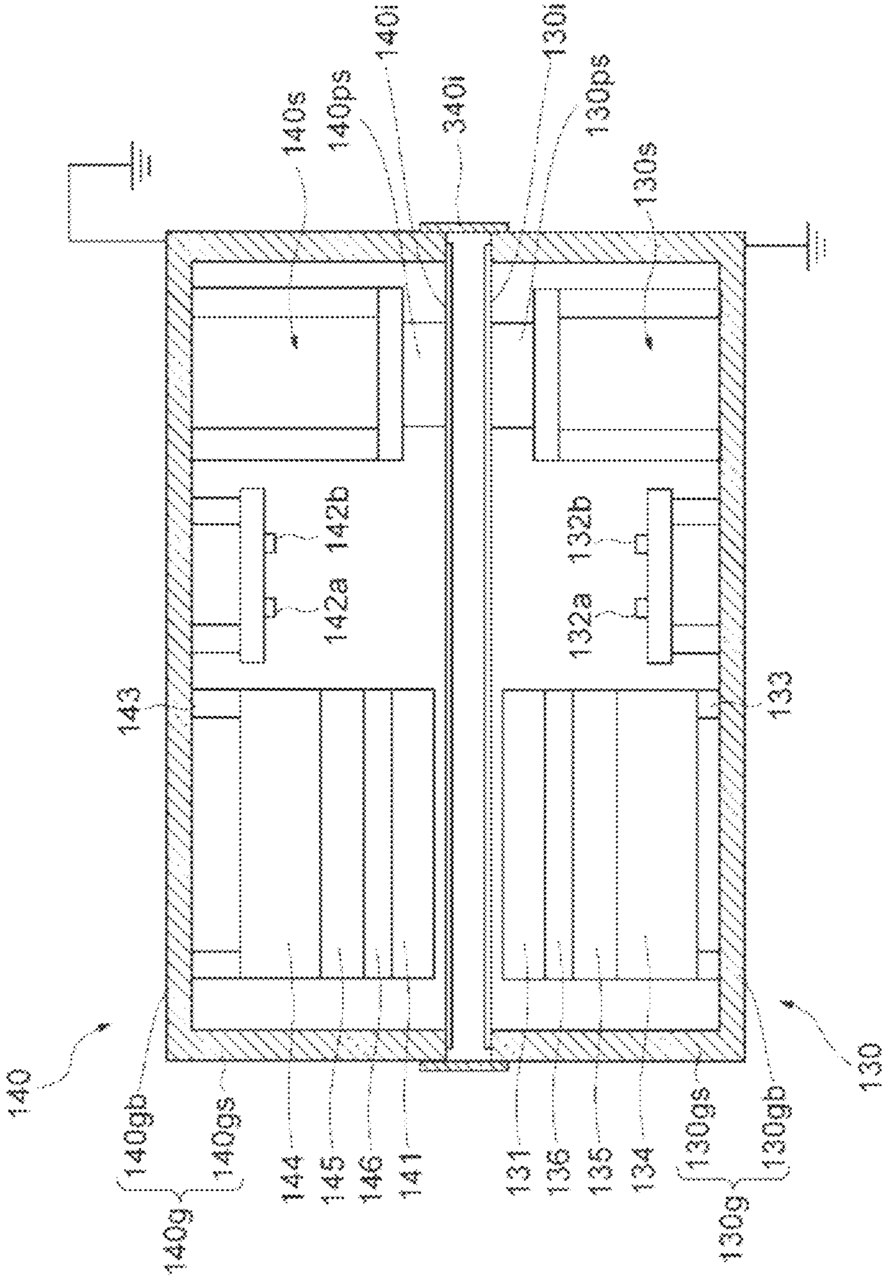

FIG. 29 is a diagram illustrating a power transmitting coil unit and a power receiving coil unit according to yet another exemplary embodiment.

Figure 30A:
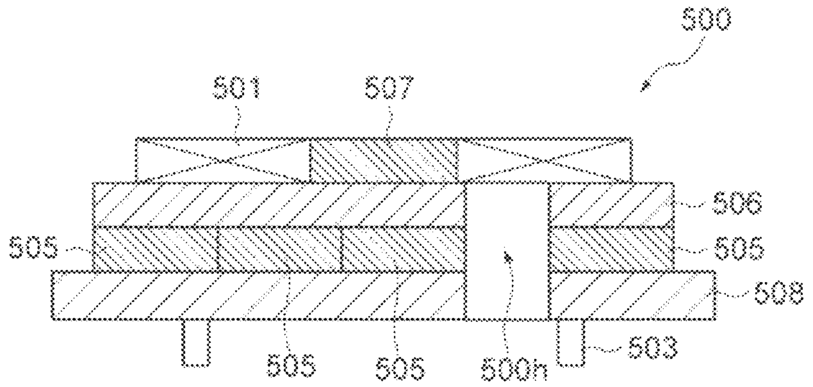
Figure 30B:
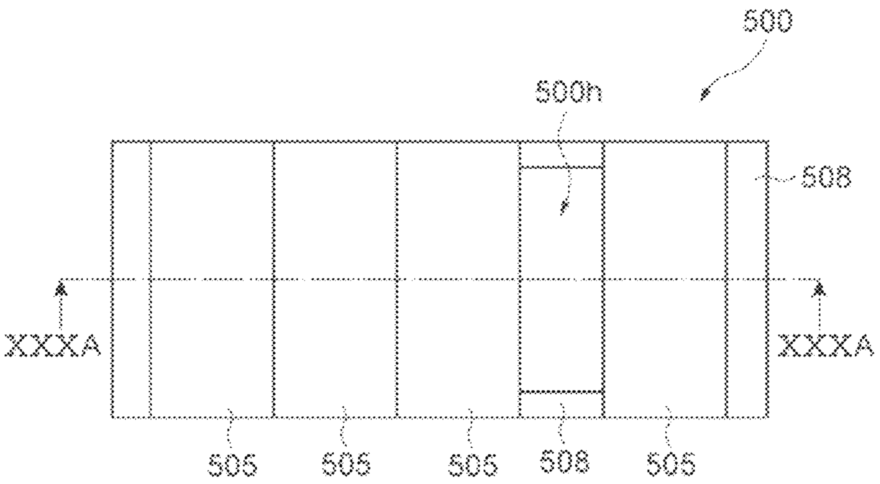

FIG. 30A is a cross-sectional view of a coil unit according to one exemplary embodiment, and FIG. 30B is a plan view of a plurality of ferrite materials provided between a base plate and a thermally conductive sheet in the coil unit shown in FIG. 30A.

Figure 31A:
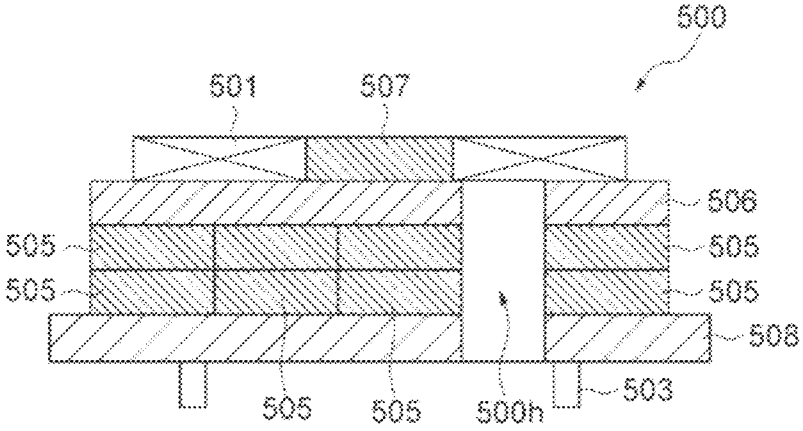
Figure 31B:
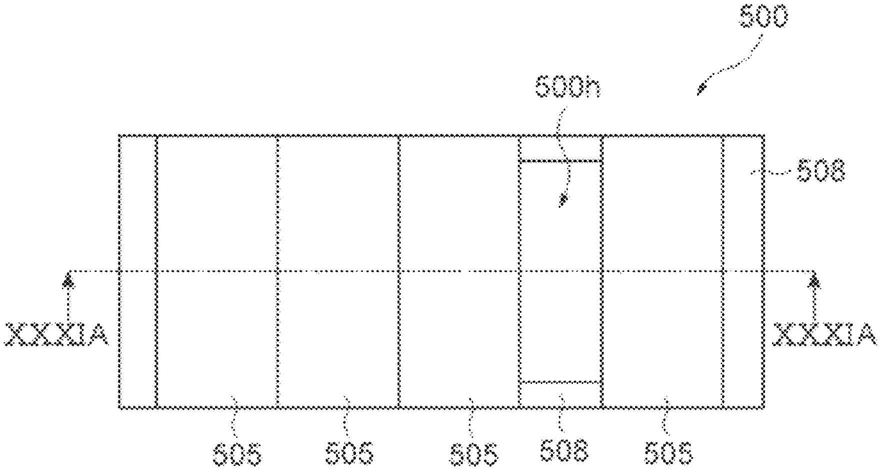

FIG. 31A is a cross-sectional view of a coil unit according to another exemplary embodiment, and FIG. 31B is a plan view of a plurality of ferrite materials provided between a base plate and a thermally conductive sheet in the coil unit shown in FIG. 31A.

Figure 32A:
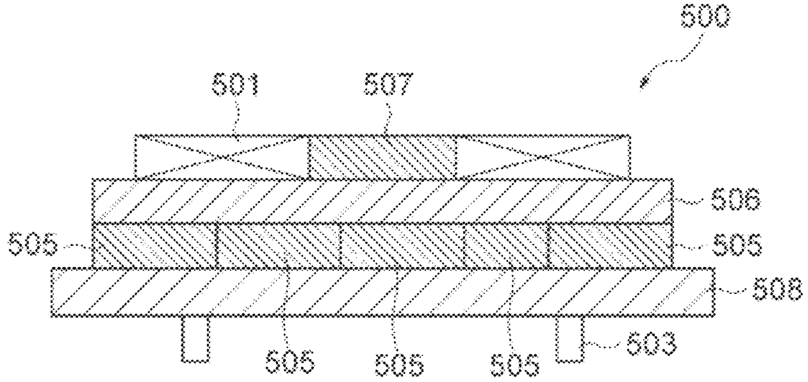
Figure 32B:
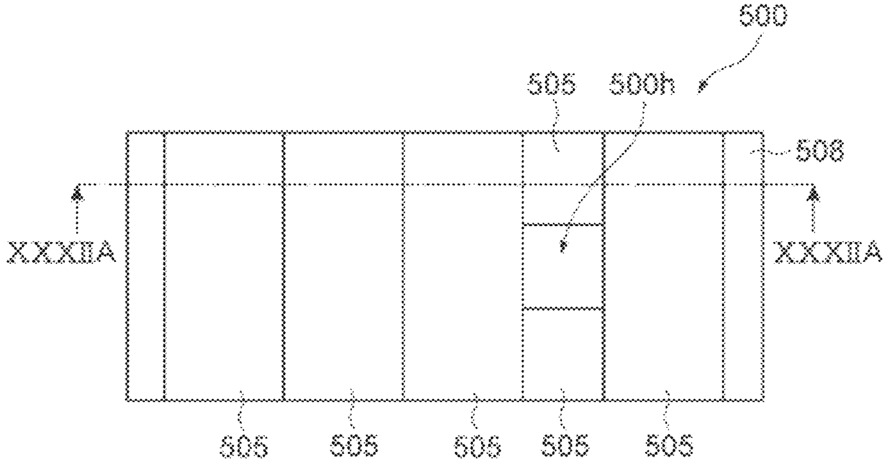

FIG. 32A is a cross-sectional view of a coil unit according to yet another exemplary embodiment, and FIG. 32B is a plan view of a plurality of ferrite materials provided between a base plate and a thermally conductive sheet in the coil unit shown in FIG. 32A.

Figure 33A:
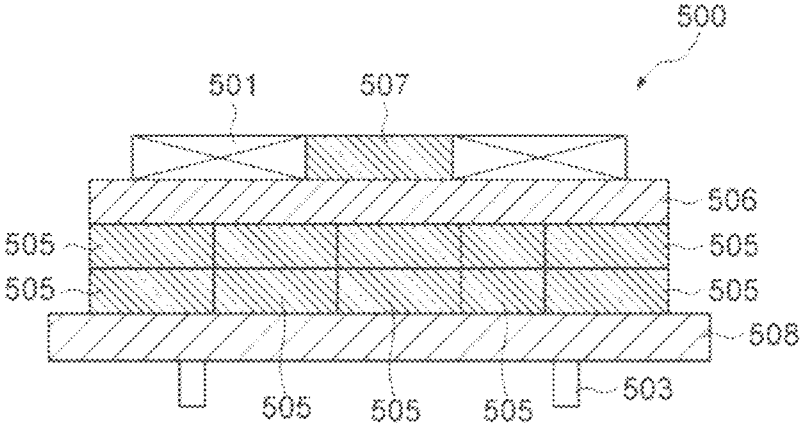
Figure 33B:
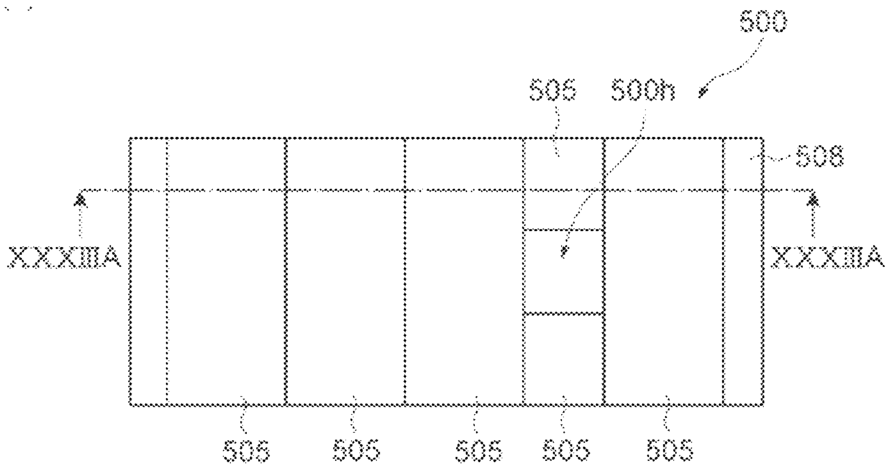

FIG. 33A is a cross-sectional view of a coil unit according to yet another exemplary embodiment, and FIG. 33B is a plan view of a plurality of ferrite materials provided between a base plate and a thermally conductive sheet in the coil unit shown in FIG. 33A.

Figure 34:
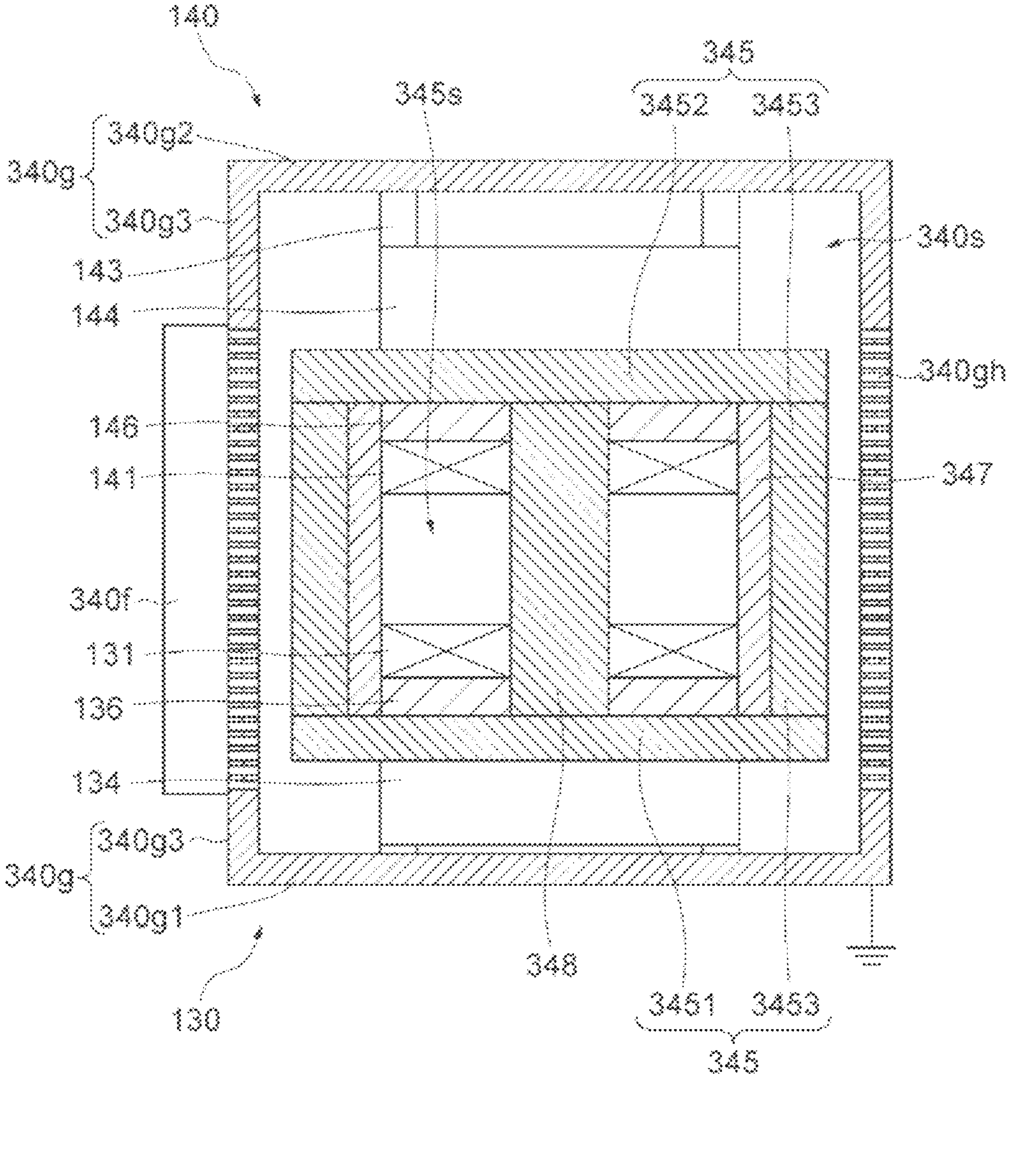

FIG. 34 is a diagram illustrating a power transmitting coil unit and a power receiving coil unit according to yet another exemplary embodiment.

Figure 35:
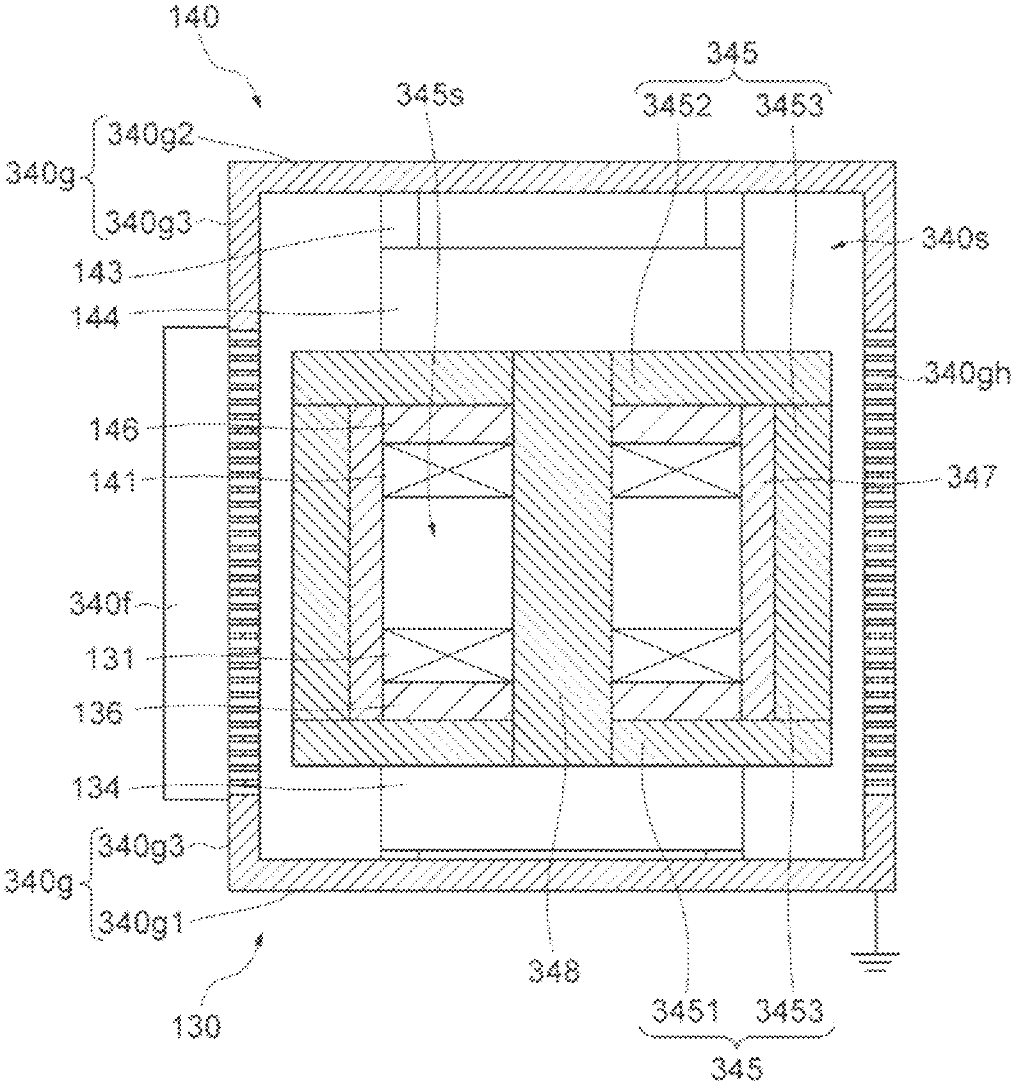

FIG. 35 is a diagram illustrating a power transmitting coil unit and a power receiving coil unit according to yet another exemplary embodiment.

Figure 36:
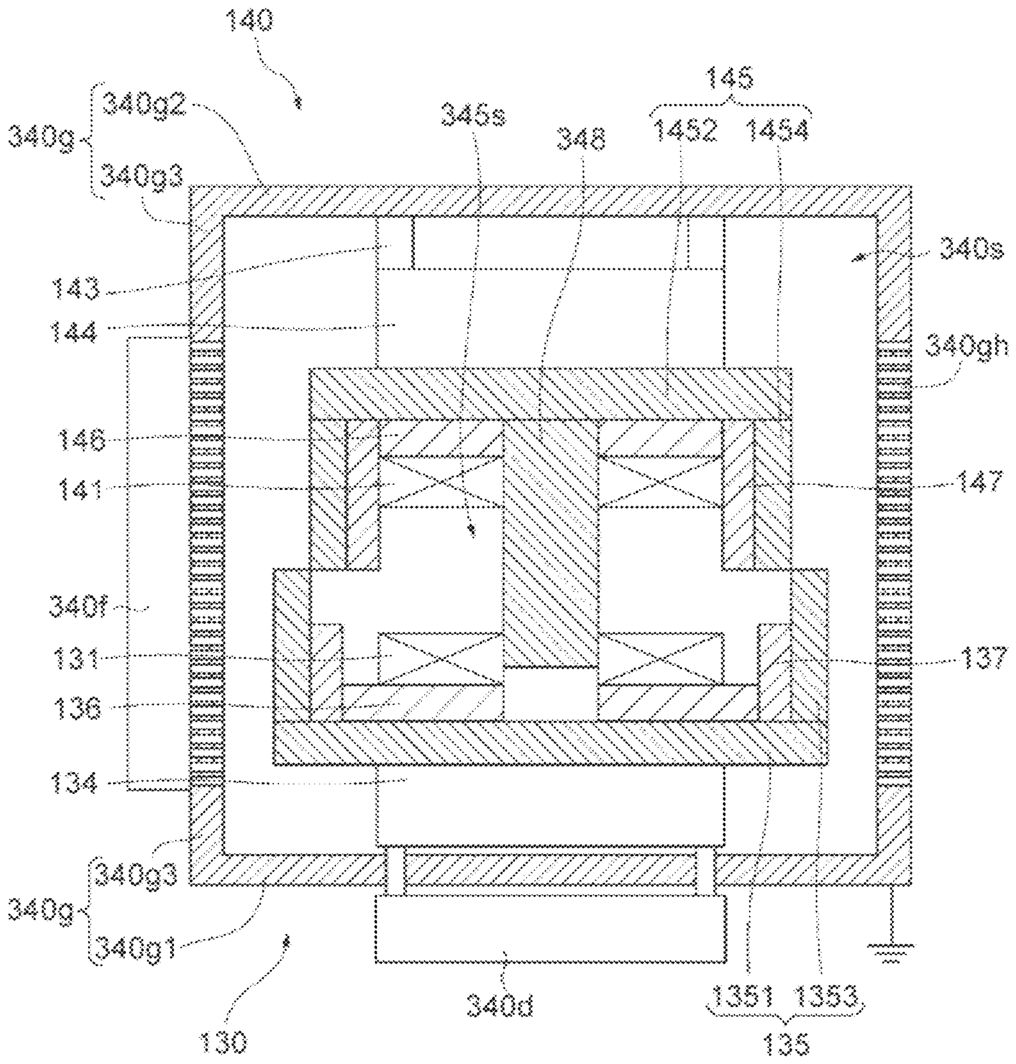

FIG. 36 is a diagram illustrating a power transmitting coil unit and a power receiving coil unit according to yet another exemplary embodiment.

Figure 37:
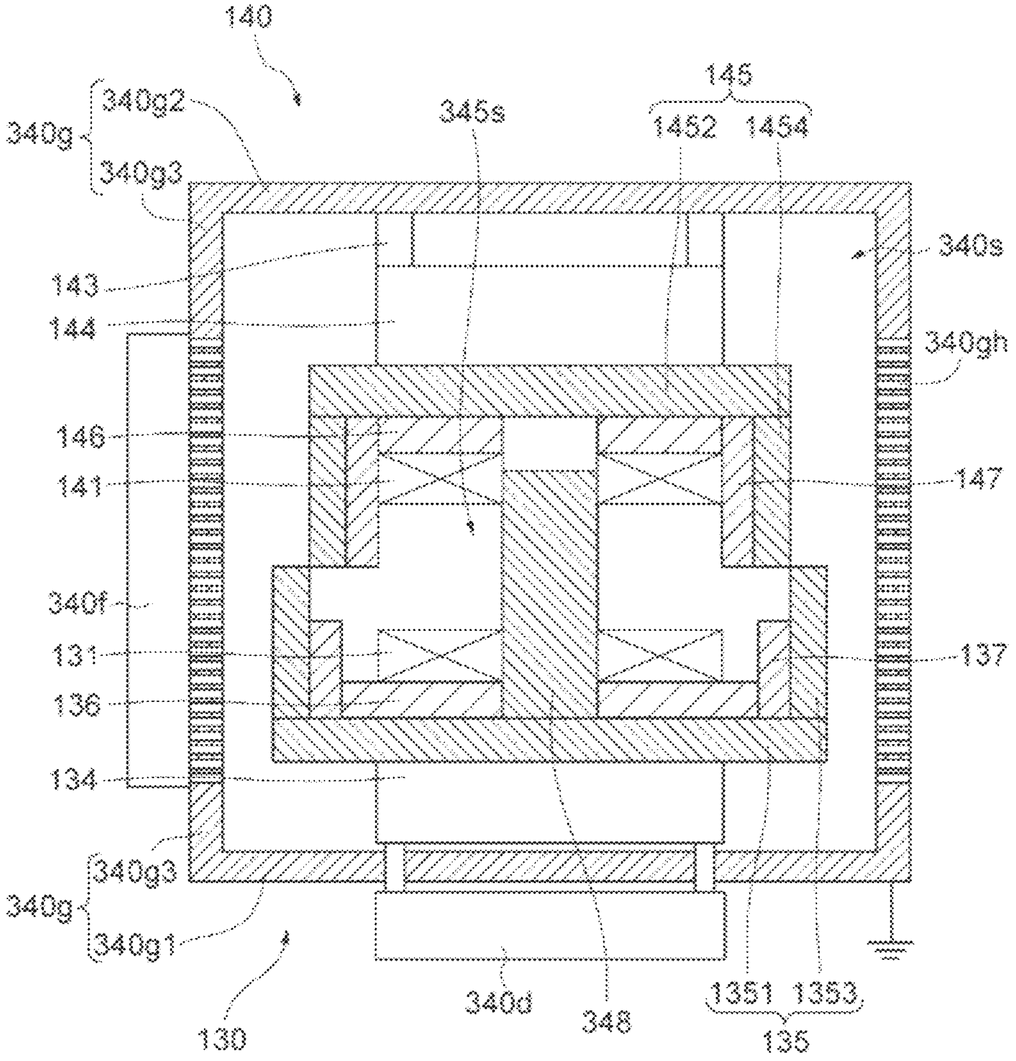

FIG. 37 is a diagram illustrating a power transmitting coil unit and a power receiving coil unit according to yet another exemplary embodiment.

Figure 38:
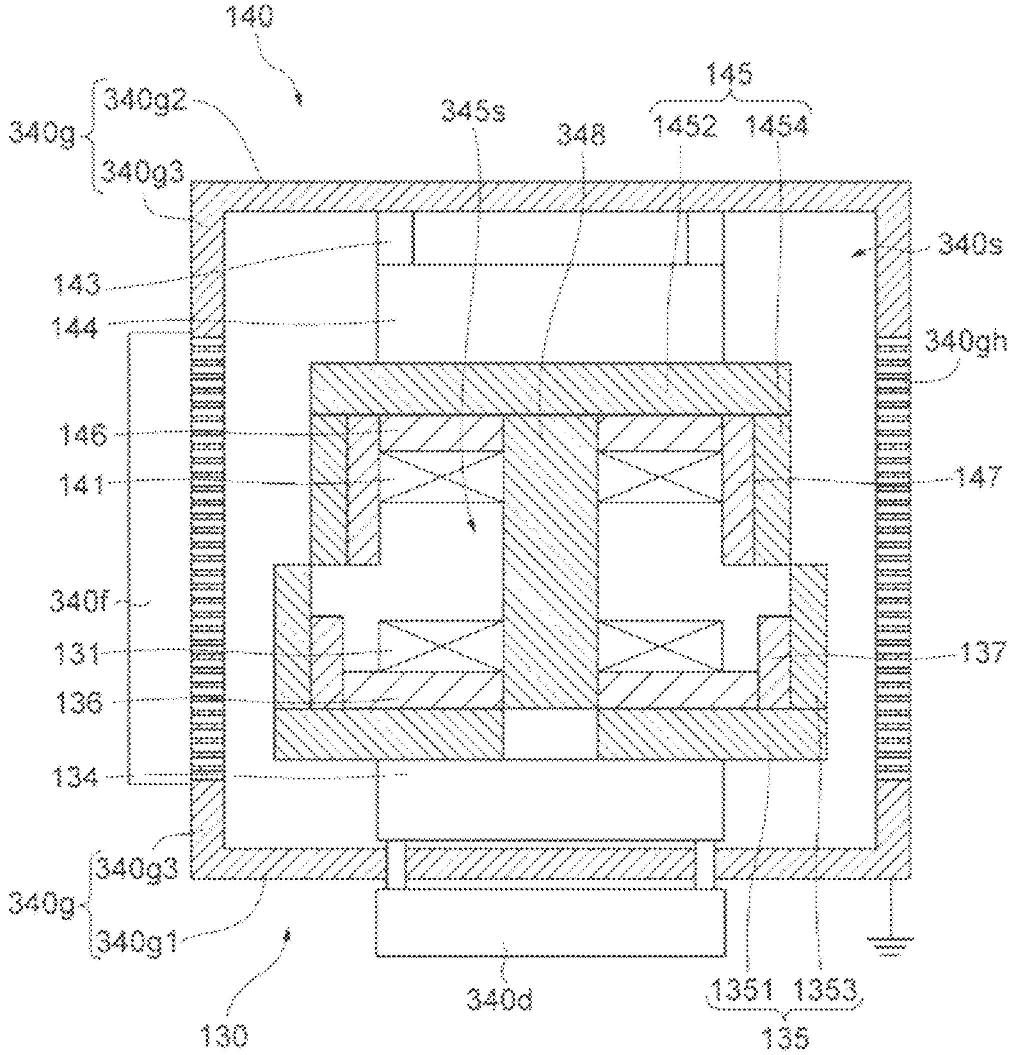

FIG. 38 is a diagram illustrating a power transmitting coil unit and a power receiving coil unit according to yet another exemplary embodiment.

Figure 39:
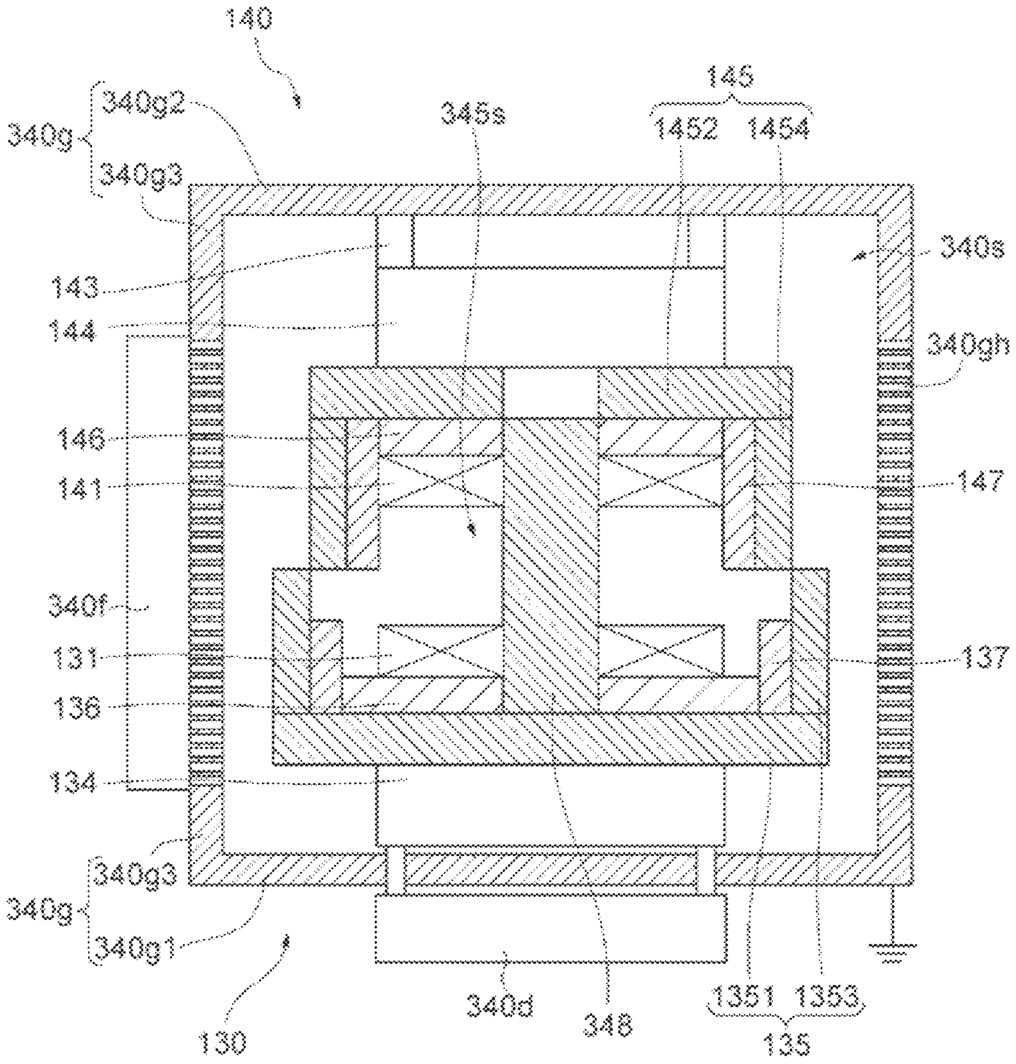

FIG. 39 is a diagram illustrating a power transmitting coil unit and a power receiving coil unit according to yet another exemplary embodiment.

Figure 40:
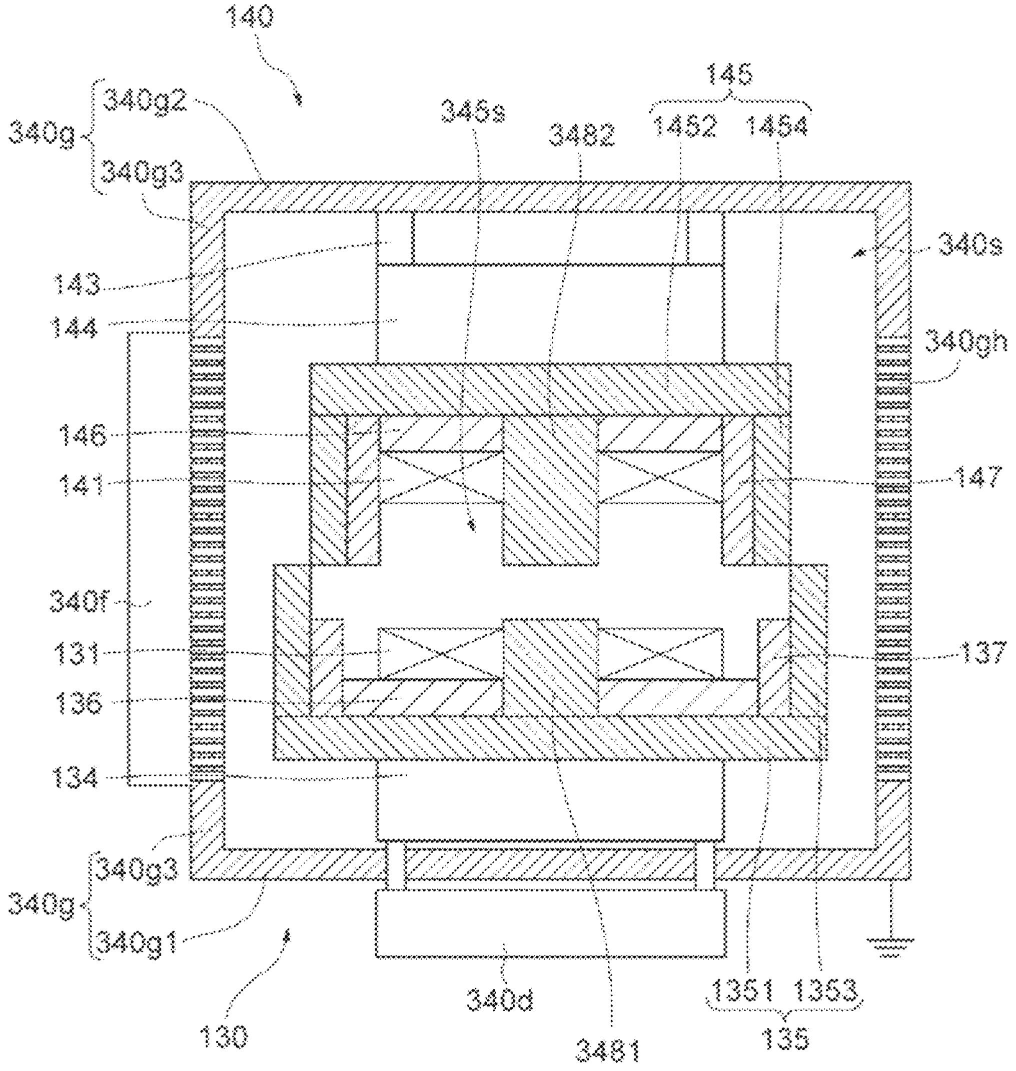

FIG. 40 is a diagram illustrating a power transmitting coil unit and a power receiving coil unit according to yet another exemplary embodiment.

Figure 41:
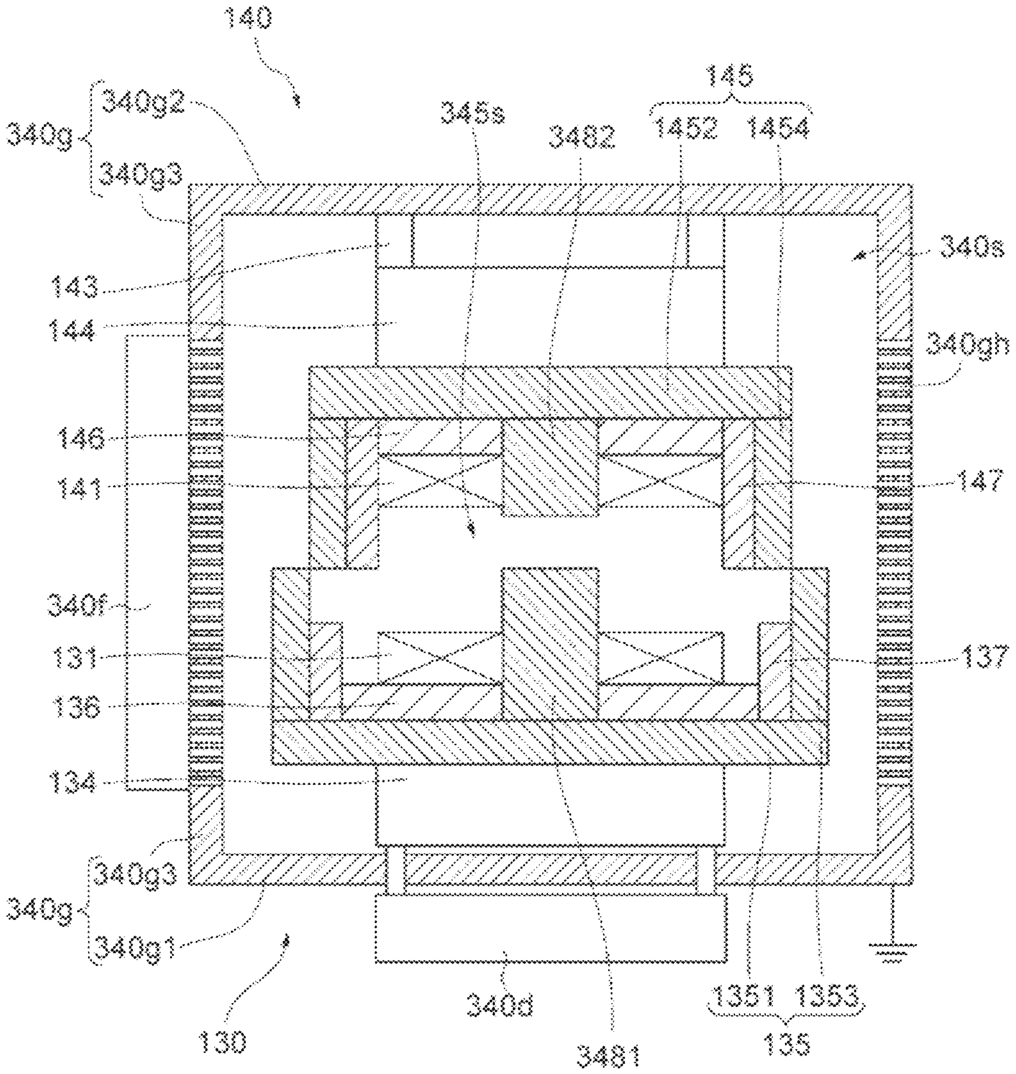

FIG. 41 is a diagram illustrating a power transmitting coil unit and a power receiving coil unit according to yet another exemplary embodiment.

Figure 42:
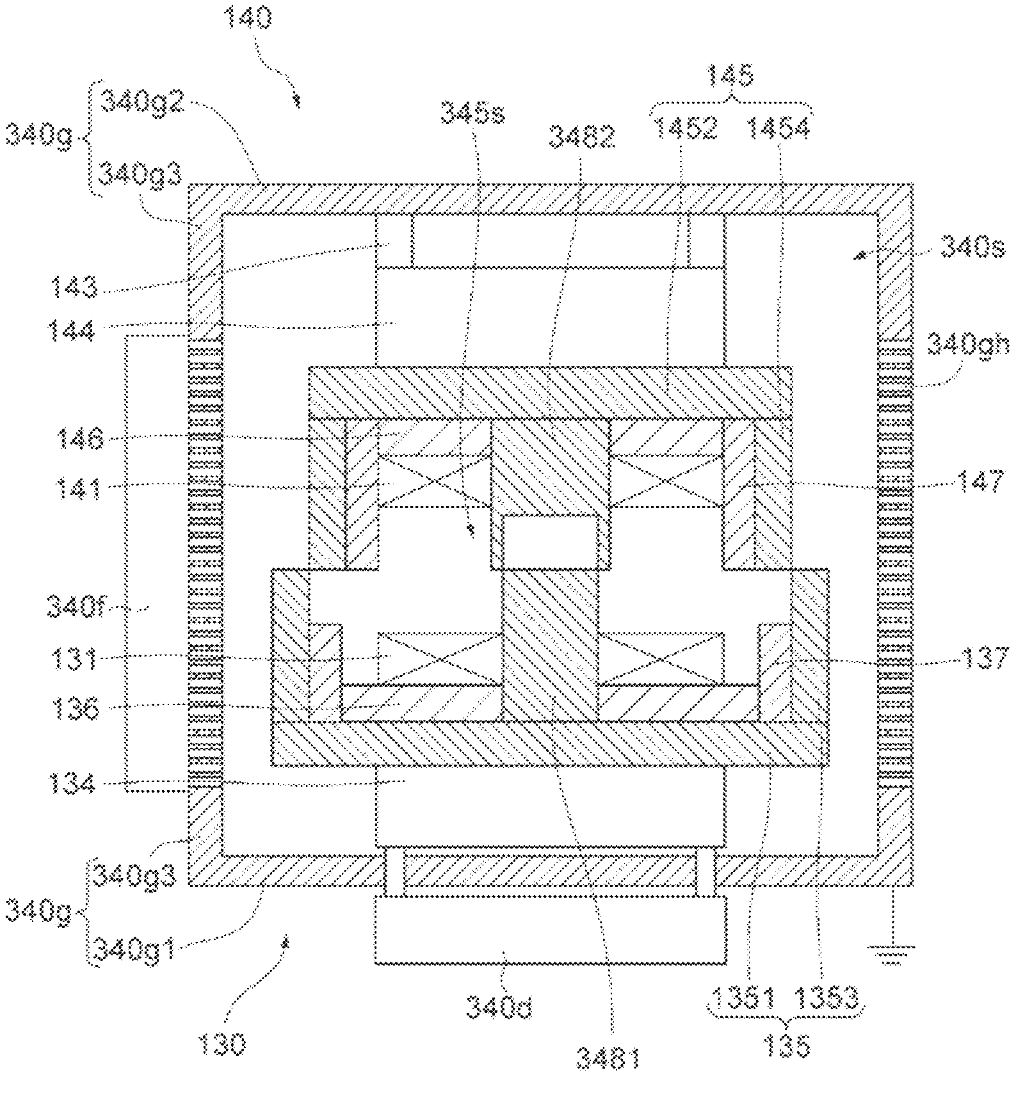

FIG. 42 is a diagram illustrating a power transmitting coil unit and a power receiving coil unit according to yet another exemplary embodiment.

Figure 43:
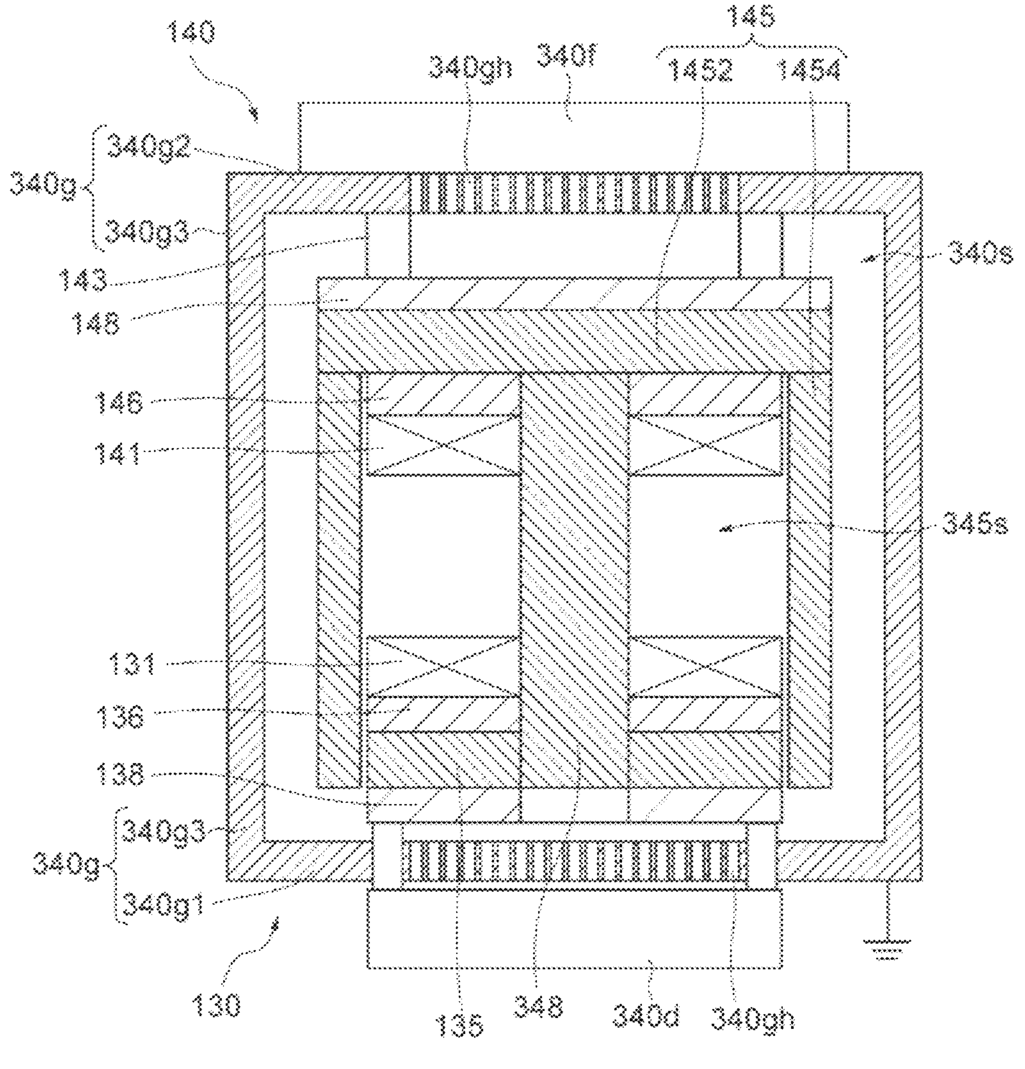

FIG. 43 is a diagram illustrating a power transmitting coil unit and a power receiving coil unit according to yet another exemplary embodiment.

Figure 44A:
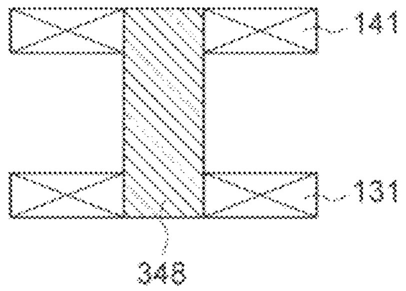
Figure 44B:
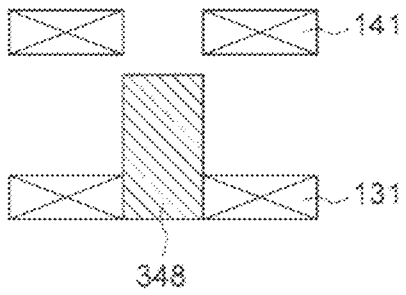
Figure 44C:
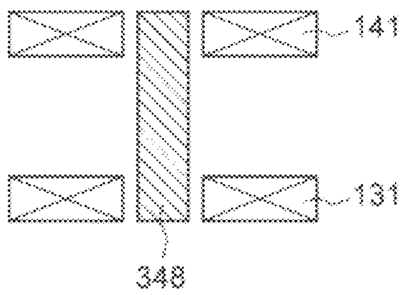

Each of FIGS. 44A, 44B, and 44C is a diagram illustrating an example of the location relationship between each of the power transmitting coil and the power receiving coil and an inner ferrite material.

FIGS. 45A to 45E are diagrams illustrating various examples of the inner ferrite material.

Figure 46A:
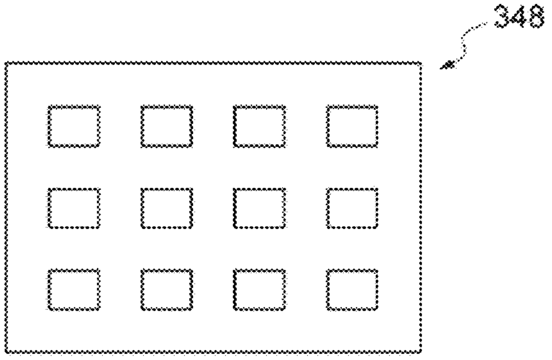
Figure 46B:
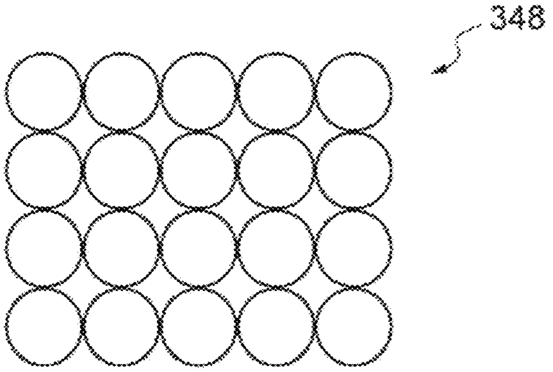
Figure 46C:
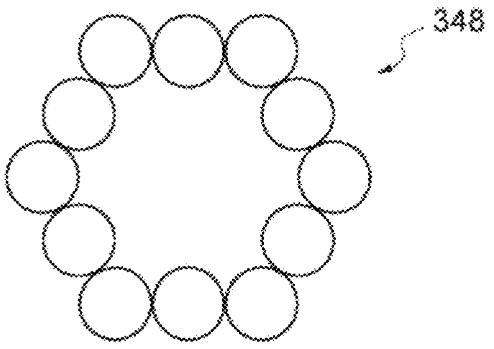

FIGS. 46A to 46C are diagrams illustrating various examples of the inner ferrite material.

Figure 47A:
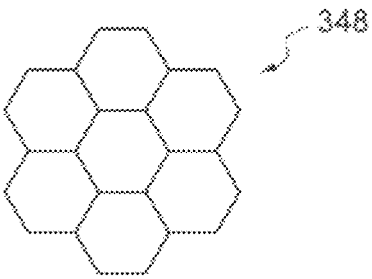
Figure 47B:
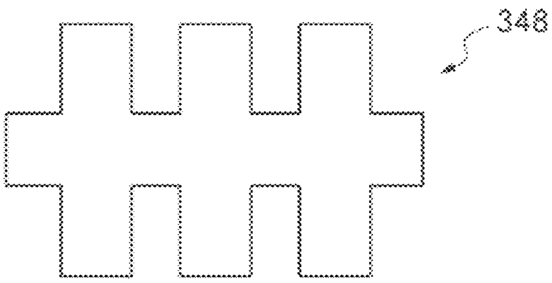

FIGS. 47A to 47B are diagrams illustrating various examples of the inner ferrite material.

Figure 48A:
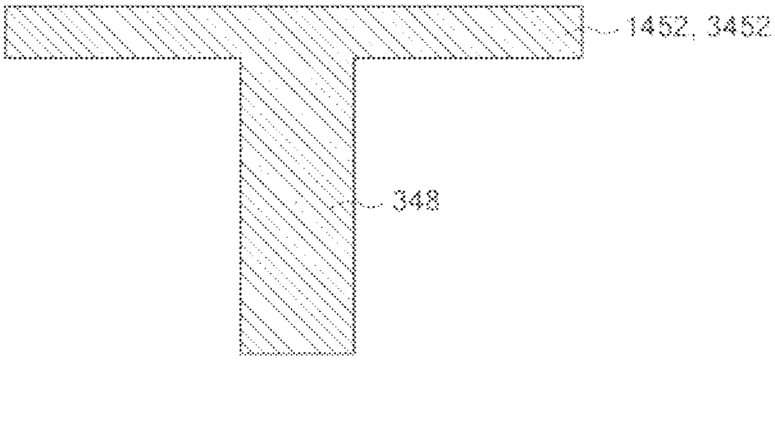
Figure 48B:
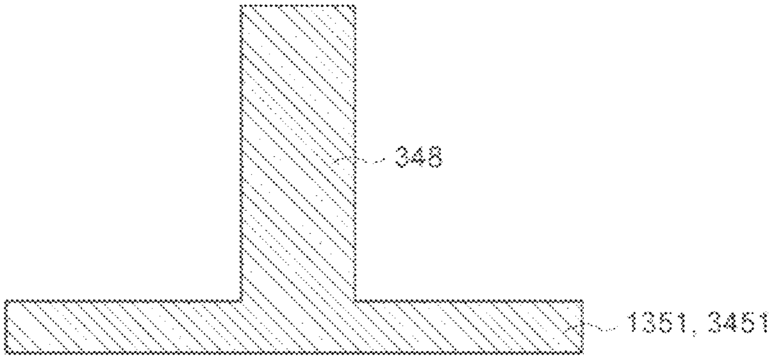
Figure 48C:
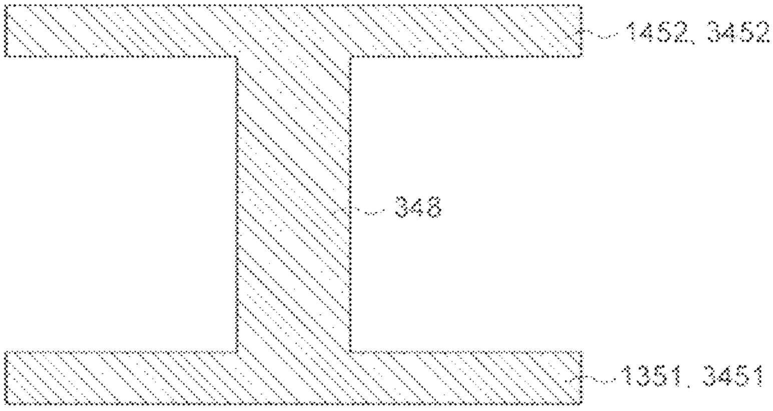

FIGS. 48A to 48C are diagrams illustrating various examples of the ferrite material in the power transmitting coil unit and the power receiving coil unit.

Figure 49A:
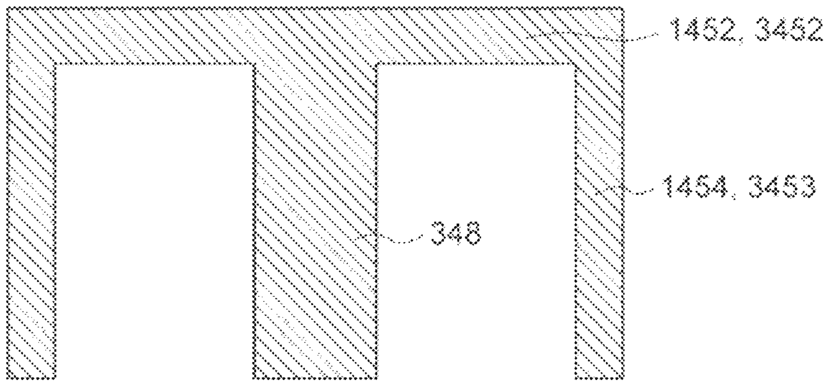
Figure 49B:
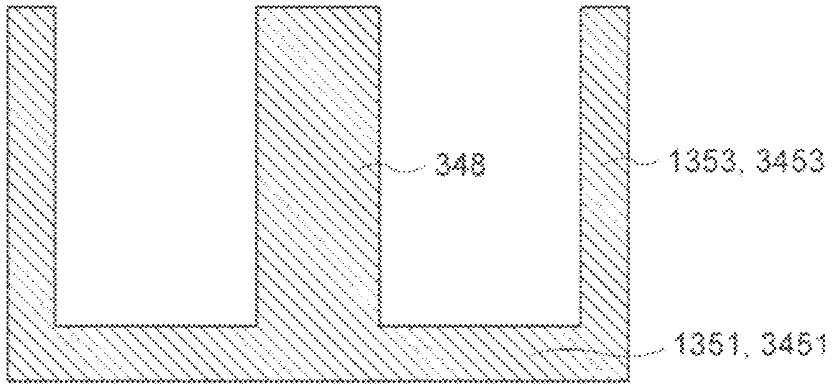

FIGS. 49A to 49B are diagrams illustrating various examples of the ferrite material in the power transmitting coil unit and the power receiving coil unit.

Figure 50:
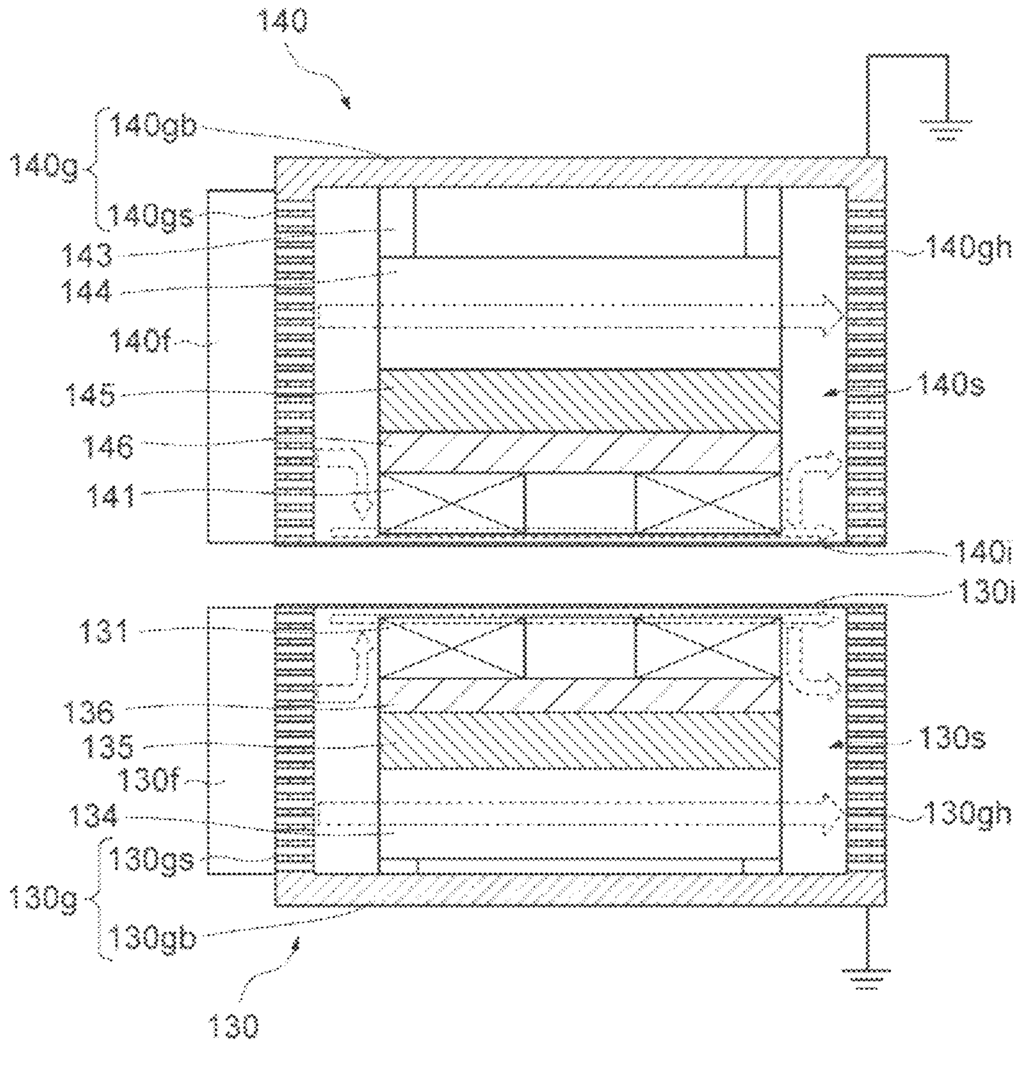

FIG. 50 is a diagram illustrating a power transmitting coil unit and a power receiving coil unit according to yet another exemplary embodiment.

Figure 51A:
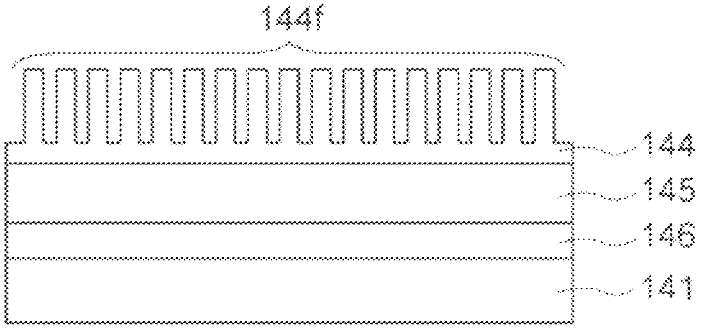
Figure 51B:
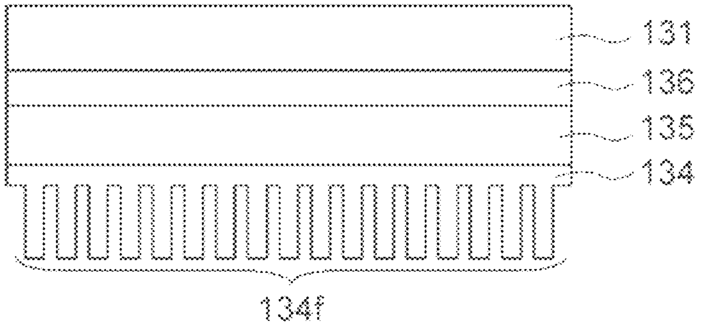

FIG. 51A is a diagram illustrating an example of a heat sink for the power receiving coil unit shown in FIG. 50, and FIG. 51B is a diagram illustrating an example of a heat sink for the power transmitting coil unit shown in FIG. 50.

Figure 52:
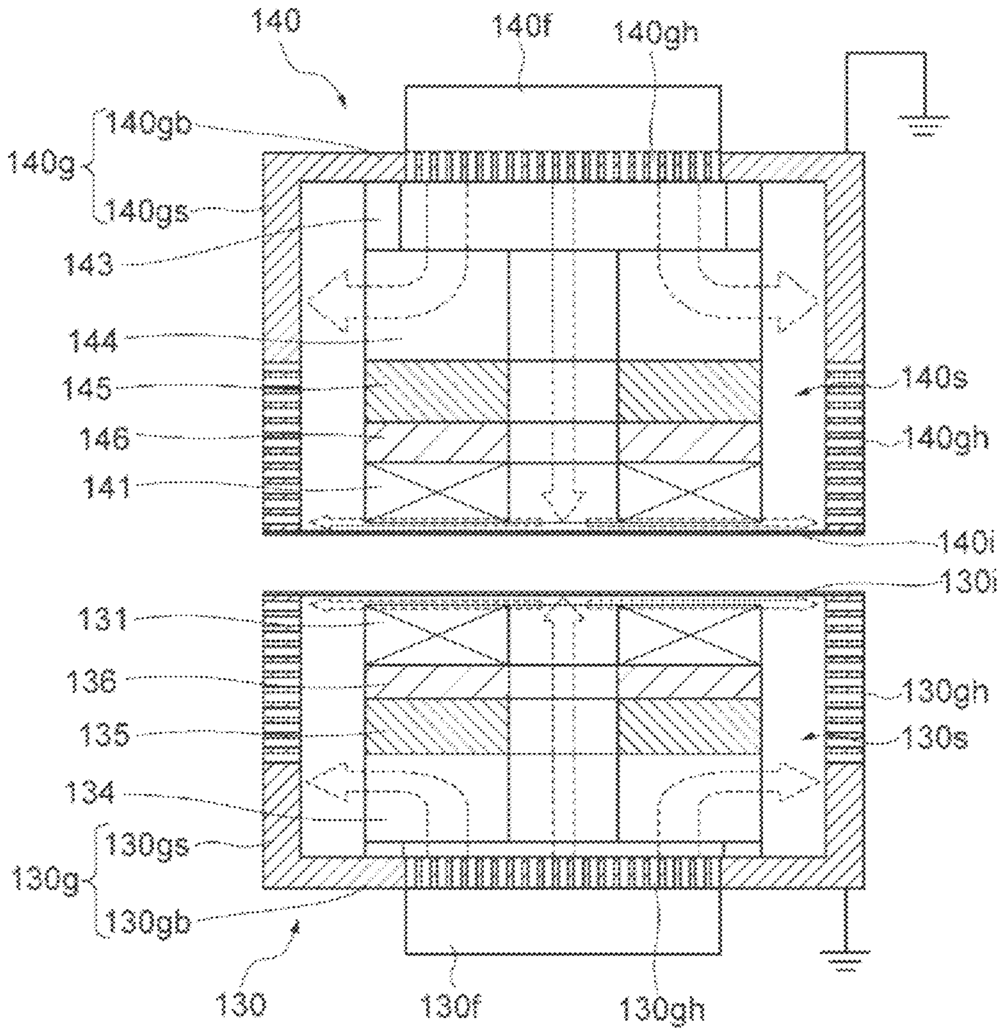

FIG. 52 is a diagram illustrating a power transmitting coil unit and a power receiving coil unit according to yet another exemplary embodiment.

Figure 53:
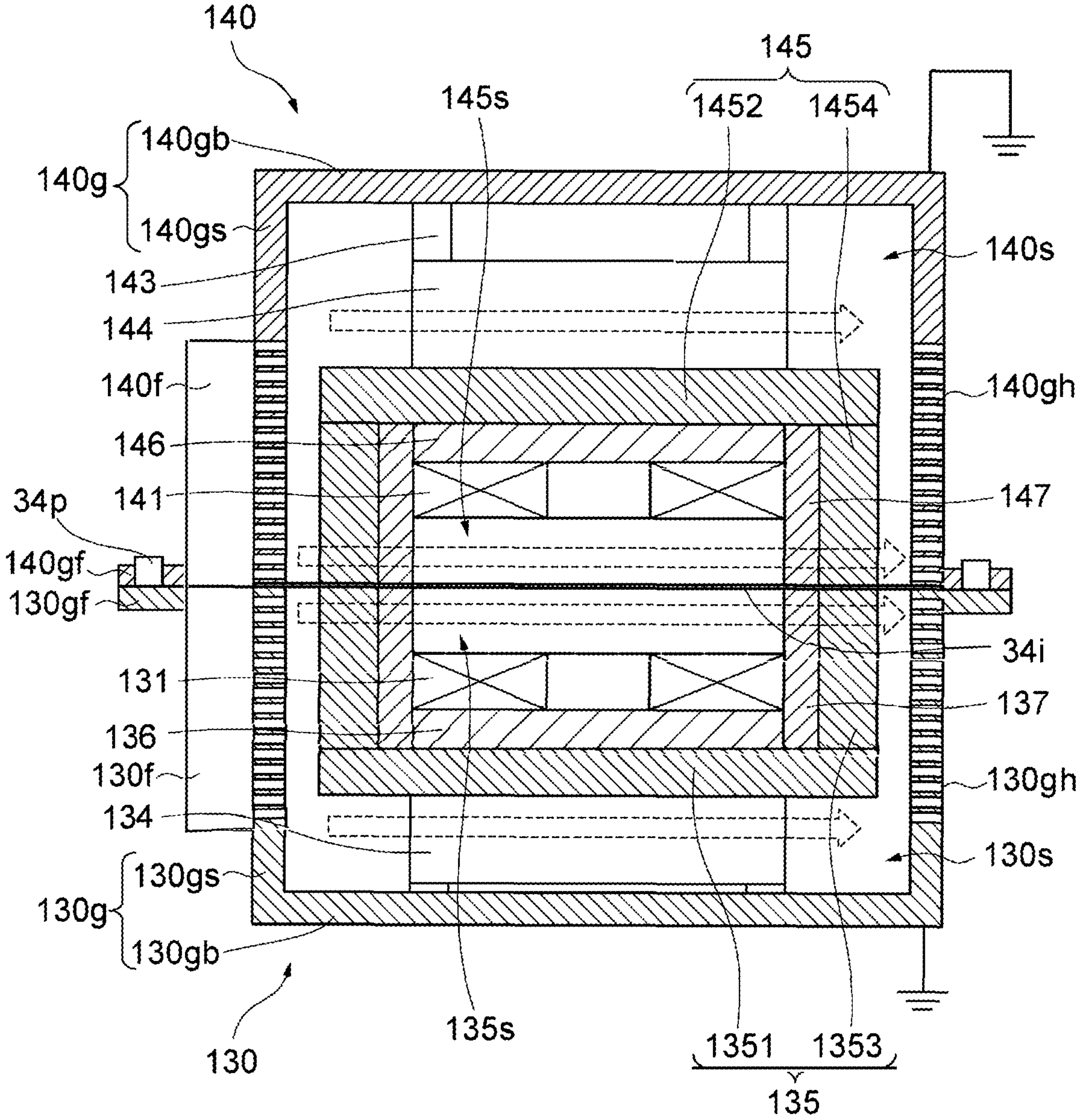

FIG. 53 is a diagram illustrating a power transmitting coil unit and a power receiving coil unit according to yet another exemplary embodiment.

Figure 54:
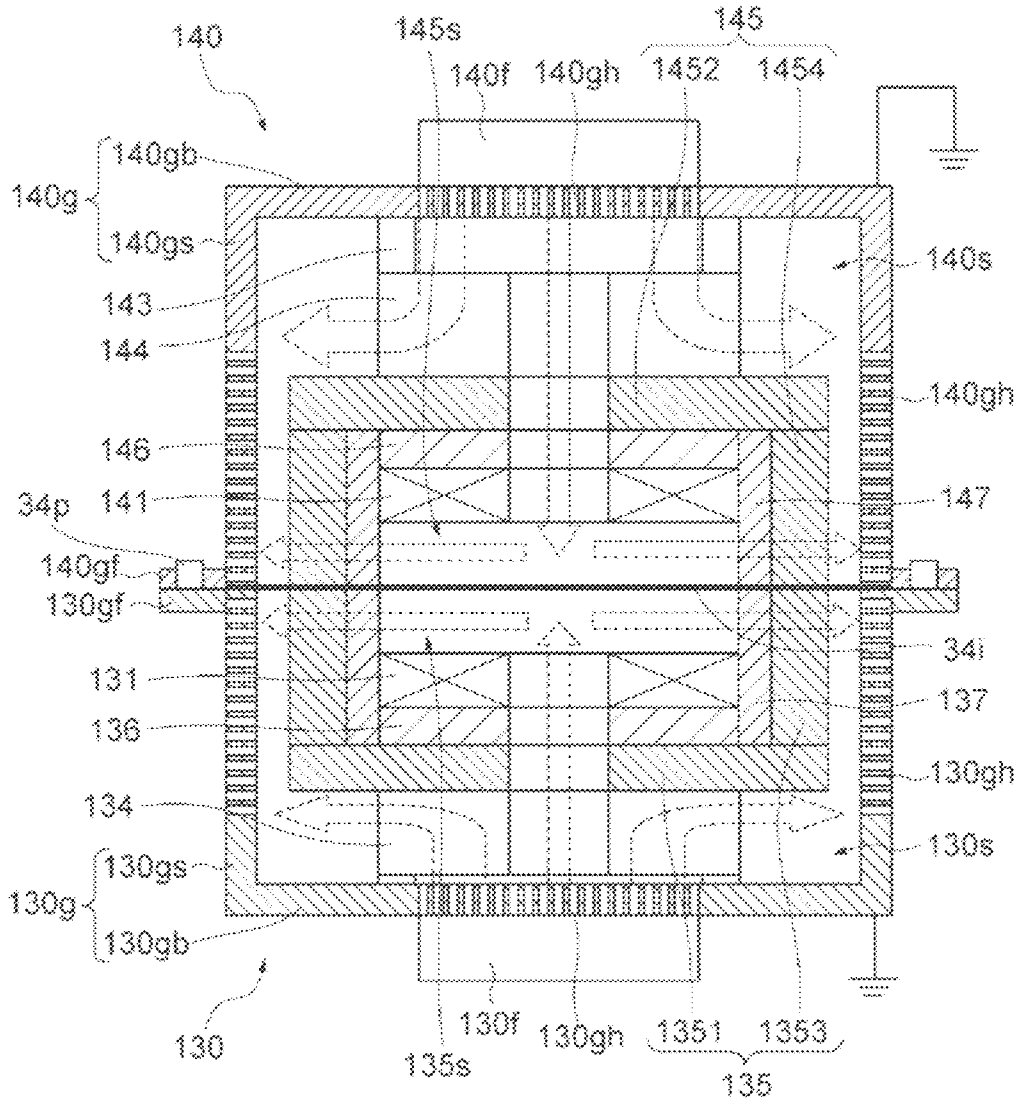

FIG. 54 is a diagram illustrating a power transmitting coil unit and a power receiving coil unit according to yet another exemplary embodiment.

Figure 55:
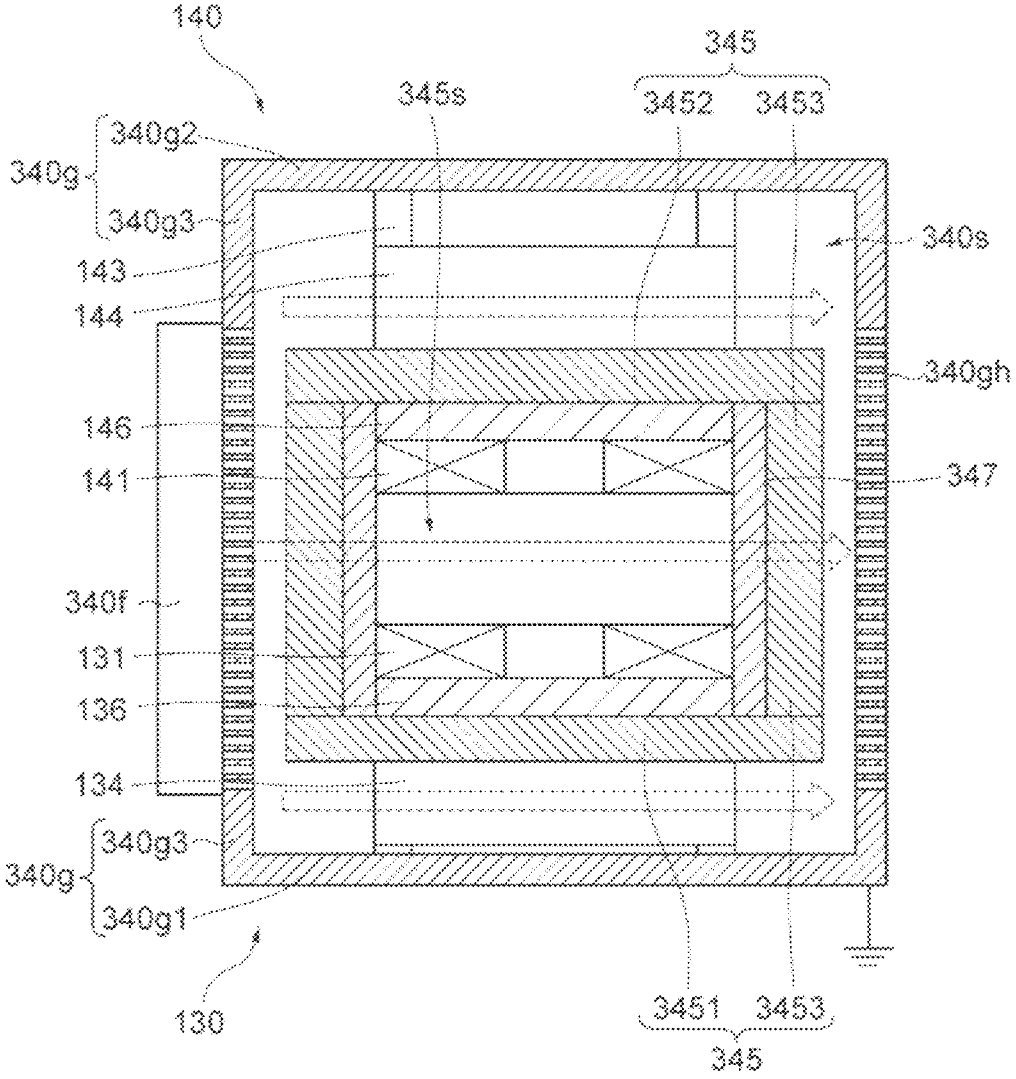

FIG. 55 is a diagram illustrating a power transmitting coil unit and a power receiving coil unit according to yet another exemplary embodiment.

Figure 56:
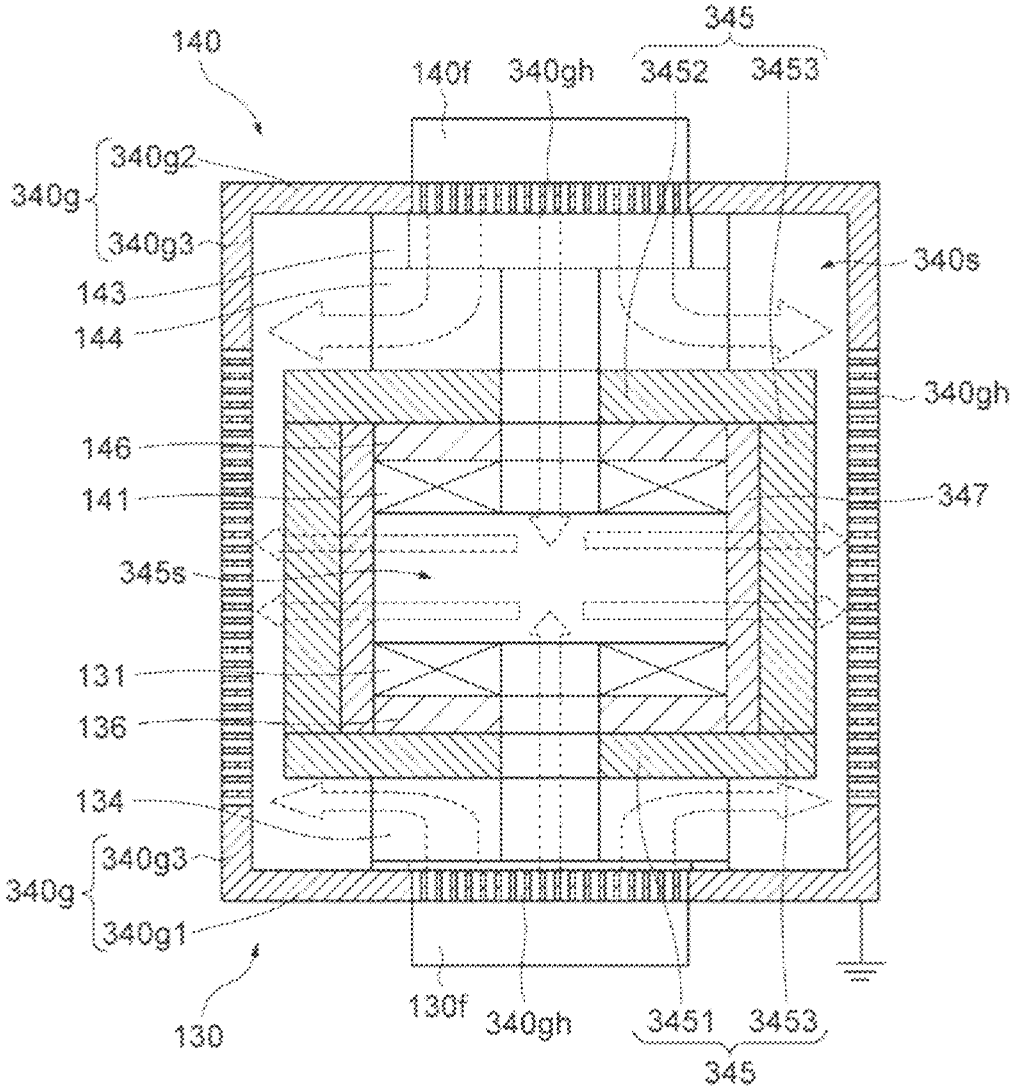

FIG. 56 is a diagram illustrating a power transmitting coil unit and a power receiving coil unit according to yet another exemplary embodiment.

Figure 57A:
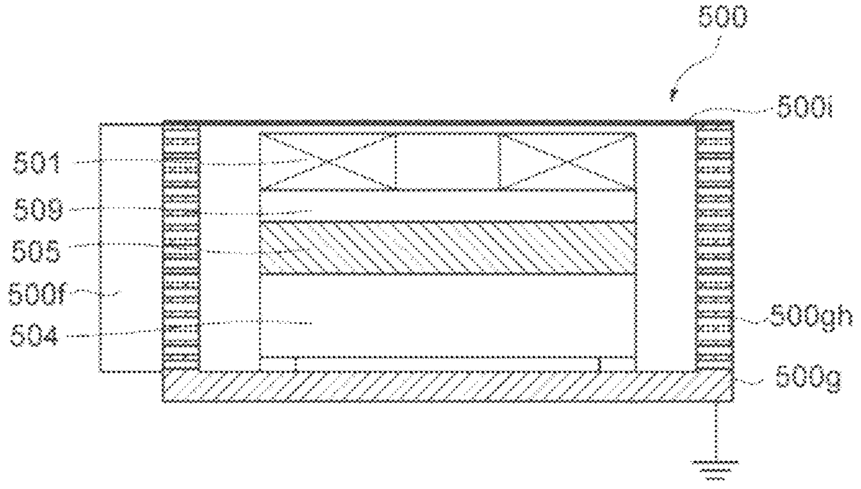
Figure 57B:
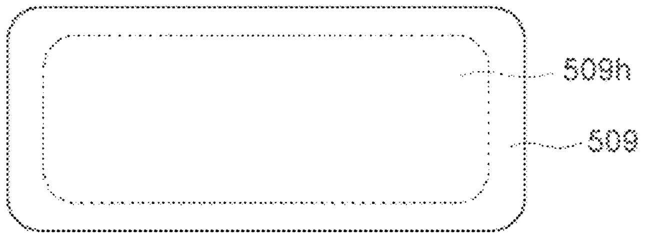

FIG. 57A is a cross-sectional view of a coil unit according to another exemplary embodiment, and 57B is a plan view of a cooling plate in the coil unit shown in FIG. 57A.

Figure 58:
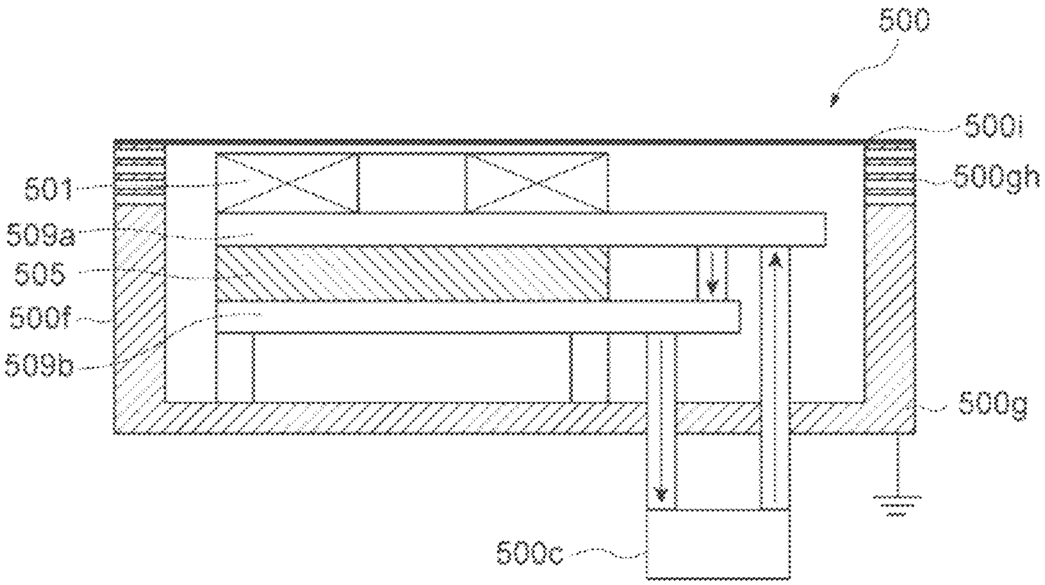

FIG. 58 is a cross-sectional view of a coil unit according to yet another exemplary embodiment.

Figure 59:
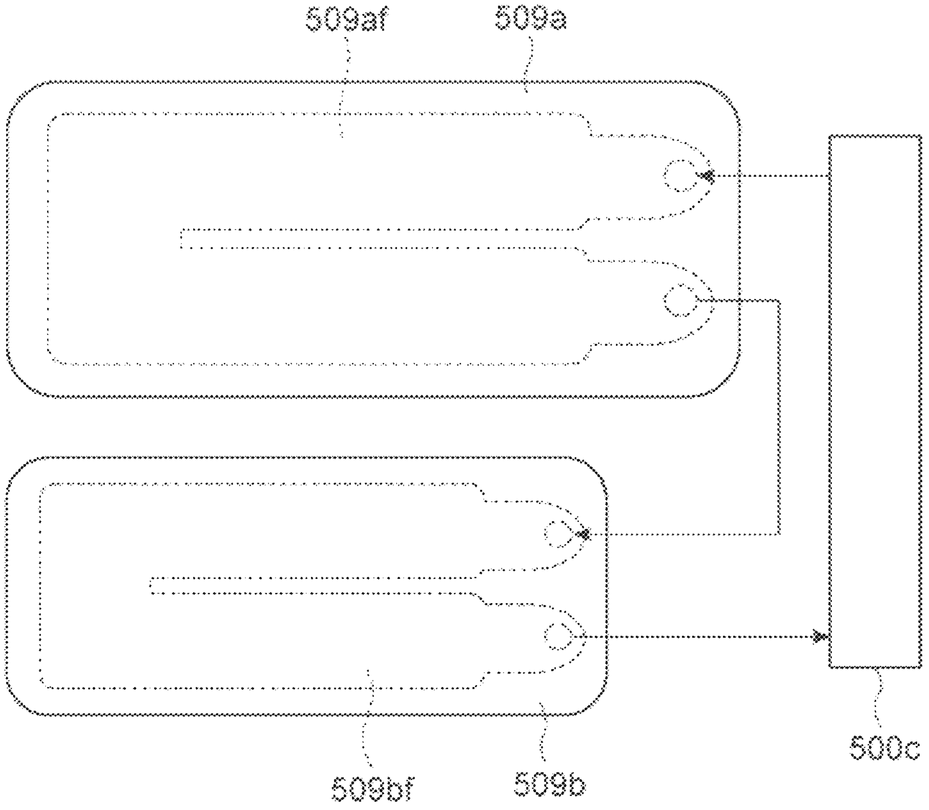

FIG. 59 is a diagram illustrating two cooling plates in the coil unit shown in FIG. 58.

Figure 60:
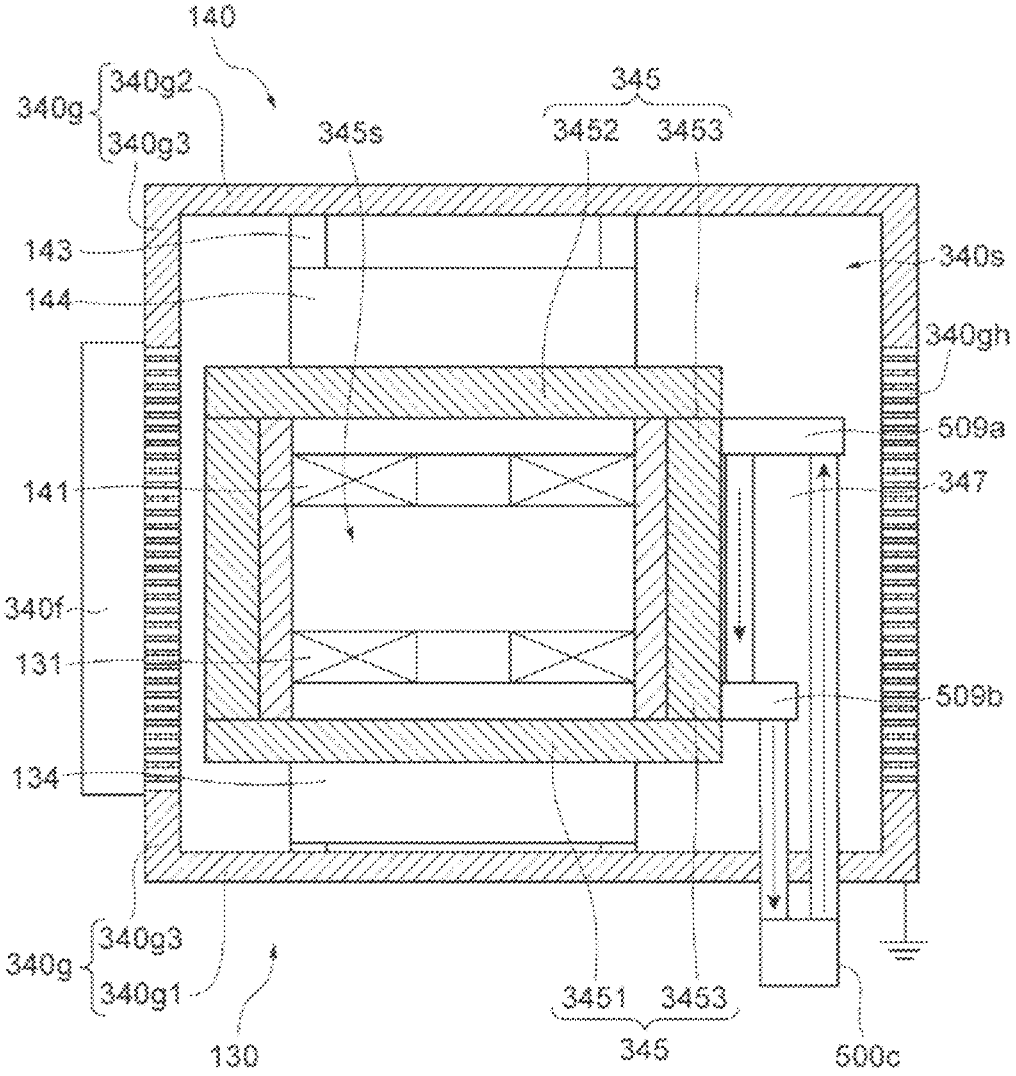

FIG. 60 is a diagram illustrating a power transmitting coil unit and a power receiving coil unit according to yet another exemplary embodiment.

Figure 61A:
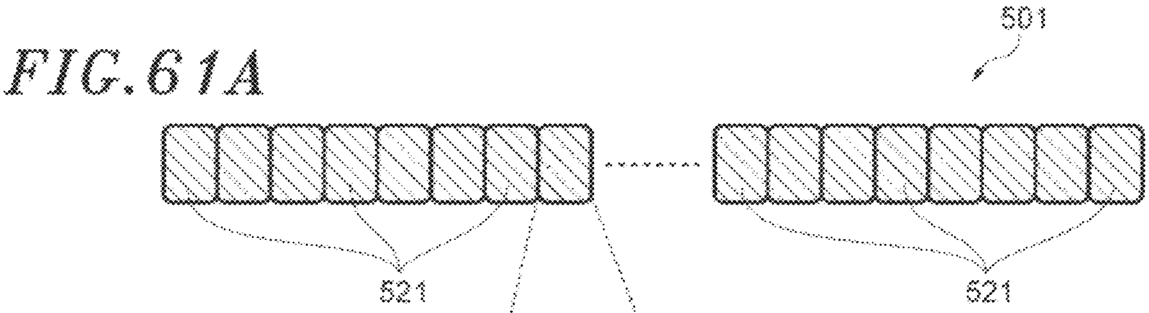
Figure 61B:
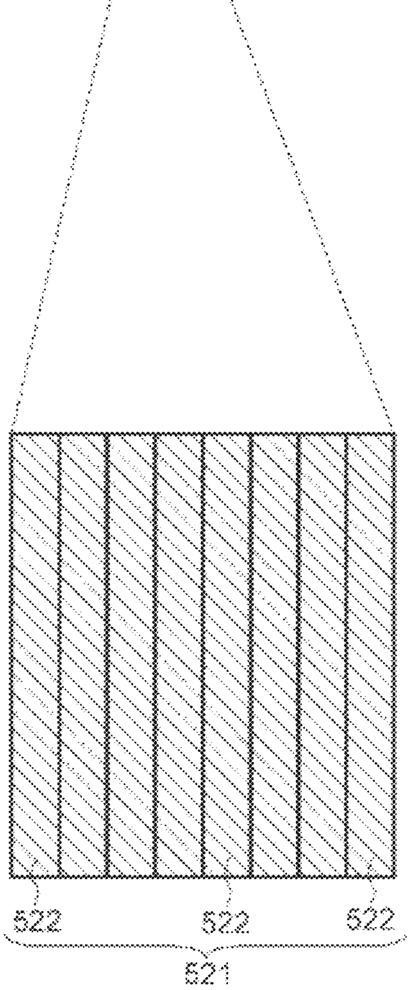

FIG. 61A is a cross-sectional view of a coil according to one exemplary embodiment, and FIG. 61B is a cross-sectional view of a wire rod of the coil according to one exemplary embodiment.

Figure 62A:
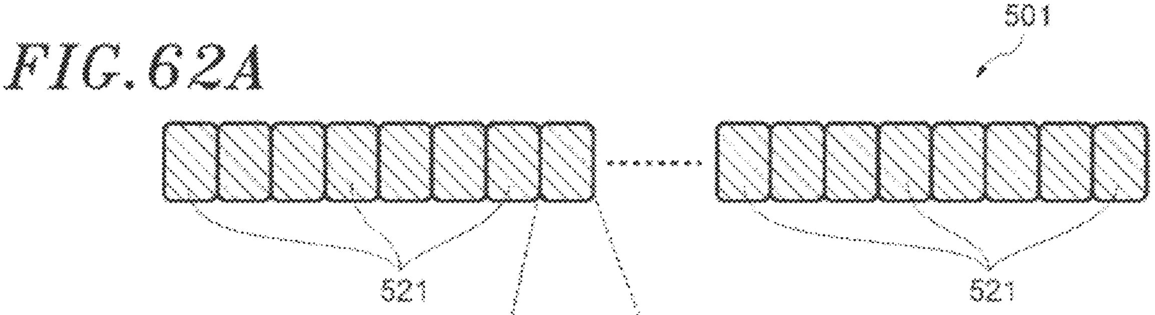
Figure 62B:
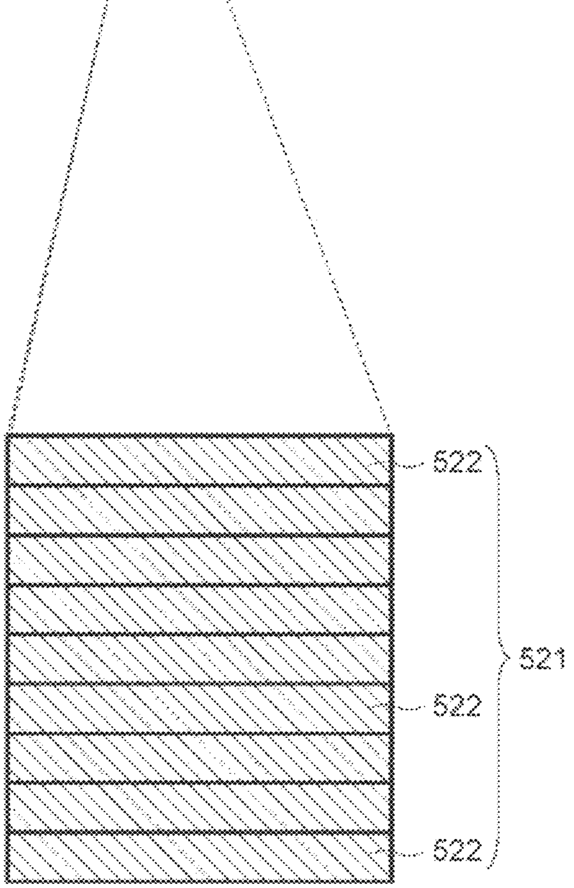

FIG. 62A is a cross-sectional view of a coil according to another exemplary embodiment, and FIG. 62B is a cross-sectional view of a wire rod of the coil according to another exemplary embodiment.

Figure 63A:
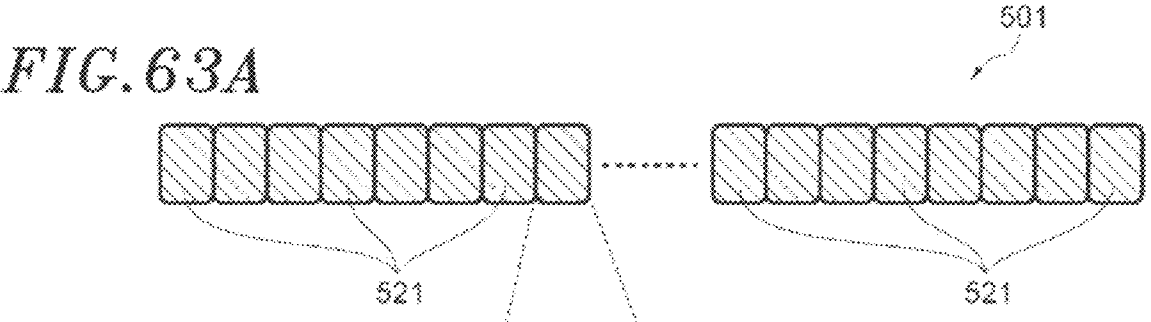
Figure 63B:
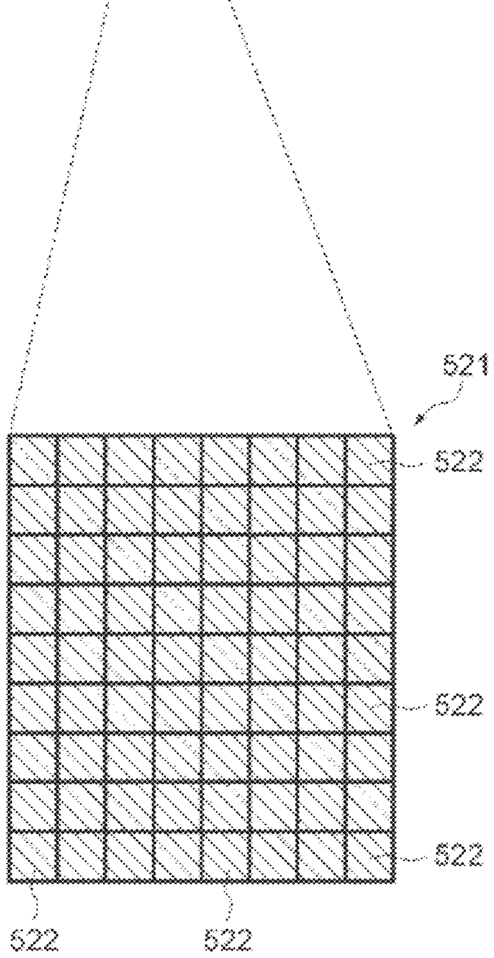

FIG. 63A is a cross-sectional view of a coil according to yet another exemplary embodiment, and FIG. 63B is a cross-sectional view of a wire rod of the coil according to yet another exemplary embodiment.

Figure 64A:
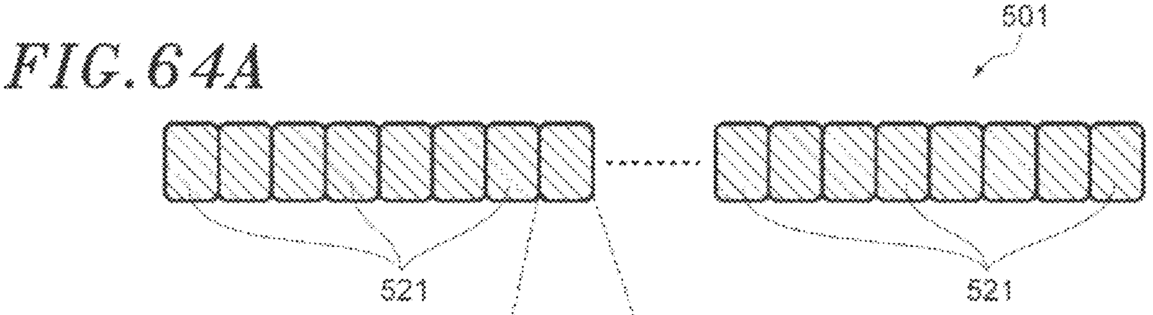
Figure 64B:
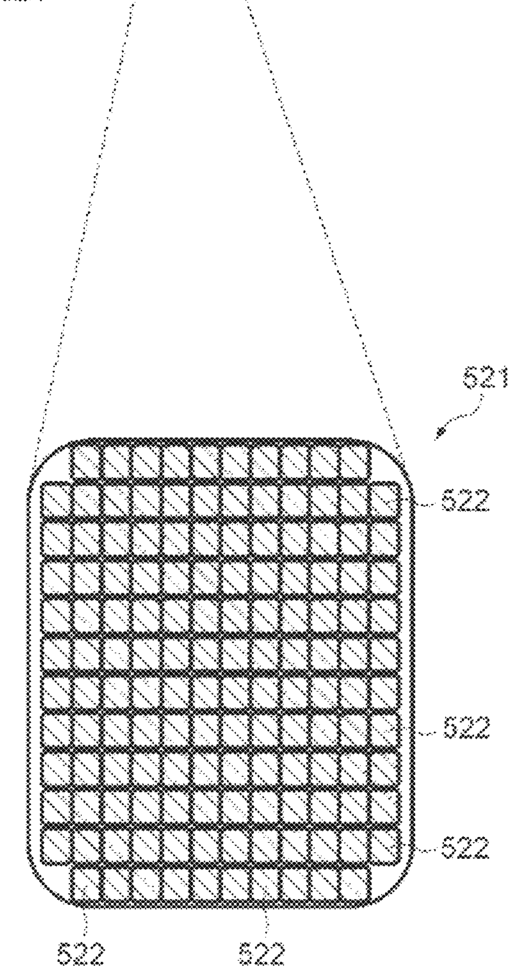

FIG. 64A is a cross-sectional view of a coil according to yet another exemplary embodiment, and FIG. 64B is a cross-sectional view of a wire rod of the coil according to yet another exemplary embodiment.

Figure 65A:
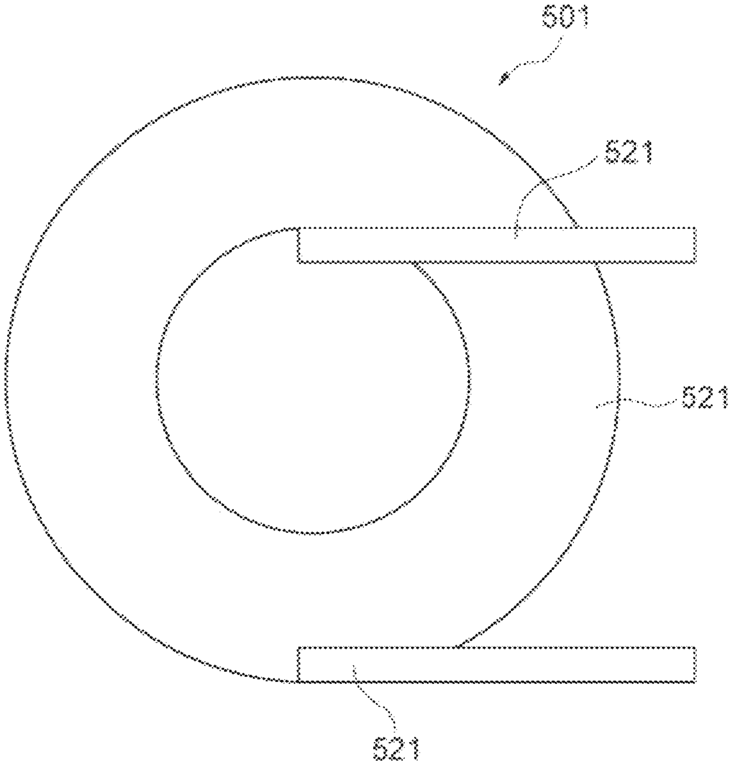
Figure 65B:
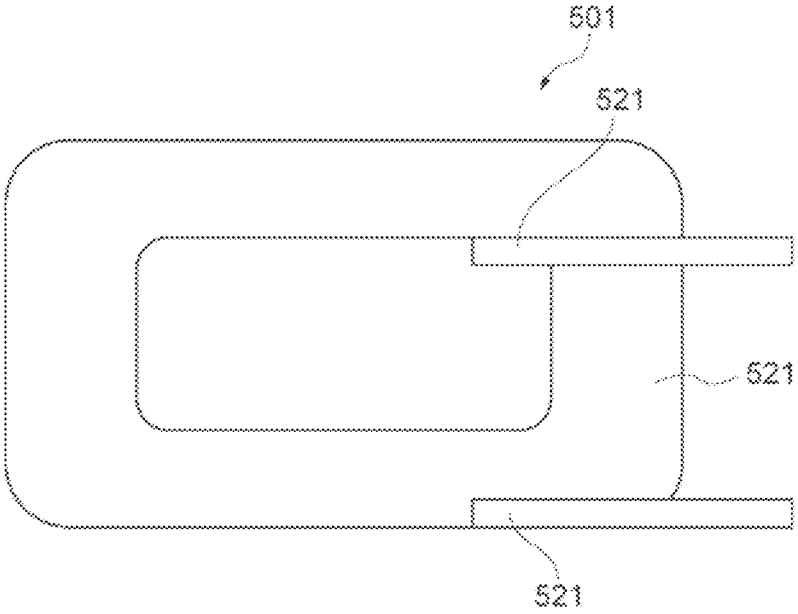

Each of FIGS. 65A and 65B is a plan view of a coil according to yet another exemplary embodiment.

Figure 66A:
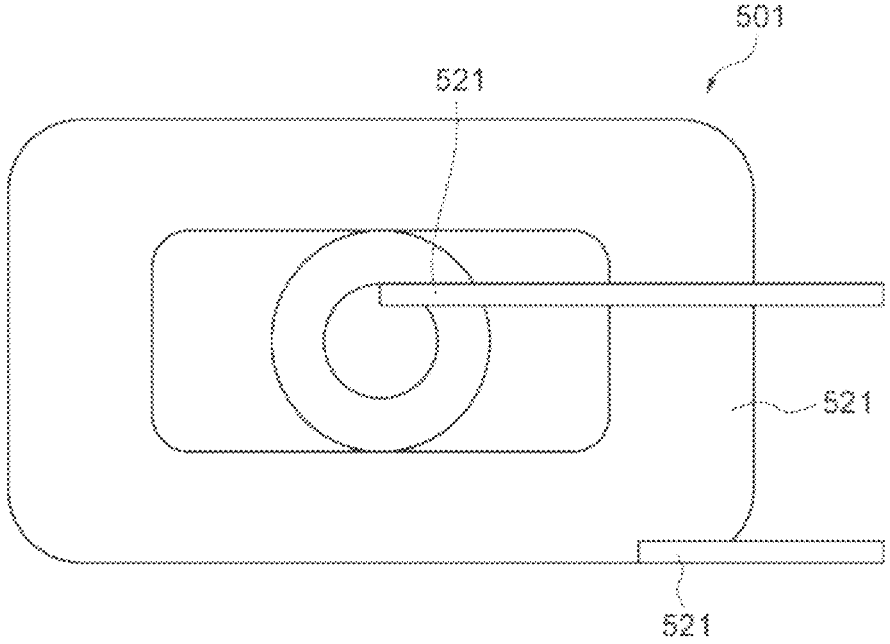
Figure 66B:
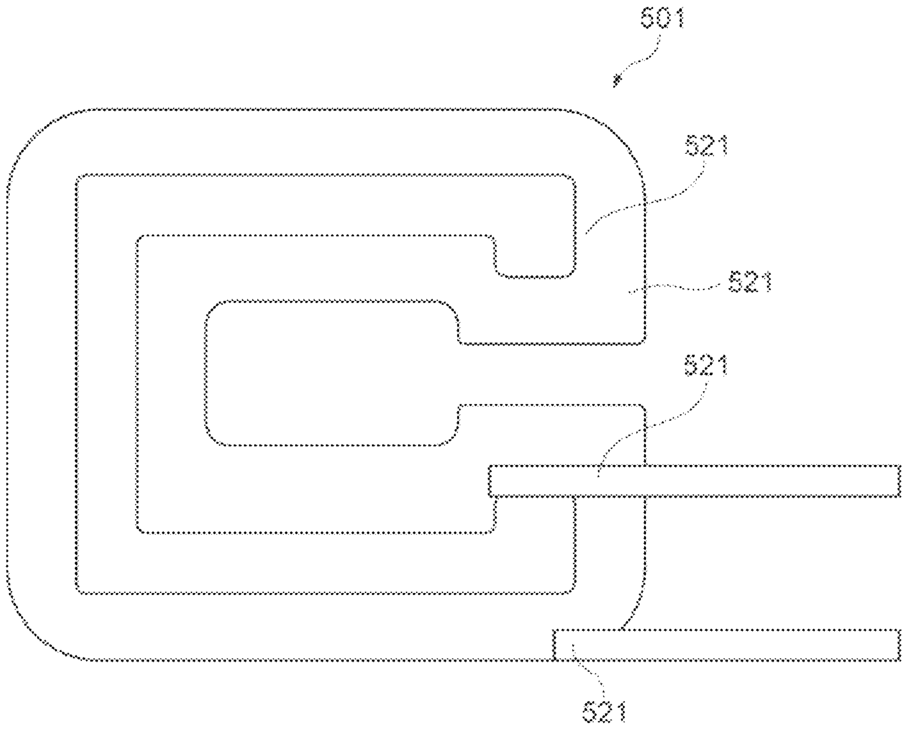

Each of FIGS. 66A and 66B is a plan view of a coil according to yet another exemplary embodiment.

Each of FIGS. 67A to 67D is a cross-sectional view of a coil according to yet another exemplary embodiment.

Figure 68A:
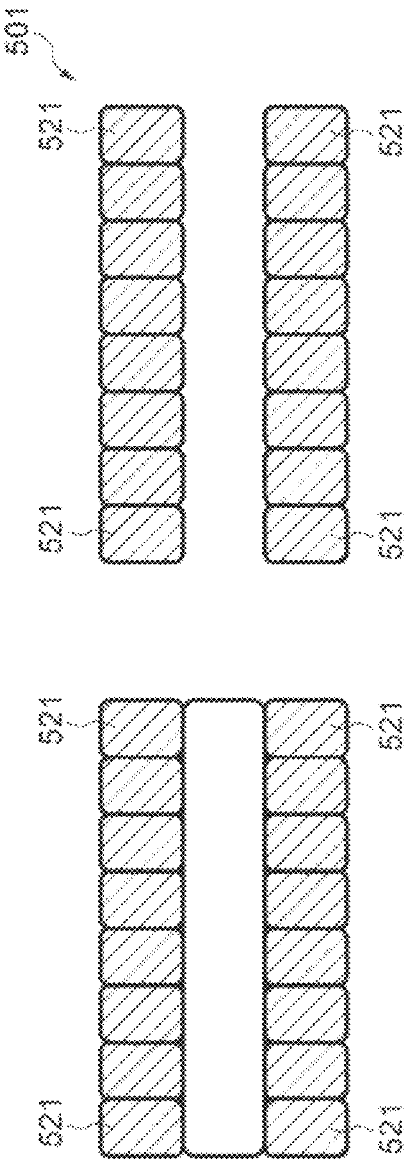
Figure 68B:
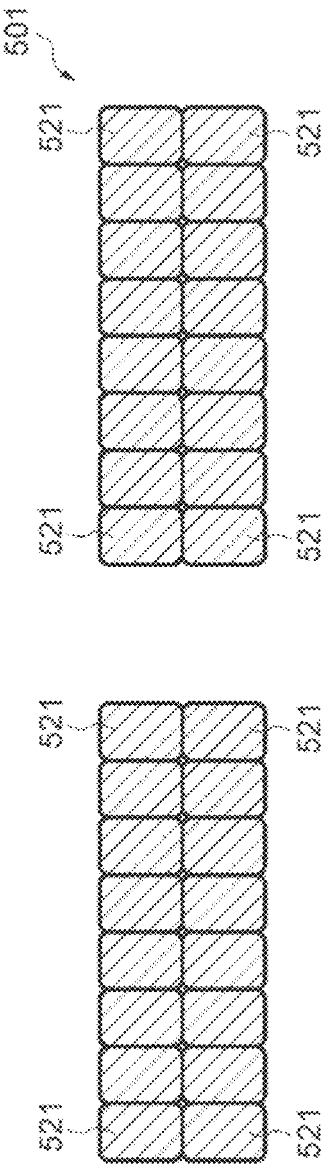

Each of FIGS. 68A and 68B is a cross-sectional view of a coil according to yet another exemplary embodiment.

Figure 69A:
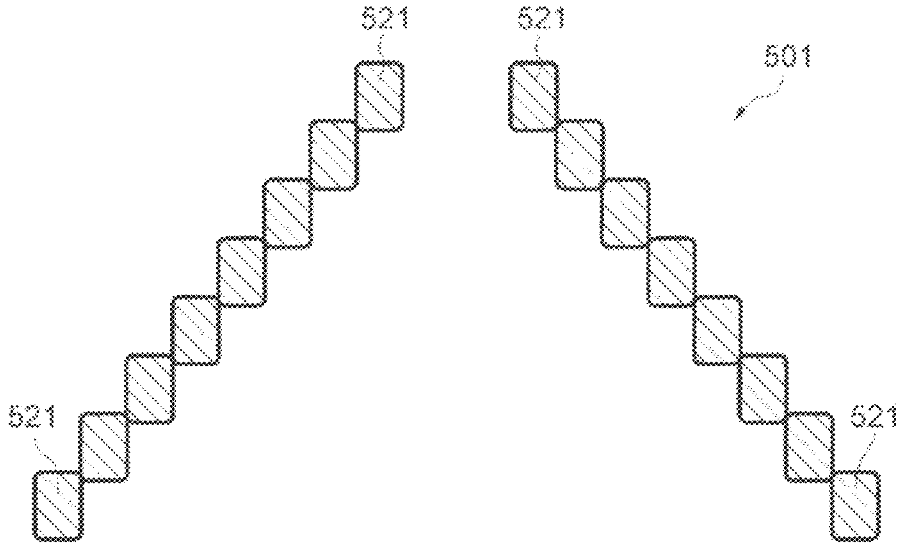
Figure 69B:
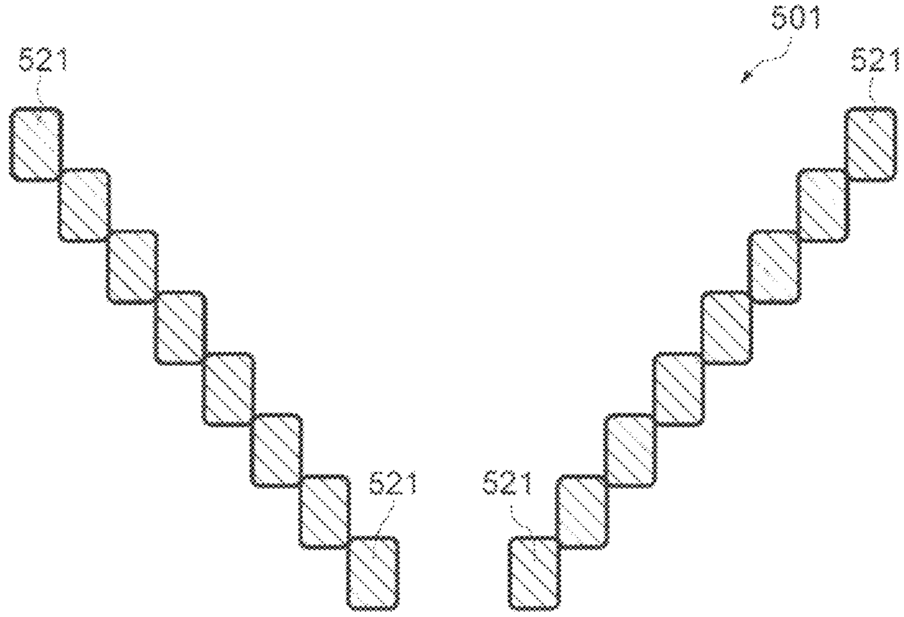

Each of FIGS. 69A and 69B is a cross-sectional view of a coil according to yet another exemplary embodiment.

Figure 70:
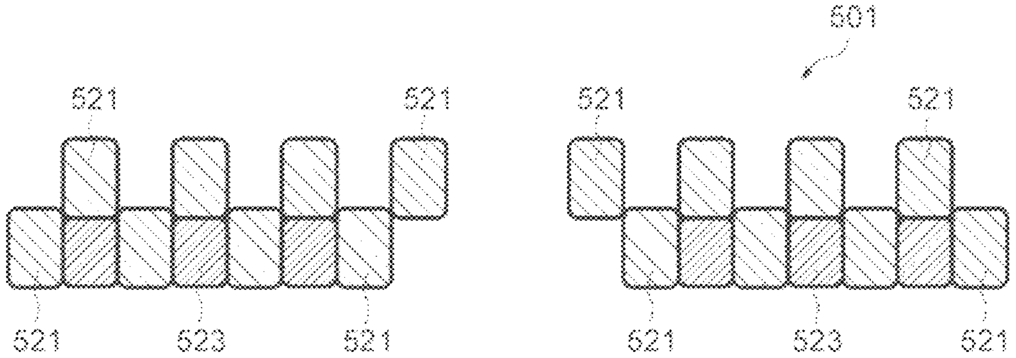

FIG. 70 is a cross-sectional view of a coil according to another exemplary embodiment.

Figure 71:
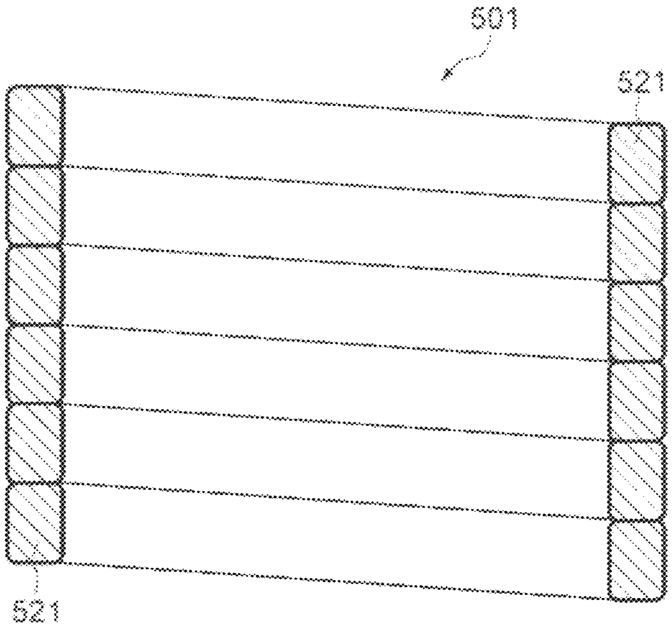

FIG. 71 is a cross-sectional view of a coil according to another exemplary embodiment.

Figure 72B:
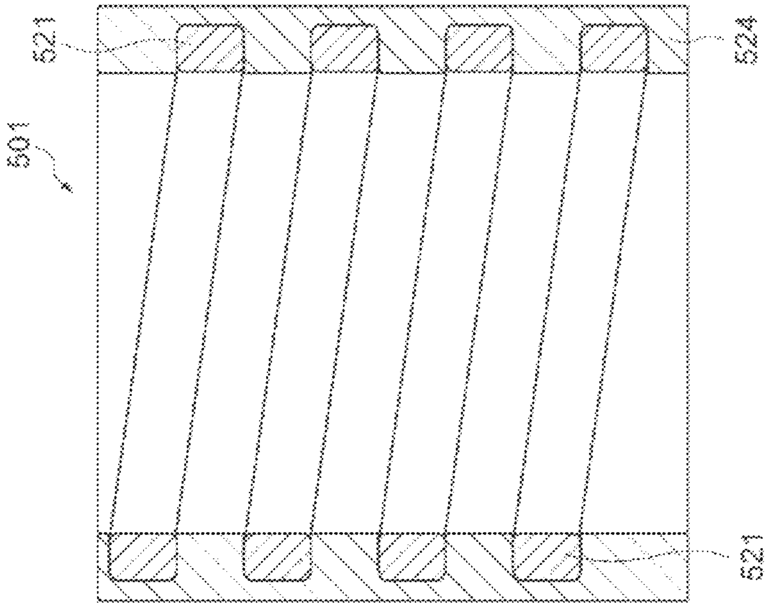
Figure 72A:
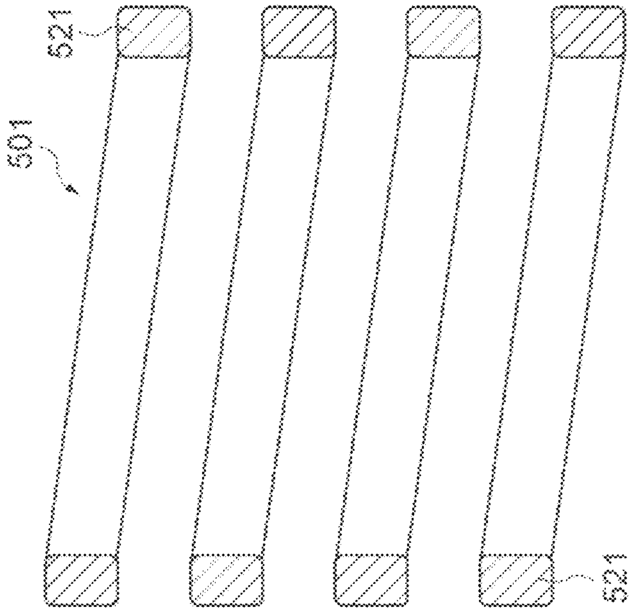

Each of FIGS. 72A and 72B is a cross-sectional view of a coil according to yet another exemplary embodiment.

DETAILED DESCRIPTION

Hereinafter, various exemplary embodiments will be described in detail with reference to the drawings, in which the same or corresponding portions are designated by the same reference numerals.

Figure 1:
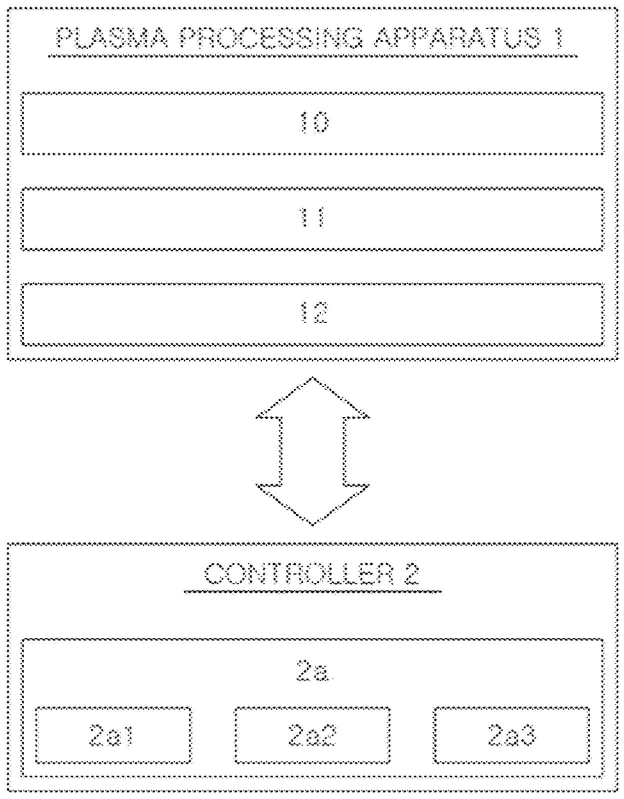
FIG. 1 is a diagram illustrating an example of a configuration of a plasma processing system.

FIG. 1 is a diagram illustrating an example of a configuration of a plasma processing system. In an embodiment, the plasma processing system includes a plasma processing apparatus 1 and a controller (control circuitry, processing circuitry) 2. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. Further, the plasma processing chamber 10 has at least one gas inlet for supplying at least one processing gas to the plasma processing space and at least one gas outlet for discharging the gas from the plasma processing space. The gas inlet is connected to a gas supply portion 20 to be described later, and the gas outlet is connected to an exhaust system 40 to be described later. The substrate support 11 is disposed within the plasma processing space and has a substrate support surface for supporting a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), or a surface wave plasma (SWP). Further, various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Thus, the AC signal includes a radio frequency (RF) signal and a microwave signal. In an embodiment, the RF signal has a frequency in a range of 200 kHz to 150 MHz.

The controller 2 processes a computer executable instruction that causes the plasma processing apparatus 1 to execute various processes described in an embodiment of the present disclosure. The controller 2 may be configured to control each element of the plasma processing apparatus 1 so as to execute various processes described herein. In an embodiment, a part or all of the controller 2 may be included in the plasma processing apparatus 1. The controller 2 may include a processor 2*a*1, a memory unit 2*a*2, and a communication interface 2*a*3. The controller 2 is realized by, for example, a computer 2*a*. The processor 2*a*1 may be configured to perform various control operations by reading out a program from the memory unit 2*a*2 and executing the read out program. This program may be stored in advance in the memory unit 2*a*2, or may be acquired via a medium when necessary. The acquired program is stored in the memory unit 2*a*2, and is read out from the memory unit 2*a*2 and executed by the processor 2*a*1. The medium may be any of various memory media readable by the computer 2*a*, or may be a communication line connected to the communication interface 2*a*3. The processor 2*a*1 may be a central processing unit (CPU). The memory unit 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Figure 2:
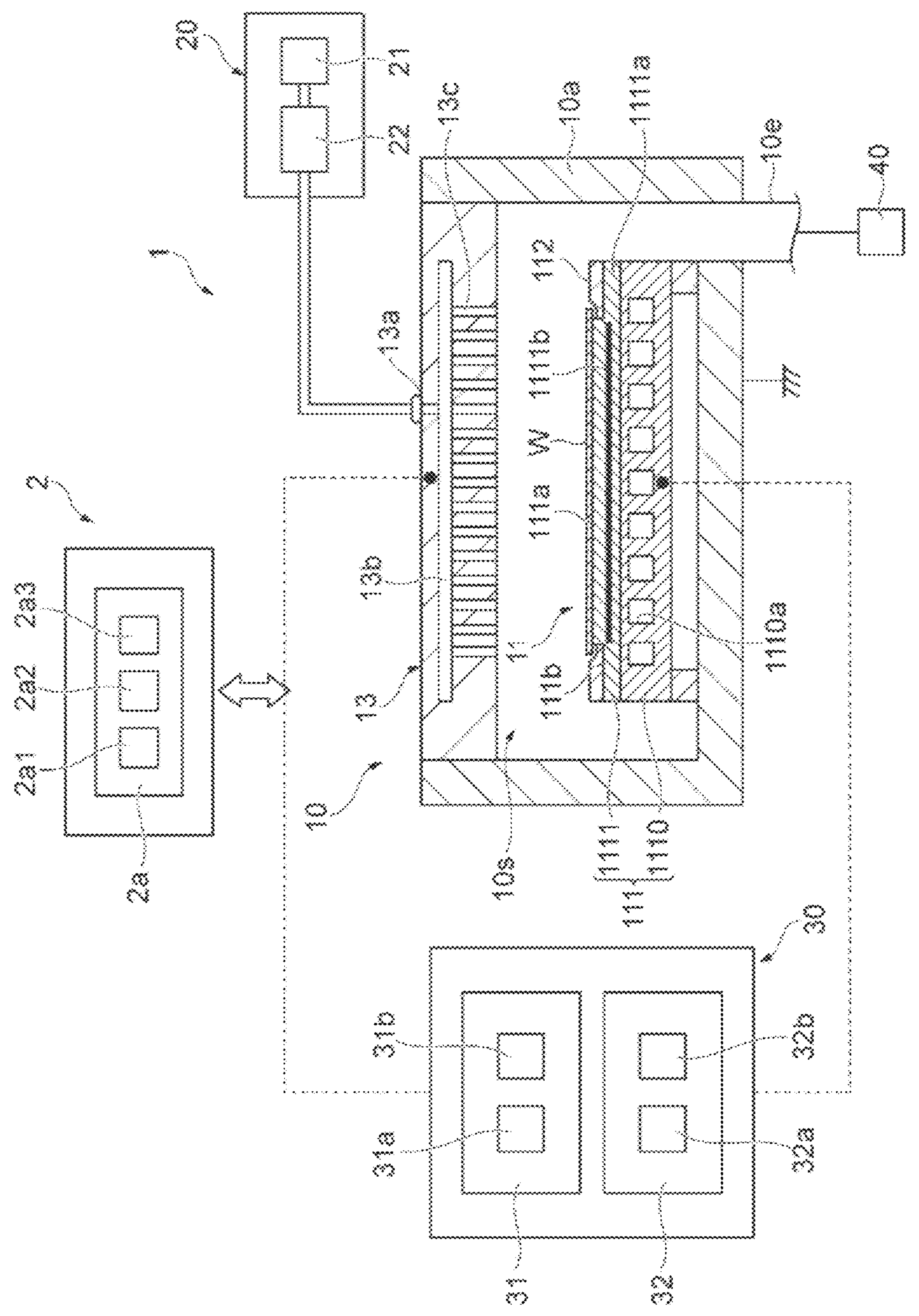
FIG. 2 is a diagram illustrating an example of a configuration of a capacitively coupled plasma processing apparatus.

Hereinafter, the configuration example of a capacitively coupled plasma processing apparatus as an example of the plasma processing apparatus 1 will be described. FIG. 2 is a diagram illustrating an example of a configuration of a capacitively coupled plasma processing apparatus.

The capacitively coupled plasma processing apparatus 1 includes the plasma processing chamber 10, a gas supply portion 20, a power supply 30, and an exhaust system 40. Further, the plasma processing apparatus 1 includes the substrate support 11 and a gas introduction portion. The gas introduction portion is configured to introduce at least one processing gas into the plasma processing chamber 10. The gas introduction portion includes a shower head 13. The substrate support 11 is disposed within the plasma processing chamber 10. The shower head 13 is disposed above the substrate support 11. In an embodiment, the shower head 13 forms at least portion of a ceiling of the plasma processing chamber 10. The plasma processing chamber 10 has a plasma processing space 10*s* defined by the shower head 13, a side wall 10*a* of the plasma processing chamber 10, and the substrate support 11. The plasma processing chamber 10 is grounded. The shower head 13 and the substrate support 11 are electrically insulated from a housing of the plasma processing chamber 10.

The substrate support 11 includes a main body 111 and a ring assembly 112. The main body 111 has a central area 111*a* for supporting a substrate W, and an annular area 111*b* for supporting the ring assembly 112. The wafer is an example of the substrate W. The annular area 111*b* of the main body 111 surrounds the central area 111*a* of the main body 111 in a plan view. The substrate W is disposed on the central area 111*a* of the main body 111, and the ring assembly 112 is disposed on the annular area 111*b* of the main body 111 to surround the substrate W on the central area 111*a* of the main body 111. Accordingly, the central area 111*a* is also called a substrate support surface for supporting the substrate W, and the annular area 111*b* is also called a ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a* and an electrostatic electrode (also called an adsorption electrode, a chuck electrode, or a clamp electrode) 1111*b* disposed within the ceramic member 1111*a*. The ceramic member 1111*a* has the central area 111*a*. In an embodiment, the ceramic member 1111*a* also has the annular area 111*b*.

Further, other members surrounding the electrostatic chuck 1111, such as an annular electrostatic chuck or an annular insulating member, may be provided in the annular area 111*b*. In this connection, the ring assembly 112 may be disposed on the annular electrostatic chuck or the annular insulating member, and may be disposed on both the electrostatic chuck 1111 and the annular insulating member. Further, at least one RF/DC electrode coupled to an RF power supply 31 and/or a DC power supply 32, which will be described later, may be disposed within the ceramic member 1111*a*. In this connection, at least one RF/DC electrode functions as a lower electrode. When a bias RF signal and/or a DC signal, which will be described later, is supplied to at least one RF/DC electrode, the RF/DC electrode is also referred to as a bias electrode. Further, the conductive member of the base 1110 and at least one RF/DC electrode may function as a plurality of lower electrodes. Further, the electrostatic electrode 1111*b* may function as a lower electrode. Accordingly, the substrate support 11 includes at least one lower electrode.

The ring assembly 112 includes one or more annular members. In an embodiment, the one or more annular members include one or more edge rings and at least one cover ring. The edge ring is formed of a conductive or insulating material, and the cover ring is formed of an insulating material.

Further, the substrate support 11 may include a temperature control module configured to adjust at least one of the electrostatic chuck 1111, the ring assembly 112, and the substrate W to a target temperature. The temperature control module may include a heater, a heat transfer medium, a flow path 1110*a*, or a combination thereof. A heat transfer fluid such as brine or gas flows through the flow path 1110*a*. In an embodiment, the flow path 1110*a* is formed in the base 1110, and one or more heaters are disposed within the ceramic member 1111*a* of the electrostatic chuck 1111. Further, the substrate support 11 may include a heat transfer gas supply portion configured to supply heat transfer gas to a gap between the back surface of the substrate W and the central area 111*a*.

The shower head 13 is configured to introduce at least one processing gas from the gas supply portion 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and then is introduced from the plurality of gas introduction ports 13*c* into the plasma processing space 10*s*. Further, the shower head 13 includes at least one upper electrode. In addition to the shower head 13, the gas introduction portion may include one or more side gas injectors (SGI) installed in one or more openings formed in the side wall 10*a*.

The gas supply portion 20 may include at least one gas source 21 and at least one flow controller 22. In an embodiment, the gas supply portion 20 is configured to supply at least one processing gas from a corresponding gas source 21 through a corresponding flow controller 22 to the shower head 13. The flow controller 22 may include, for example, a mass flow controller or a pressure-controlled flow controller. Further, the gas supply portion 20 may include at least one flow modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. Thereby, plasma is formed from at least one processing gas supplied to the plasma processing space 10*s*. Accordingly, the RF power supply 31 may function as at least a portion of the plasma generator 12. Further, by supplying a bias RF signal to at least one lower electrode, a bias potential may be generated on the substrate W, and ion components in the formed plasma may be attracted into the substrate W.

In an embodiment, the RF power supply 31 includes a first RF generator 31*a* and a second RF generator 31*b*. The first RF generator 31*a* is coupled to at least one lower electrode and/or at least one upper electrode via at least one impedance matching circuit, and is configured to generate a source RF signal (source RF power) for plasma generation. In an embodiment, the source RF signal has a frequency within the range of 10 MHz to 150 MHZ. In an embodiment, the first RF generator 31*a* may be configured to generate a plurality of source RF signals having different frequencies. One or more generated source RF signals are supplied to at least one lower electrode and/or at least one upper electrode.

The second RF generator 31*b* is coupled to at least one lower electrode via at least one impedance matching circuit, and is configured to generate a bias RF signal (bias RF power). The frequency of the bias RF signal may be equal to or different from the frequency of the source RF signal. In an embodiment, the bias RF signal has a frequency that is lower than the frequency of the source RF signal. In an embodiment, the bias RF signal has a frequency within the range of 100 kHz to 60 MHZ. In an embodiment, the second RF generator 31*b* may be configured to generate a plurality of bias RF signals having different frequencies. One or more generated bias RF signals are supplied to at least one lower electrode. Further, in various embodiments, at least one of the source RF signal and the bias RF signal may be pulsed.

The power supply 30 may also include the DC power supply 32 coupled to the plasma processing chamber 10. The DC power supply 32 includes a first DC generator 32*a* and a second DC generator 32*b*. In one embodiment, the first DC generator 32*a* is connected to at least one lower electrode and generates a first DC signal. The generated first DC signal is applied to at least one lower electrode. In one embodiment, the second DC generator 32*b* is connected to at least one upper electrode and generates a second DC signal. The generated second DC signal is applied to at least one upper electrode.

In various embodiments, the first DC signal or the second DC signal may be pulsed. In this connection, a sequence of voltage pulses is applied to at least one lower electrode and/or to at least one upper electrode. The voltage pulse may have a rectangular, trapezoidal, or triangular pulse waveform, or a combination of these pulse waveforms. In one embodiment, a waveform generator for generating a sequence of voltage pulses based on DC signals is connected between the first DC generator 32*a* and at least one lower electrode. Thus, the first DC generator 32*a* and the waveform generator are included in a voltage pulse generator. When the second DC generator 32*b* and the waveform generator are included in the voltage generator, the voltage pulse generator is connected to at least one upper electrode. The voltage pulses may have positive or negative polarity. The sequence of voltage pulses may also include one or more positive voltage pulses and one or more negative voltage pulses within one cycle. Further, the first DC generator 32*a* and the second DC generator 32*b* may be provided in addition to the RF power supply 31, or the first DC generator 32 a may replace the second RF generator 31*b*.

The exhaust system 40 may be, for example, connected to a gas outlet 10*e* in the bottom of the plasma processing chamber 10. The exhaust system 40 may include a pressure control valve and a vacuum pump. The pressure control valve regulates the pressure in the plasma processing space 10*s*. The vacuum pump may include a turbomolecular pump, a dry pump, or a combination of these. Further, in the capacitively coupled plasma processing apparatus 1, the upper electrode is disposed so that the plasma processing space is located between the upper electrode and the substrate support 11. A high frequency power supply, such as the first RF generator 31*a*, is electrically connected to the upper electrode or the lower electrode within the substrate support 11. When the plasma processing apparatus 1 is an inductively coupled plasma processing apparatus, the antenna is disposed so that the plasma processing space is located between the antenna and the substrate support 11. The high frequency power supply, such as the first RF generator 31*a*, is electrically connected to the antenna. When the plasma processing apparatus 1 is a plasma processing apparatus that generates plasma by surface waves such as microwaves, the antenna is disposed so that the plasma processing space is located between the antenna and the substrate support 11. A high frequency power supply, such as the first RF generator 31*a*, is electrically connected to the antenna via a waveguide.

Hereinafter, plasma processing apparatuses according to various exemplary embodiments will be described. Each of the plasma processing apparatuses described below is configured to supply power to at least one power consuming member in the chamber 10 by wireless power feeding (electromagnetic inductive coupling) and may have the same configuration as the plasma processing apparatus 1.

Figure 3:
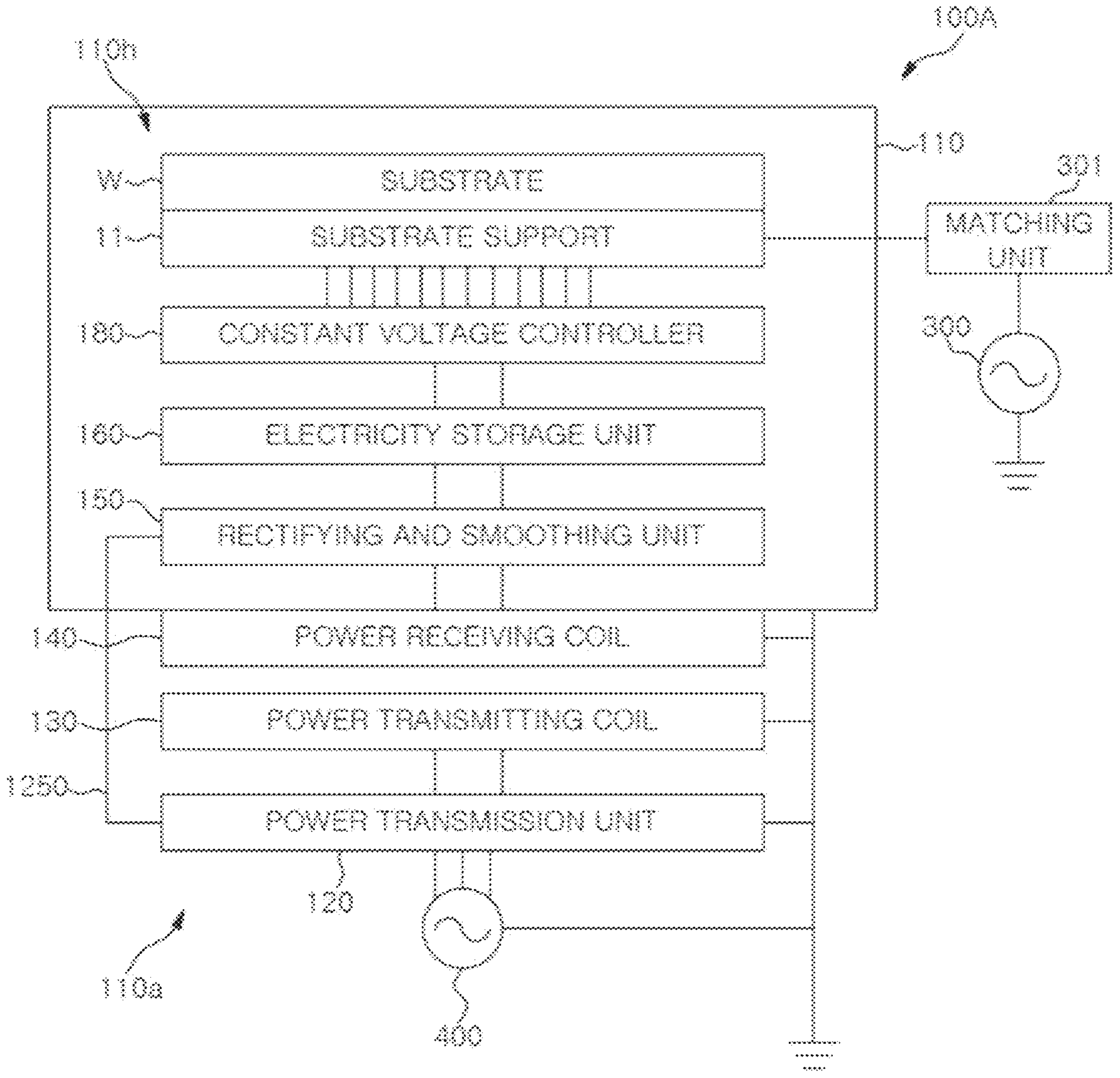
FIG. 3 is a diagram schematically illustrating a plasma processing apparatus according to one exemplary embodiment.

FIG. 3 is a diagram schematically illustrating a plasma processing apparatus according to one exemplary embodiment. A plasma processing apparatus 100A shown in FIG. 3 includes at least one high frequency power supply 300, a power receiving coil unit 140, an electricity storage unit 160, and at least one power consuming member 240 (see FIGS. 25 and 26). The plasma processing apparatus 100A may further include a power transmission unit 120, a power transmitting coil unit 130, a rectifying and smoothing unit 150, a constant voltage controller 180 (an example of a voltage controller), a ground frame 110, and a matching unit 301.

At least one high frequency power supply 300 includes the first RF generator 31*a* and/or the second RF generator 32*a*. At least one high frequency power supply 300 is electrically connected to the substrate support 11 via the matching unit 301. The matching unit 301 includes at least one impedance matching circuit.

The ground frame 110 includes the chamber 10 and is electrically grounded. The ground frame 110 electrically separates an internal space 110*h* (RF-Hot space) from an external space 110*a* (atmospheric space). The ground frame 110 surrounds the substrate support 11 disposed within the space 110*h*. In the plasma processing apparatus 100A, the rectifying and smoothing unit 150, the electricity storage unit 160, and the constant voltage controller 180 are disposed within the space 110*h*. In the plasma processing apparatus 100A, the power transmission unit 120, the power transmitting coil unit 130, and the power receiving coil unit 140 are disposed within the space 110*a*.

The devices disposed within the space 110*a*, that is, the power transmission unit 120, the power transmitting coil unit 130, and the power receiving coil unit 140, are covered by a metal housing made of a metal such as aluminum, and the metal housing is grounded. Thereby, this suppresses leakage of high frequency noise caused by high frequency power such as a first RF signal (source RF signal) and/or a second RF signal (bias RF signal). The metal housing and each power feeding line have an insulating distance therebetween. In the following description, high frequency power such as the first RF signal and/or the second RF signal propagating toward the power transmission unit 120 may be referred to as high frequency noise, common-mode noise, or conductive noise.

The power transmission unit 120 is electrically connected between an AC power supply 400 (for example, a commercial AC power supply) and the power transmitting coil unit 130. The power transmission unit 120 receives the frequency of AC power from the AC power supply 400 and converts the frequency of the AC power into a transmission frequency, thereby generating AC power having the transmission frequency, that is, transmission AC power.

The power transmitting coil unit 130 includes a power transmitting coil 131 (see FIG. 9), which will be described later. The power transmitting coil 131 is electrically connected to power transmission unit 120. The power transmitting coil 131 receives the transmission AC power from the power transmission unit 120 and wirelessly transmits the transmission AC power to a power receiving coil 141.

The power receiving coil unit 140 includes a power receiving coil 141 (see FIG. 9) which will be described later. The power receiving coil 141 is electromagnetically inductively coupled to the power transmitting coil 131. Electromagnetic induction coupling includes magnetic field coupling and electric field coupling. In addition, the magnetic field coupling includes magnetic resonance. The distance between the power receiving coil 141 and the power transmitting coil 131 is set so as to suppress common mode noise (conductive noise). Further, the distance between the power receiving coil 141 and the power transmitting coil 131 is set to a distance that allows power feeding. The distance between the power receiving coil 141 and the power transmitting coil 131 is set so that the attenuation of high frequency power (that is, high frequency noise) between the power receiving coil 141 and the power transmitting coil 131 is below a threshold value and so that power from the power transmitting coil 131 is received by the power receiving coil 141. The threshold value of the attenuation is set to a value that may sufficiently prevent damage or malfunction of the power transmission unit 120. The threshold value of the attenuation is, for example, −20 dB. The transmission AC power received by the power receiving coil unit 140 is output to the rectifying and smoothing unit 150.

The rectifying and smoothing unit 150 is electrically connected between the power receiving coil unit 140 and the electricity storage unit 160. The rectifying and smoothing unit 150 generates DC power by full-wave rectification and smoothing of the AC power transmitted from the power receiving coil unit 140. The DC power generated by the rectifying and smoothing unit 150 is stored in the electricity storage unit 160. The electricity storage unit 160 is electrically connected between the rectifying and smoothing unit 150 and the constant voltage controller 180. The rectifying and smoothing unit 150 may generate DC power by half-wave rectification and smoothing of the AC power transmitted from the power receiving coil unit 140.

The rectifying and smoothing unit 150 and the power transmission unit 120 are electrically connected to each other by a signal line 1250. The rectifying and smoothing unit 150 transmits an instruction signal to the power transmission unit 120 via the signal line 1250. The instruction signal is a signal for instructing the power transmission unit 120 to supply transmission AC power or to stop supplying transmission AC power. The instruction signal may include a status signal, an abnormality detection signal, and a cooling control signal for the power transmitting coil unit 130 and the power receiving coil unit 140. The status signal is a value of the magnitude and/or phase of the voltage, current, power, etc. detected by a voltage detector 155*v* (see FIG. 14) and a current detector 155*i* (see FIG. 14) of the rectifying and smoothing unit 150. The abnormality detection signal is a signal for transmitting to the power transmission unit 120 the occurrence of a failure and/or an abnormal temperature in the rectifying and smoothing unit 150. The cooling control signal controls the cooling appliances provided in the power transmitting coil unit 130 and the power receiving coil unit 140. The cooling control signal controls the number of revolutions of a fan in the case of air cooling, for example. Further, in the case of liquid cooling, the flow rate and/or temperature of a coolant are controlled.

The constant voltage controller 180 applies a voltage to at least the power consuming member 240 using the power stored in the electricity storage unit 160. The constant voltage controller 180 may at least control the application of voltage to the power consuming member 240 and the stopping of the application.

In the plasma processing apparatus 100A, the power receiving coil 141 functions as a filter against high frequency noise caused by high frequency power such as the first RF signal and/or the second RF signal. Accordingly, the propagation of high frequency noise to the power supply outside the plasma processing apparatus is suppressed.

Figure 4:
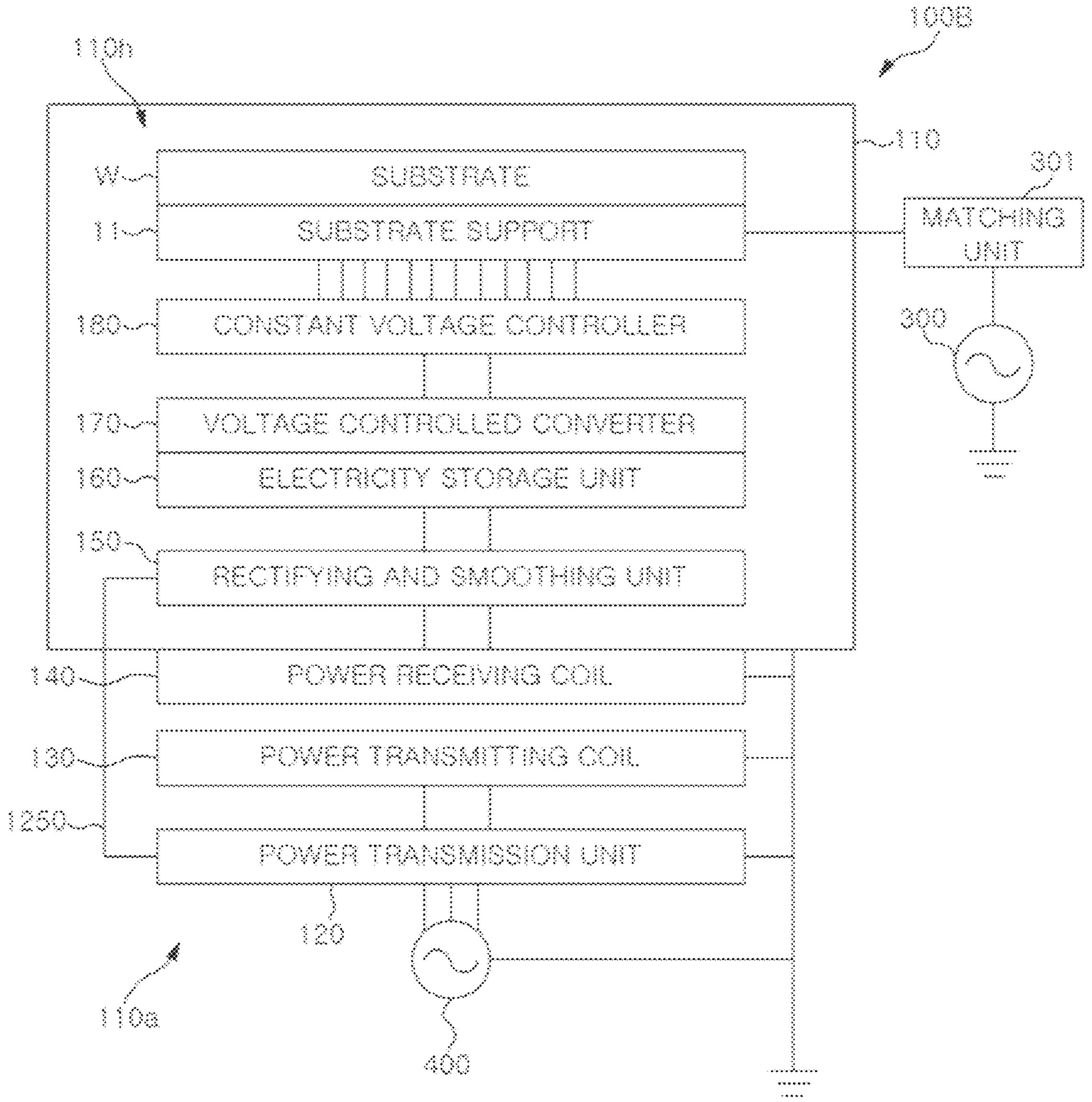
FIG. 4 is a diagram schematically illustrating a plasma processing apparatus according to another exemplary embodiment.

FIG. 4 is referred. FIG. 4 is a diagram schematically illustrating a plasma processing apparatus according to another exemplary embodiment. Hereinafter, a plasma processing apparatus 100B shown in FIG. 4 will be described from the viewpoint of its differences from the plasma processing apparatus 100A.

The plasma processing apparatus 100B further includes a voltage controlled converter 170. The voltage controlled converter 170 is a DC-DC converter, and is connected between the electricity storage unit 160 and the constant voltage controller 180. The voltage controlled converter 170 may be configured to input a constant output voltage to the constant voltage controller 180 even when a voltage fluctuation occurs in the electricity storage unit 160. Further, the voltage fluctuation in the electricity storage unit 160 may occur as a voltage drop or the like according to the stored power when the electricity storage unit 160 is configured with an electric double layer, for example.

Figure 5:
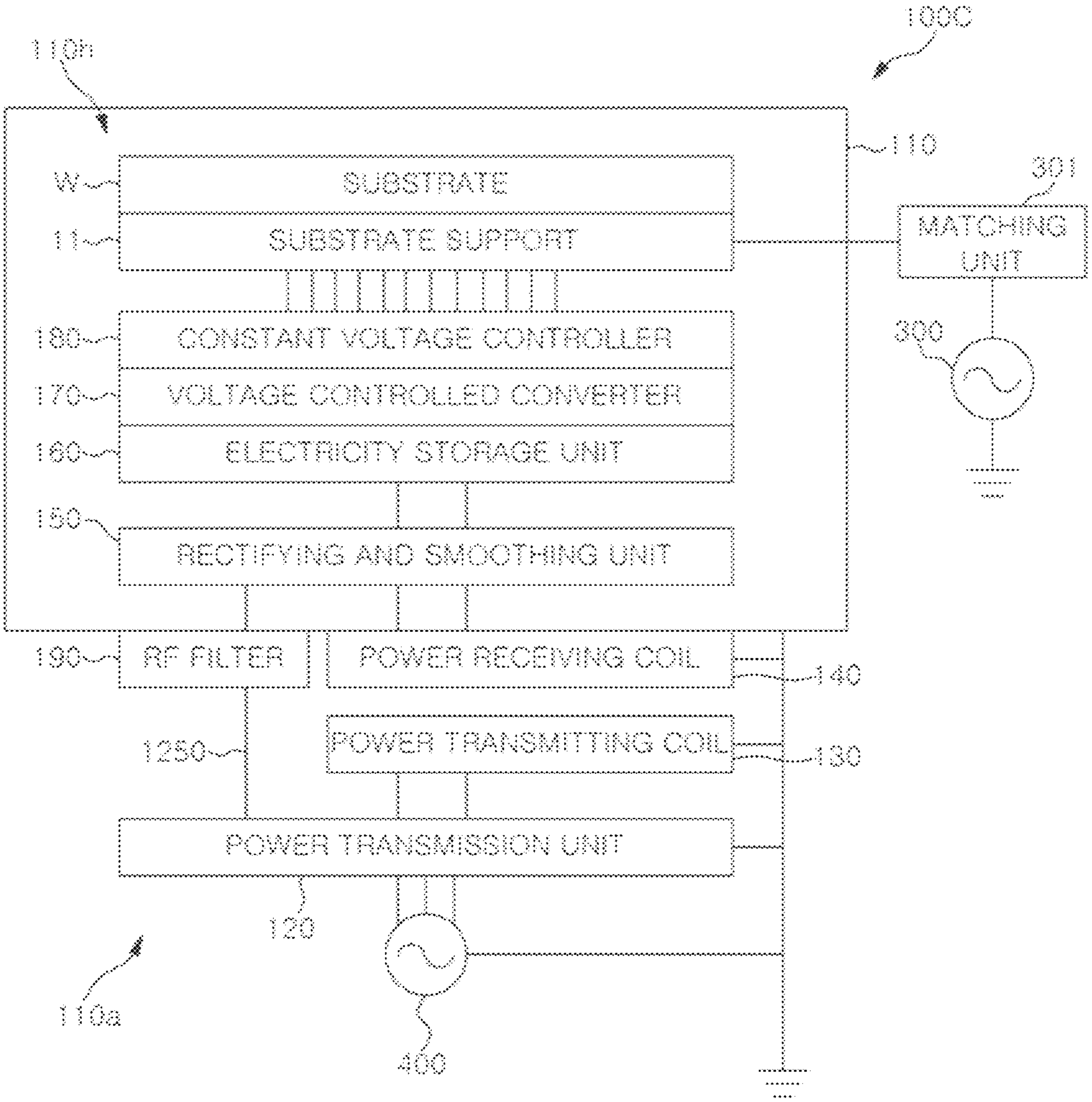
FIG. 5 is a diagram schematically illustrating a plasma processing apparatus according to yet another exemplary embodiment.

FIG. 5 is referred. FIG. 5 is a diagram schematically illustrating a plasma processing apparatus according to yet another exemplary embodiment. Hereinafter, a plasma processing apparatus 100C shown in FIG. 5 will be described from the viewpoint of its differences from the plasma processing apparatus 100B.

The plasma processing apparatus 100C further includes an RF filter 190. The RF filter 190 is connected between the rectifying and smoothing unit 150 and the power transmission unit 120. The RF filter 190 configures a portion of the signal line 1250. The RF filter 190 has the characteristic of suppressing the propagation of high frequency power (high frequency noise) via the signal line 1250. That is, the RF filter 190 includes a low-pass filter having a characteristic of having high impedance to high frequency noise (conductive noise) but passing an instruction signal of a relatively low frequency.

In the plasma processing apparatus 100C, the electricity storage unit 160, the voltage controlled converter 170, and the constant voltage controller 180 are integrated with one another. That is, the electricity storage unit 160, the voltage controlled converter 170, and the constant voltage controller 180 are all disposed within a single metal housing or formed on a single circuit board. This shortens the length of each of a pair of power feeding lines (positive line and negative line) connecting the electricity storage unit 160 and the voltage controlled converter 170 to each other. Furthermore, the lengths of the pair of power feeding lines connecting the electricity storage unit 160 and the voltage controlled converter 170 to each other may be made equal to each other. Furthermore, the length of each of the pair of power feeding lines (positive and negative lines) connecting the voltage controlled converter 170 and the constant voltage controller 180 to each other is shortened. Furthermore, the lengths of the pair of power feeding lines connecting the voltage controlled converter 170 and the constant voltage controller 180 to each other may be made equal to each other. Accordingly, malfunction and damage of a device caused by normal mode noise (voltage difference between lines of the positive and negative lines) is suppressed. When another metal body that shields the electromagnetic field is provided around a housing within the chamber 10, a single housing does not have to be made of metal.

Figure 6:
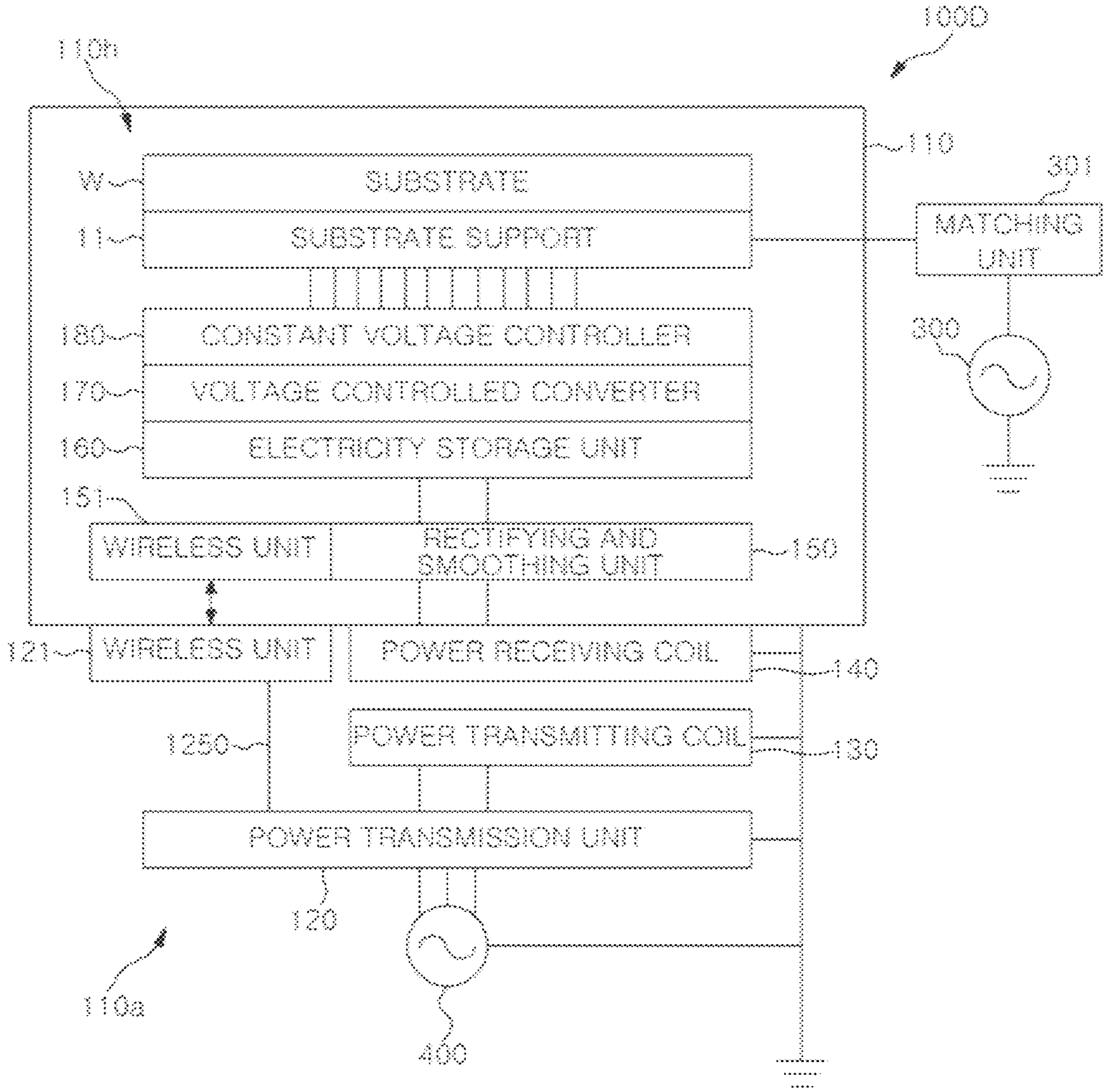
FIG. 6 is a diagram schematically illustrating a plasma processing apparatus according to yet another exemplary embodiment.

FIG. 6 is referred. FIG. 6 is a diagram schematically illustrating a plasma processing apparatus according to yet another exemplary embodiment. Hereinafter, a plasma processing apparatus 100D shown in FIG. 6 will be described from the viewpoint of its differences from the plasma processing apparatus 100C.

The plasma processing apparatus 100D does not include the RF filter 190. In the plasma processing apparatus 100D, the rectifying and smoothing unit 150 includes a communication unit 151 which is a wireless unit. The power transmission unit 120 also includes a communication unit 121 which is a wireless unit. The aforementioned instruction signal is transmitted between the rectifying and smoothing unit 150 and the power transmission unit 120 using the communication unit 151 and the communication unit 121. The communication units 121 and 151 will be described in detail later.

Figure 7:
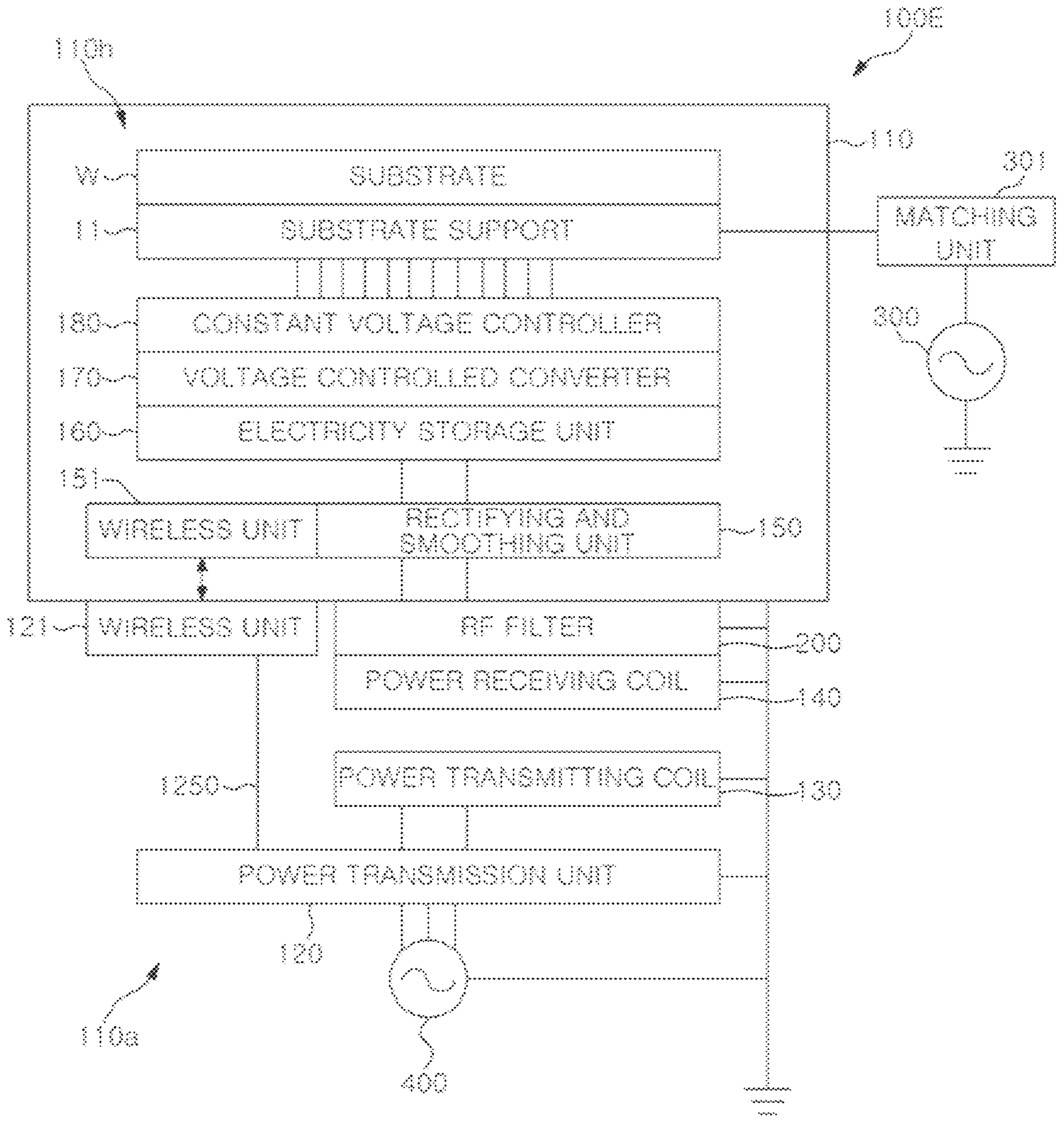
FIG. 7 is a diagram schematically illustrating a plasma processing apparatus according to yet another exemplary embodiment.

FIG. 7 is referred. FIG. 7 is a diagram schematically illustrating a plasma processing apparatus according to yet another exemplary embodiment. Hereinafter, a plasma processing apparatus 100E shown in FIG. 7 will be described from the viewpoint of its differences from the plasma processing apparatus 100D.

The plasma processing apparatus 100E further includes an RF filter 200. The RF filter 200 is connected between the power receiving coil unit 140 and the rectifying and smoothing unit 150. The RF filter 200 has the characteristic of reducing or blocking high frequency noise propagating from the power receiving coil unit 140 to the power transmitting coil 131 and the power transmission unit 120. The RF filter 200 will be described in detail later.

Hereinafter, configurations of each portion for wireless power feeding in the plasma processing apparatuses according to various exemplary embodiments will be described in detail.

[Configuration of Power Transmission Unit]

Figure 8:
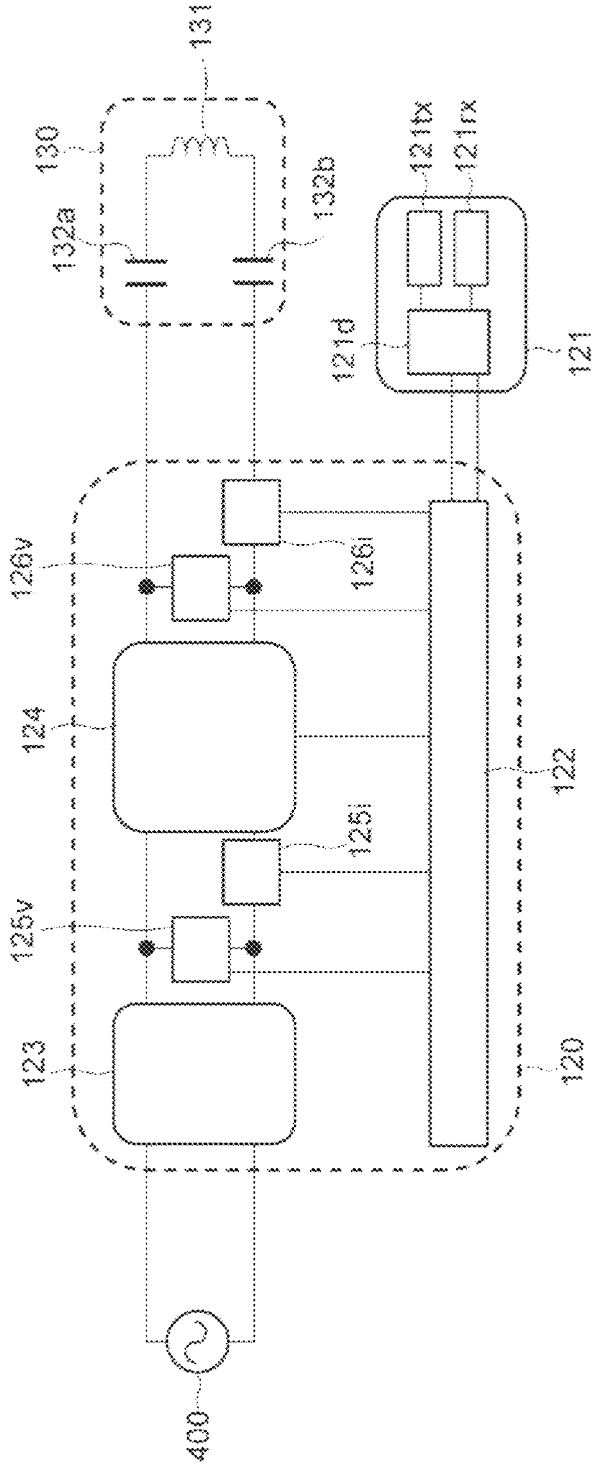
FIG. 8 is a diagram illustrating a power transmission unit according to one exemplary embodiment.

FIG. 8 is a diagram illustrating a power transmission unit according to one exemplary embodiment. As described above, the power transmission unit 120 receives the frequency of the AC power from the AC power supply 400 and converts the frequency of the AC power into a transmission frequency, thereby generating transmission AC power having the transmission frequency.

In one embodiment, the power transmission unit 120 includes a controller 122, a rectifying and smoothing unit 123, and an inverter 124. The controller 122 is configured of a processor such as a CPU or a programmable logic device such as an field-programmable gate array (FPGA).

The rectifying and smoothing unit 123 includes a rectifying circuit and a smoothing circuit (ripple filter). The rectifying circuit includes, for example, a diode bridge. The smoothing circuit includes, for example, an interline capacitor. The rectifying and smoothing unit 123 generates DC power by full-wave rectification and smoothing of the AC power from the AC power supply 400. Further, the rectifying and smoothing unit 123 may generate DC power by half-wave rectification and smoothing of the AC power from the AC power supply 400.

The inverter 124 generates transmission AC power having a transmission frequency from the DC power output by the rectifying and smoothing unit 123. The inverter 124 is, for example, a full-bridge inverter, and includes a plurality of triacs or a plurality of switching elements (for example, FETs). The inverter 124 generates the transmission AC power by ON/OFF control of the plurality of triacs or the plurality of switching elements by the controller 122. The transmission AC power output from the inverter 124 is output to the power transmitting coil unit 130.

The power transmission unit 120 may further include a voltage detector 125*v*, a current detector 125*i*, a voltage detector 126*v*, and a current detector 126*i*. The voltage detector 125*v* detects a voltage value between the pair of power feeding lines that connect the rectifying and smoothing unit 123 and the inverter 124 to each other. The current detector 125*i* detects a current value between the rectifying and smoothing unit 123 and the inverter 124. The voltage detector 126*v* detects a voltage value between the pair of power feeding lines that connect the inverter 124 and the power transmitting coil unit 130 to each other. The current detector 126*i* detects a current value between the inverter 124 and the power transmitting coil unit 130. The controller 122 is notified of the voltage value detected by the voltage detector 125*v*, the current value detected by the current detector 125*i*, the voltage value detected by the voltage detector 126*v*, and the current value detected by the current detector 126*i*.

The power transmission unit 120 includes the communication unit 121 described above. The communication unit 121 includes a driver 121*d*, a transmitter 121*tx*, and a receiver 121*rx*. The transmitter 121*tx* is a transmitter of a wireless signal or a transmitter of an optical signal. The receiver 121*rx* is a receiver of a wireless signal or a receiver of an optical signal. The communication unit 121 drives the transmitter 121*tx* using the driver 121*d* to output the signal from the controller 122 from the transmitter 121*tx* as a wireless signal or an optical signal. The signal output from the transmitter 121*tx* is received by the communication unit 151 (see FIG. 14) which will be described later. Furthermore, the communication unit 121 receives a signal such as the instruction signal described above from the communication unit 151 by the receiver 121*rx*, and inputs the received signal to the controller 122 via the driver 121*d*. The controller 122 switches between outputting and stopping the transmission AC power by controlling the inverter 124 in accordance with the instruction signal received from the communication unit 151 via the communication unit 121, the voltage value detected by the voltage detector 125*v*, the current value detected by the current detector 125*i*, the voltage value detected by the voltage detector 126*v*, and the current value detected by the current detector 126*i*.

[Power Transmitting Coil Unit and Power Receiving Coil Unit]

Figure 9:
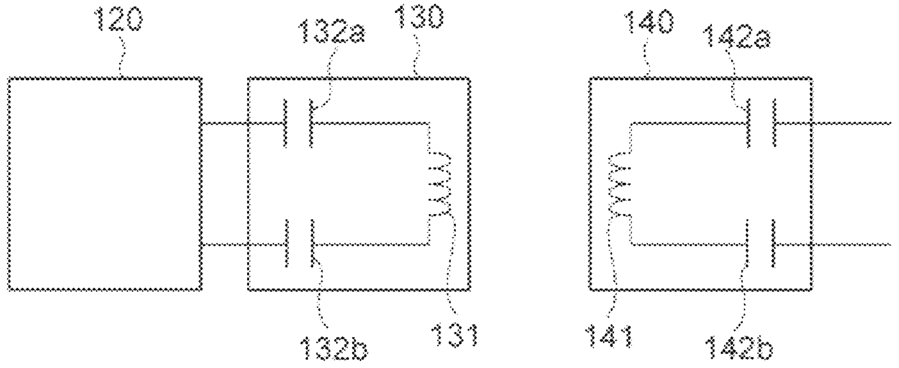
FIG. 9 is a diagram illustrating a power transmitting coil unit and a power receiving coil unit according to one exemplary embodiment.
Figure 10:
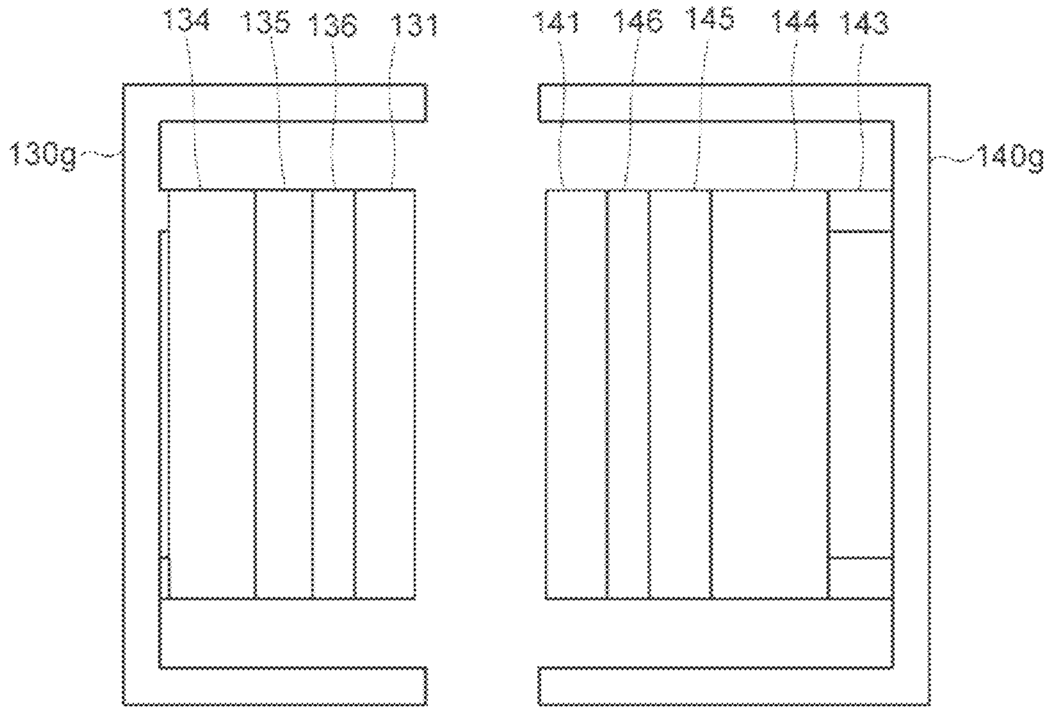
FIG. 10 is a diagram illustrating a power transmitting coil unit and a power receiving coil unit according to one exemplary embodiment.
Figure 11:
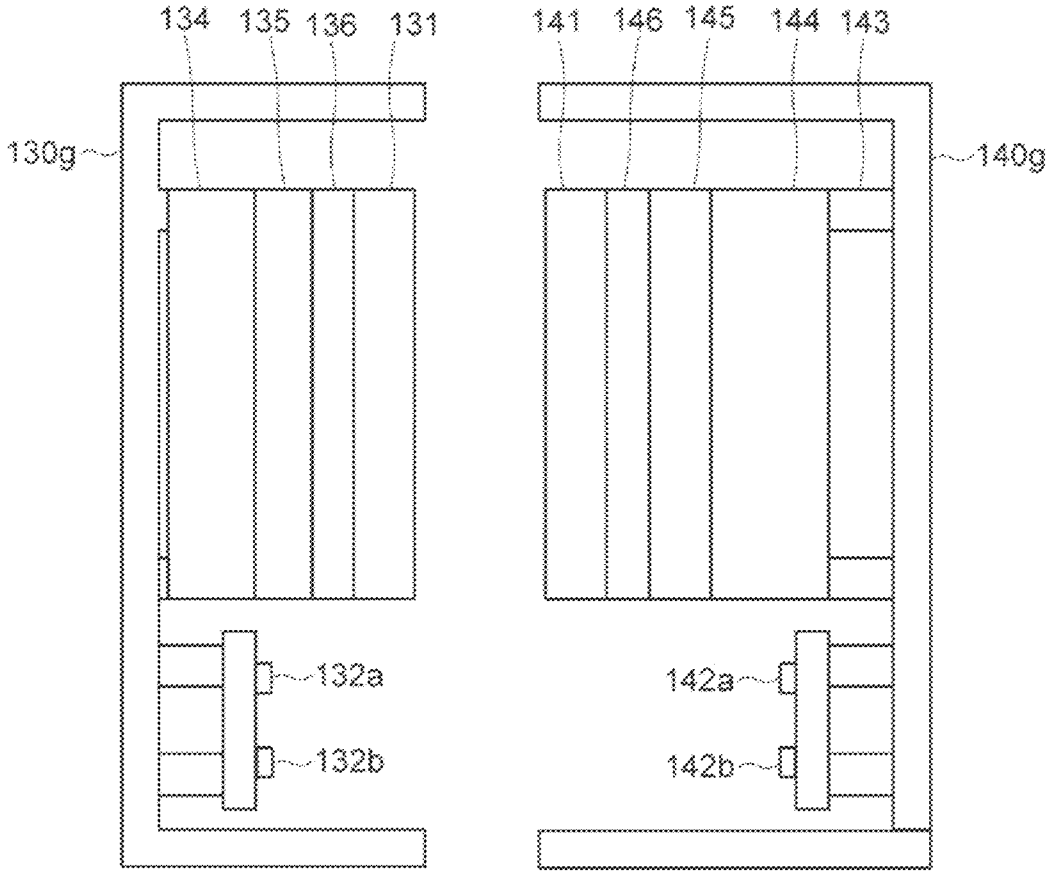
FIG. 11 is a diagram illustrating a power transmitting coil unit and a power receiving coil unit according to one exemplary embodiment.

FIGS. 9 to 11 are referred. Each of FIGS. 9 to 11 is a diagram illustrating a power transmitting coil unit and a power receiving coil unit according to one exemplary embodiment. As shown in FIG. 9, the power transmitting coil unit 130 may include, in addition to the power transmitting coil 131, a resonant capacitor 132*a* and a resonant capacitor 132*b*. The resonant capacitor 132*a* is connected between one of the pair of power feeding lines that connect the power transmission unit 120 and the power transmitting coil unit 130 to each other and one end of the power transmitting coil 131. The resonant capacitor 132*b* is connected between the other of the pair of power feeding lines and the other end of the power transmitting coil 131. The power transmitting coil 131, the resonant capacitor 132*a*, and the resonant capacitor 132*b* configure a resonant circuit for the transmission frequency. That is, the power transmitting coil 131, the resonant capacitor 132*a*, and the resonant capacitor 132*b* have a resonant frequency that is approximately equal to the transmission frequency. Further, the power transmitting coil unit 130 does not necessarily have to include either the resonant capacitor 132*a* or the resonant capacitor 132*b*.

As shown in FIGS. 10 and 11, the power transmitting coil unit 130 may further include a metal housing 130*g*. The metal housing 130*g* has an open end and is grounded. The power transmitting coil 131 is disposed within the metal housing 130*g* with an insulation distance secured therebetween. The power transmitting coil unit 130 may further include a heat sink 134, a ferrite material 135, and a thermally conductive sheet 136. The heat sink 134 is disposed within the metal housing 130*g* and is supported by the metal housing 130*g*. The ferrite material 135 is disposed on the heat sink 134. The thermally conductive sheet 136 is disposed on the ferrite material 135. The power transmitting coil 131 is disposed on the thermally conductive sheet 136 and faces the power receiving coil 141 via the open end of the metal housing 130*g*. As shown in FIG. 11, the resonant capacitor 132*a* and the resonant capacitor 132*b* may be further accommodated within the metal housing 130*g*.

As shown in FIG. 9, the power receiving coil unit 140 includes the power receiving coil 141. The power receiving coil 141 is electromagnetically inductively coupled to the power transmitting coil 131. The power receiving coil unit 140 may include, in addition to the power receiving coil 141, a resonant capacitor 142*a* and a resonant capacitor 142*b*. The resonant capacitor 142*a* is connected between one of the pair of power feeding lines extending from the power receiving coil unit 140 and one end of the power receiving coil 141. The resonant capacitor 142*b* is connected between the other of the pair of power feeding lines and the other end of the power receiving coil 141. The power receiving coil 141, the resonant capacitor 142*a*, and the resonant capacitor 142*b* configure a resonant circuit for the transmission frequency. That is, the power receiving coil 141, the resonant capacitor 142*a*, and the resonant capacitor 142*b* have a resonant frequency that is approximately equal to the transmission frequency. Further, the power receiving coil unit 140 does not necessarily have to include either the resonant capacitor 142*a* or the resonant capacitor 142*b*.

As shown in FIGS. 10 and 11, the power receiving coil unit 140 may further include a metal housing 140*g*. The metal housing 140*g* has an open end and is grounded. The power receiving coil 141 is disposed within the metal housing 140*g* with an insulation distance secured therebetween. The power receiving coil unit 140 may further include a spacer 143, a heat sink 144, a ferrite material 145, and a thermally conductive sheet 146. The spacer 143 is disposed within the metal housing 140*g* and is supported by the metal housing 140*g*. The spacer 143 will be described later. The heat sink 144 is disposed on the spacer 143. The ferrite material 145 is disposed on the heat sink 144. The thermally conductive sheet 146 is disposed on the ferrite material 145. The power receiving coil 141 is disposed on the thermally conductive sheet 146 and faces the power transmitting coil 131 via the open end of the metal housing 140*g*. As shown in FIG. 11, the resonant capacitor 142*a* and the resonant capacitor 142*b* may be further accommodated within the metal housing 140*g*.

The spacer 143 is made of a dielectric material and is provided between the power receiving coil 141 and the metal housing 140*g* (ground). The spacer 143 provides a space stray capacity between the power receiving coil 141 and the ground.

[Impedance Characteristics of Power Receiving Coil Unit]

Figure 12:
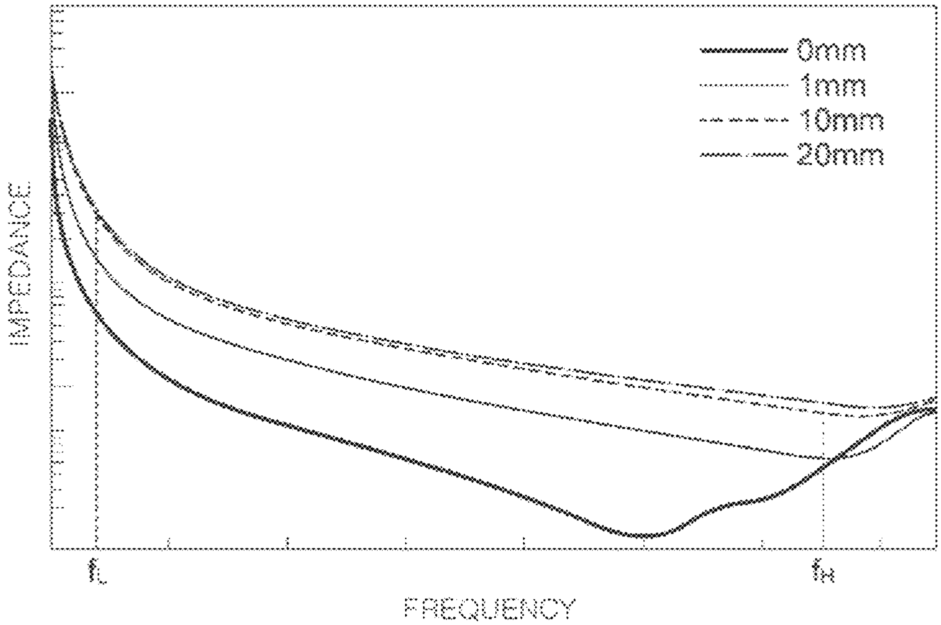
FIG. 12 is a graph showing the impedance characteristics of a power receiving coil unit according to one exemplary embodiment.

FIG. 12 is referred. FIG. 12 is a graph showing the impedance characteristics of a power receiving coil unit according to one exemplary embodiment. FIG. 12 shows the impedance characteristics of the power receiving coil unit 140 according to the thickness of the spacer 143. The thickness of the spacer 143 corresponds to the distance between the heat sink 144 and the metal housing 140*g*. As shown in FIG. 12, the power receiving coil unit 140 may adjust the impedance of each of frequencies $f_H$ and $f_L$ in accordance with the thickness of the spacer 143. Accordingly, the power receiving coil unit 140 may provide high impedance at each of the frequencies of two high frequency powers used in the plasma processing apparatus, such as the first RF signal and the second RF signal. Furthermore, since a high impedance may be obtained in the power receiving coil unit 140, the loss of high frequency power may be suppressed and a high processing rate (for example, an etching rate) may be obtained.

[RF Filter 200]

Figure 13:
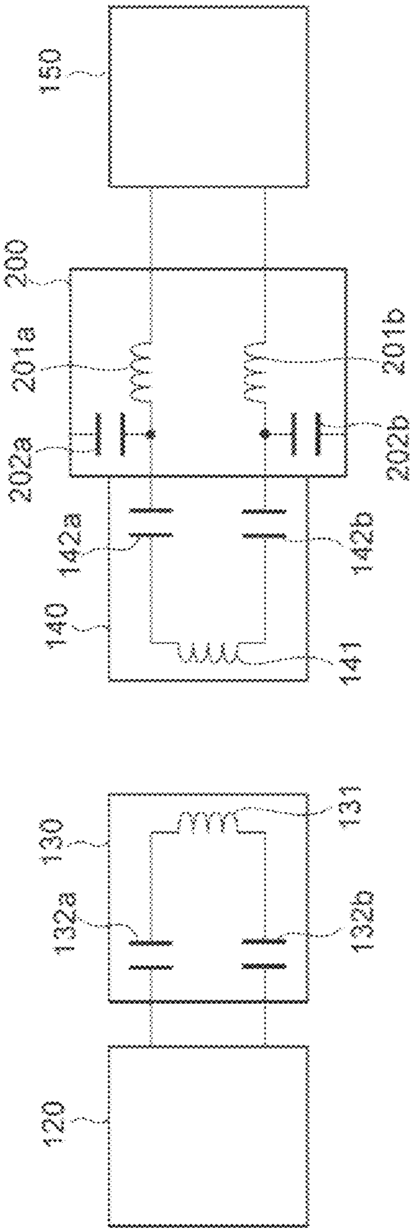
FIG. 13 is a diagram illustrating an RF filter according to one exemplary embodiment.

FIG. 13 is referred. FIG. 13 is a diagram illustrating an RF filter according to one exemplary embodiment. As shown in FIG. 13, the RF filter 200 is connected between the power receiving coil unit 140 and the rectifying and smoothing unit 150. The RF filter 200 includes an inductor 201*a*, an inductor 201*b*, a termination capacitor 202*a*, and a termination capacitor 202*b*. One end of the inductor 201 a is connected to the resonant capacitor 142*a*, and the other end of the inductor 201*a* is connected to the rectifying and smoothing unit 150. One end of the inductor 201*b* is connected to the resonant capacitor 142*b*, and the other end of the inductor 201*b* is connected to the rectifying and smoothing unit 150. The termination capacitor 202*a* is connected between one end of the inductor 201*a* and the ground. The termination capacitor 202*b* is connected between one end of the inductor 201*b* and the ground. The inductor 201*a* and the termination capacitor 202*a* form a low pass filter. Additionally, the inductor 201*b* and the termination capacitor 202*b* form a low pass filter. The RF filter 200 makes it possible to obtain a high impedance at each of the frequencies of the two high frequency powers used in the plasma processing apparatus, such as the first RF signal and the second RF signal. Accordingly, the loss of high frequency power may be suppressed, and a high processing rate (for example, etching rate) may be obtained.

[Rectifying and Smoothing Unit]

Figure 14:
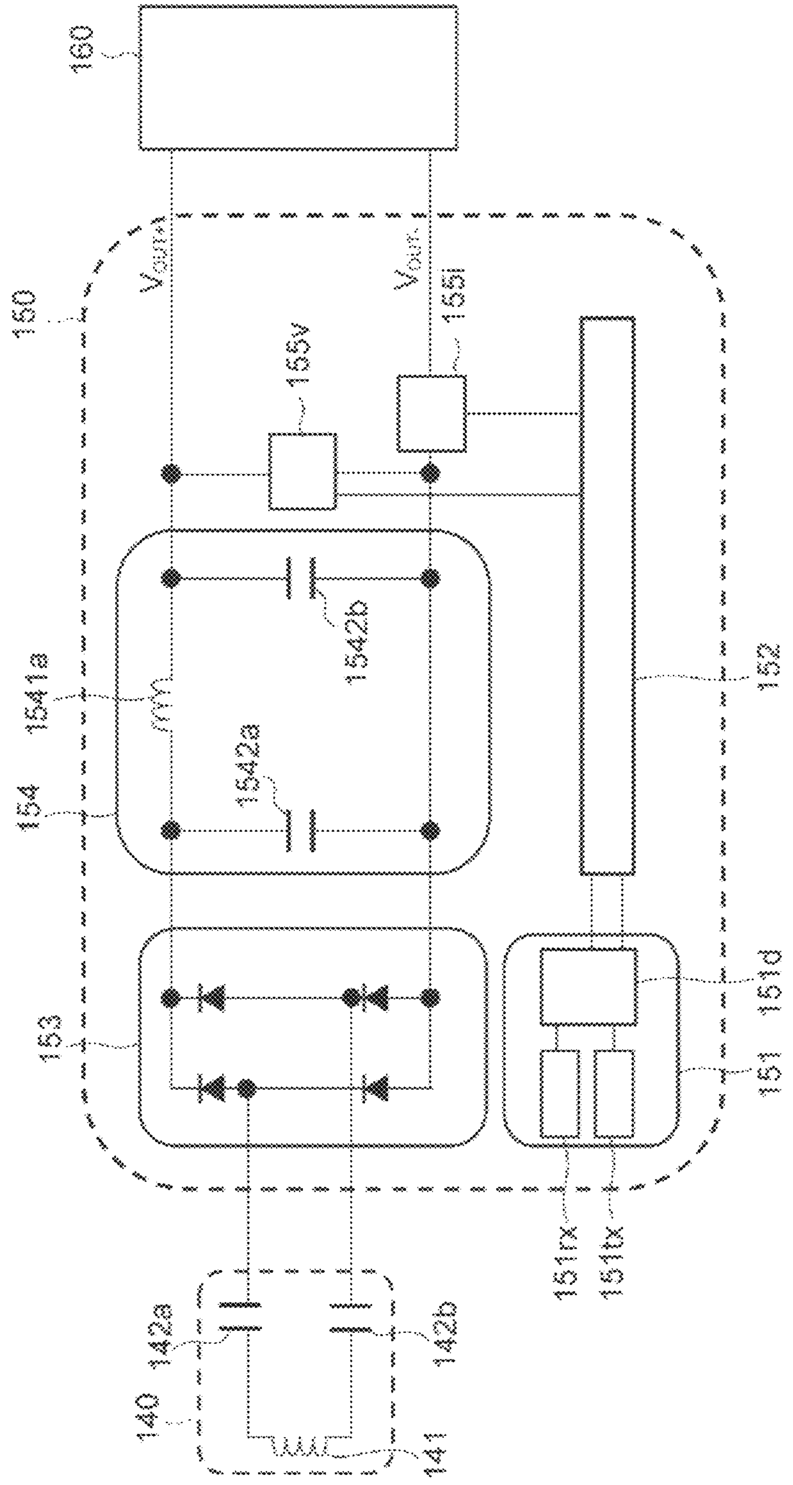
FIG. 14 is a diagram illustrating a rectifying and smoothing unit according to one exemplary embodiment.

FIG. 14 is referred. FIG. 14 is a diagram illustrating a rectifying and smoothing unit according to one exemplary embodiment. In one embodiment, the rectifying and smoothing unit 150 includes a controller 152, a rectifying circuit 153, and a smoothing circuit 154. The rectifying circuit 153 is connected between the power receiving coil unit 140 and the smoothing circuit 154. The smoothing circuit 154 is connected between the rectifying circuit 153 and the electricity storage unit 160. The controller 152 is configured of a processor such as a CPU or a programmable logic device such as an FPGA. Further, the controller 152 may be the same as or different from the controller 122.

The rectifying circuit 153 outputs power generated by full-wave rectification of the AC power from the power receiving coil unit 140. The rectifying circuit 153 is, for example, a diode bridge. Further, the rectifying circuit 153 may output power generated by half-wave rectification of the AC power from the power receiving coil unit 140.

The smoothing circuit 154 generates DC power by smoothing the power from the rectifying circuit 153. The smoothing circuit 154 may include an inductor 1541*a*, a capacitor 1542*a*, and a capacitor 1542*b*. One end of the inductor 1541*a* is connected to one of a pair of inputs of the smoothing circuit 154. The other end of the inductor 1541*a* is connected to a positive output ($V_{OUT+}$) of the rectifying and smoothing unit 150. The positive output of the rectifying and smoothing unit 150 is connected to one end of each of one or more capacitors of the electricity storage unit 160 via a positive line 160*p* (see FIGS. 23A and 23B) of the pair of power feeding lines described below.

One end of the capacitor 1542*a* is connected to one of the pair of inputs of the smoothing circuit 154 and one end of the inductor 1541*a*. The other end of the capacitor 1542*a* is connected to the other of a pair of outputs of the smoothing circuit 154 and a negative output ($V_{OUT-}$) of the rectifying and smoothing unit 150. The negative output of the rectifying and smoothing unit 150 is connected to the other end of each of one or more capacitors of the electricity storage unit 160 via a negative line 160*m* (see FIGS. 23A and 23B) of the pair of power feeding lines described below. One end of the capacitor 1542*b* is connected to the other end of the inductor 1541*a*. The other end of the capacitor 1542*b* is connected to the other of the pair of outputs of the smoothing circuit 154 and the negative output ($V_{OUT-}$) of the rectifying and smoothing unit 150.

The rectifying and smoothing unit 150 may further include a voltage detector 155*v* and a current detector 155*i*. The voltage detector 155*v* detects a voltage value between the positive output and the negative output of the rectifying and smoothing unit 150. The current detector 155*i* detects a current value between the rectifying and smoothing unit 150 and the electricity storage unit 160. The voltage value detected by the voltage detector 155*v* and the current value detected by the current detector 155*i* are notified to the controller 152. The controller 152 generates the instruction signal described above in accordance with the power stored in the electricity storage unit 160. For example, when the power stored in the electricity storage unit 160 is equal to or less than a first threshold value, the controller 152 generates an instruction signal to instruct the power transmission unit 120 to feed power, that is, to output transmission AC power. The first threshold value is the power consumption at a load, for example, the power consuming member 240. In addition, considering margin, the power consumption of a load such as the power consuming member 240 may be multiplied by a certain value (for example, a value within the range of 1 to 3). When the power stored in the electricity storage unit 160 is greater than a second threshold value, the controller 152 generates an instruction signal to instruct the power transmission unit 120 to stop feeding power, that is, to stop outputting the transmission AC power. The second threshold value is a value that does not exceed limit electricity storage power of the electricity storage unit 160. The second threshold value is, for example, a value obtained by multiplying the limit electricity storage power of the electricity storage unit 160 by a certain value (for example, a value equal to or less than 1).

The rectifying and smoothing unit 150 includes the communication unit 151 described above. The communication unit 151 includes a driver 151*d*, a transmitter 151*tx*, and a receiver 151*rx*. The transmitter 151*tx* is a transmitter of a wireless signal or a transmitter of an optical signal. The receiver 151*rx* is a receiver of a wireless signal or a receiver of an optical signal. The communication unit 151 drives the transmitter 151*tx* by the driver 151*d* to output a signal from the controller 122, such as an instruction signal, from the transmitter 151*tx* as a wireless signal or an optical signal. The signal output from the transmitter 151*tx* is received by the communication unit 121 of the power transmission unit 120. Furthermore, the communication unit 151 receives a signal from the communication unit 121 by the receiver 151*rx*, and inputs the received signal to the controller 152 via the driver 151*d*.

[RF Filter 190]

Figure 15:
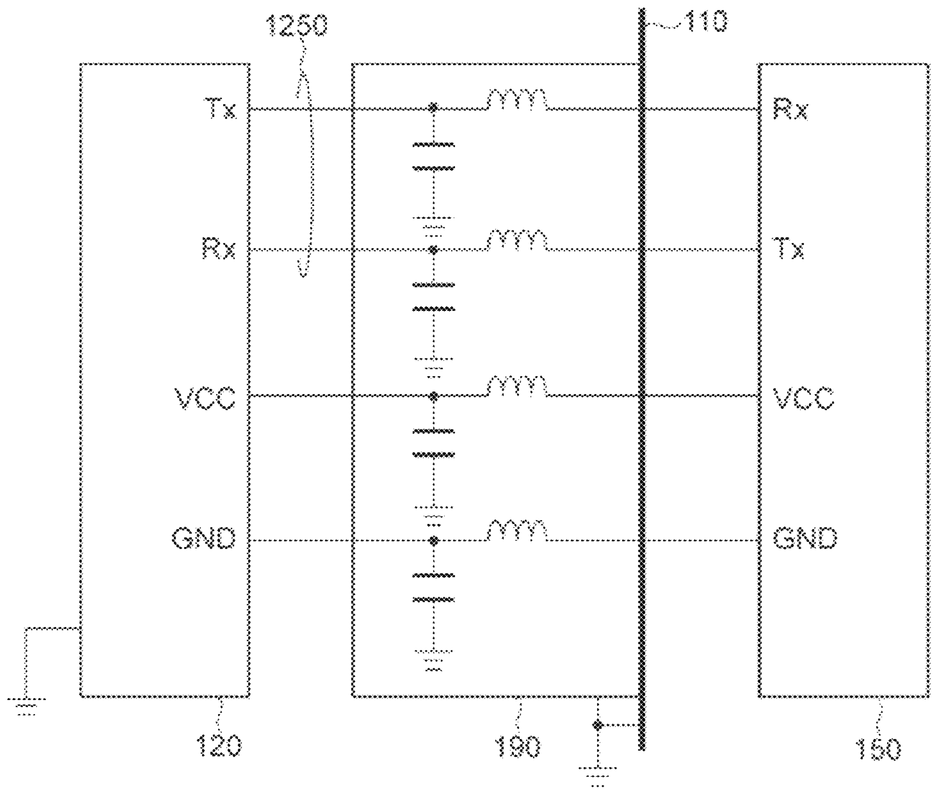
FIG. 15 is a diagram illustrating an RF filter according to one exemplary embodiment.

FIG. 15 is referred. FIG. 15 is a diagram illustrating the RF filter 190 according to one exemplary embodiment. As shown in FIG. 15, the signal line 1250 may include a first signal line electrically connecting a signal output (Tx) of the power transmission unit 120 and a signal input (Rx) of the rectifying and smoothing unit 150, and a second signal line electrically connecting the signal input (Rx) of the power transmission unit 120 and the signal output (Tx) of the rectifying and smoothing unit 150. The signal line 1250 may include a signal line connecting a first reference voltage terminal (VCC) of the power transmission unit 120 and the first reference voltage terminal (VCC) of the rectifying and smoothing unit 150, and a signal line connecting a second reference voltage terminal (GND) of the power transmission unit 120 and the second reference voltage terminal (GND) of the rectifying and smoothing unit 150. The signal line 1250 may be a shielded cable covered with a shield at ground potential. In this connection, a plurality of signal lines constituting the signal line 1250 may be individually covered with a shield or may be collectively covered with a shield. The RF filter 190 provides a low pass filter for each of the plurality of signal lines constituting the signal line 1250. The low pass filter may be an LC filter including an inductor and a capacitor. The inductor of the low pass filter forms a portion of the corresponding signal line. The capacitor is connected between one end of the inductor connected to the power transmission unit 120 and the ground. The RF filter 190 makes it possible to suppress the propagation of high frequency power (high frequency noise) via the signal line 1250 between the rectifying and smoothing unit 150 and the power transmission unit 120.

[Communication Unit of Power Transmission Unit and Communication Unit of Rectifying and Smoothing Unit]

Figure 16:
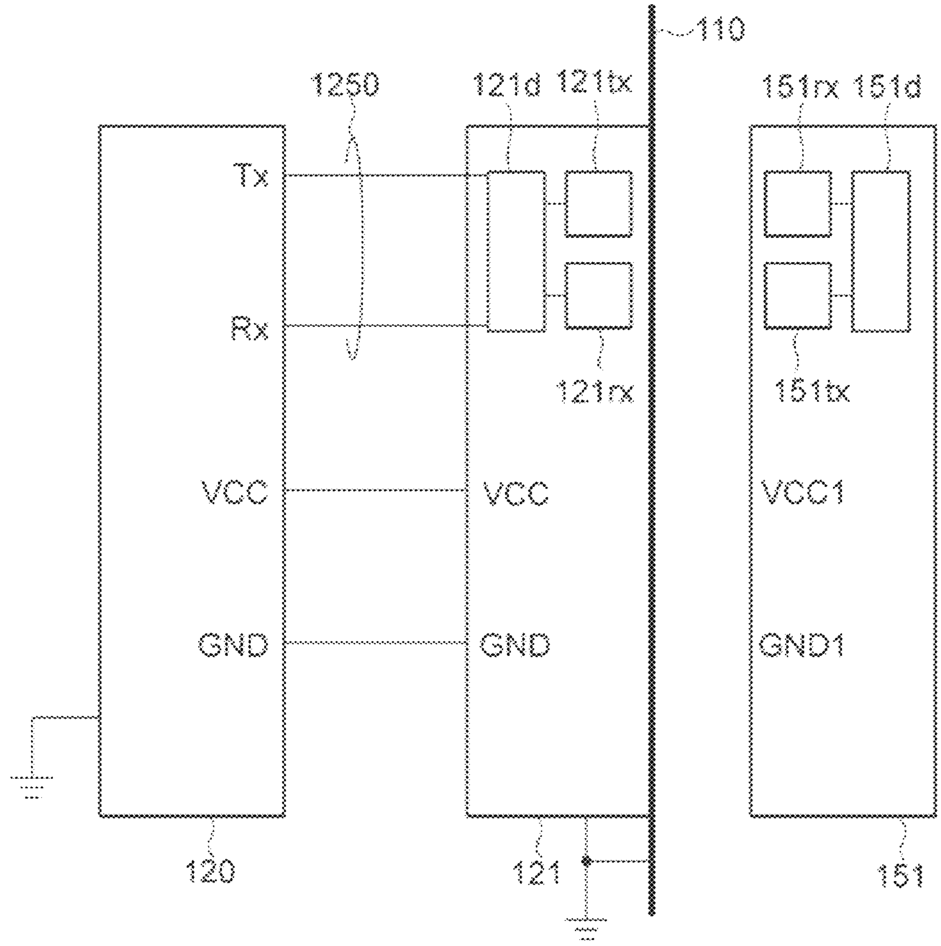
FIG. 16 is a diagram illustrating a communication unit of a power transmission unit and a communication unit of a rectifying and smoothing unit according to one exemplary embodiment.
Figure 17:
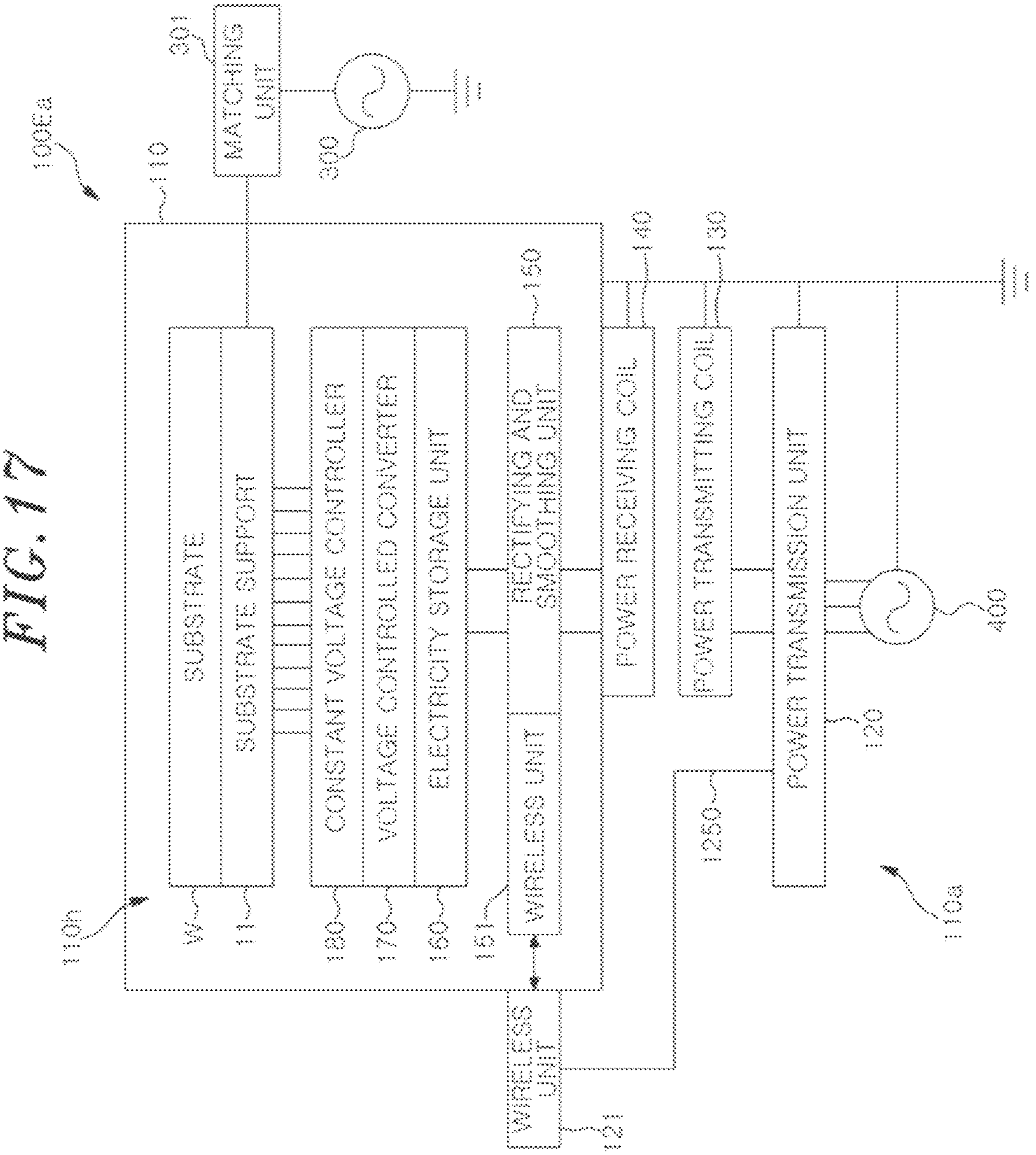
FIG. 17 is a diagram schematically illustrating a plasma processing apparatus according to yet another exemplary embodiment.
Figure 18:
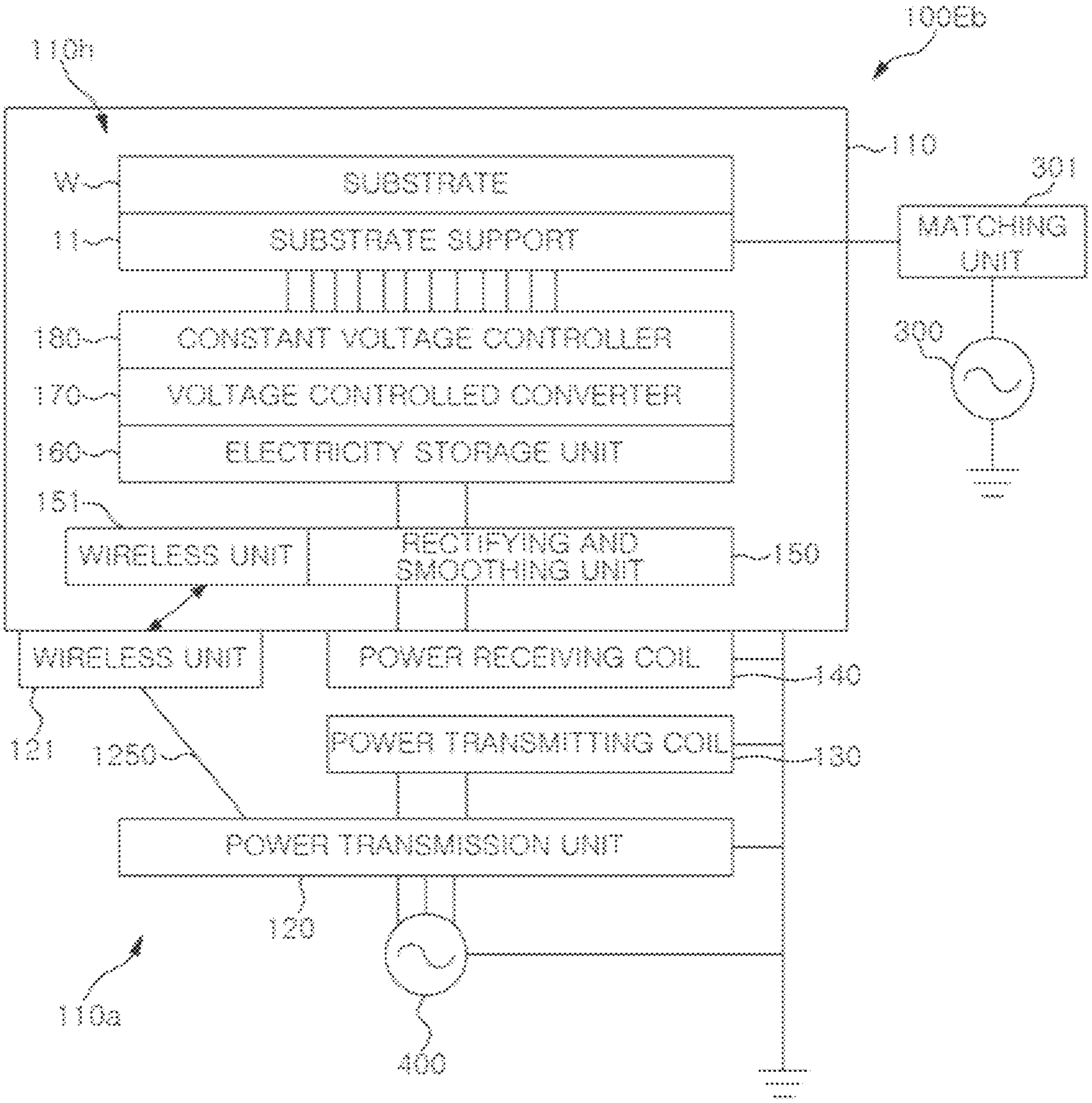
FIG. 18 is a diagram schematically illustrating a plasma processing apparatus according to yet another exemplary embodiment.

FIGS. 16 to 18 are referred. FIG. 16 is a diagram illustrating a communication unit of a power transmission unit and a communication unit of a rectifying and smoothing unit according to one exemplary embodiment. Each of FIGS. 17 and 18 is a diagram schematically illustrating a plasma processing apparatus according to yet another exemplary embodiment. As shown in FIGS. 6, 7, 16, 17, and 18, the communication unit 121 and the communication unit 151 may be configured to transmit signals such as the instruction signal described above between each other via wireless communication. The communication via wireless communication may be performed by optical communication. When the communication unit 121 and the communication unit 151 transmit signals therebetween via wireless communication, the communication unit 121 and the communication unit 151 may be disposed in any location as long as there is no shielding material interposed therebetween. According to the examples shown in these drawings, the RF filter 190 is not required. Further, in various exemplary embodiments including the examples shown in FIGS. 16 to 18, the signal line 1250 may be a shielded cable covered with a shield at ground potential. In this connection, the plurality of signal lines constituting the signal line 1250 may be individually covered with a shield or may be collectively covered with a shield.

Figure 19:
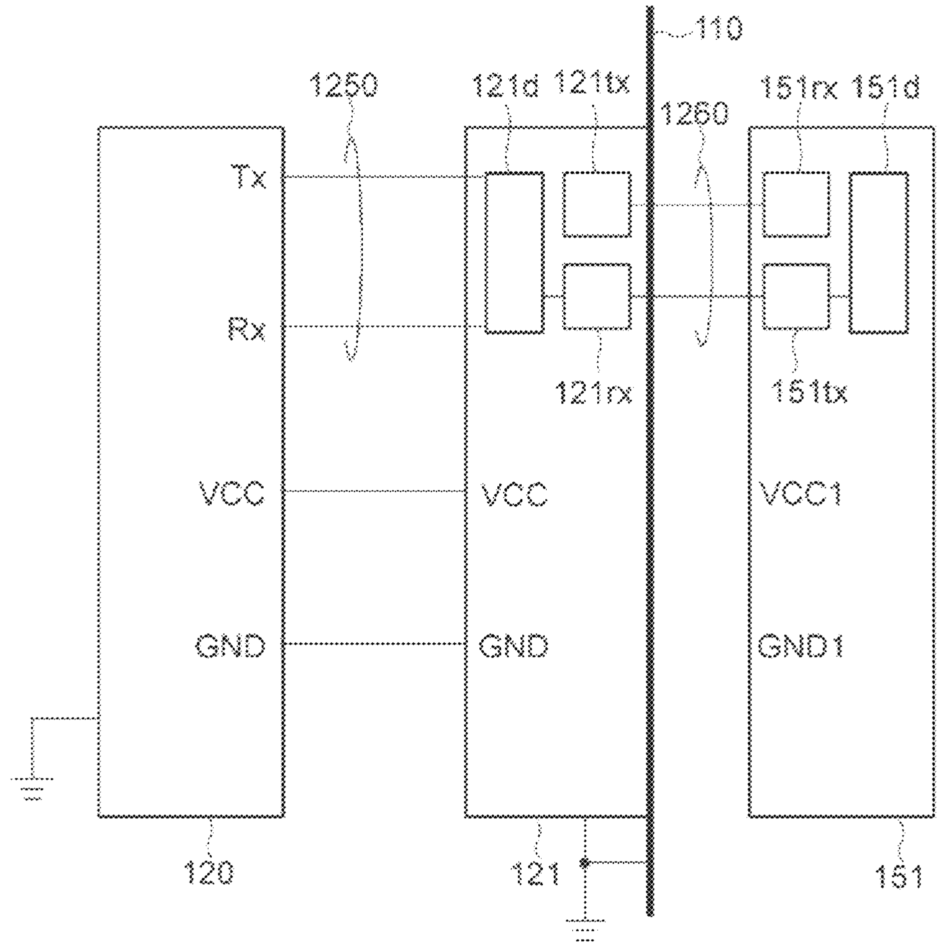
FIG. 19 is a diagram illustrating a communication unit of a power transmission unit and a communication unit of a rectifying and smoothing unit according to another exemplary embodiment.
Figure 20:
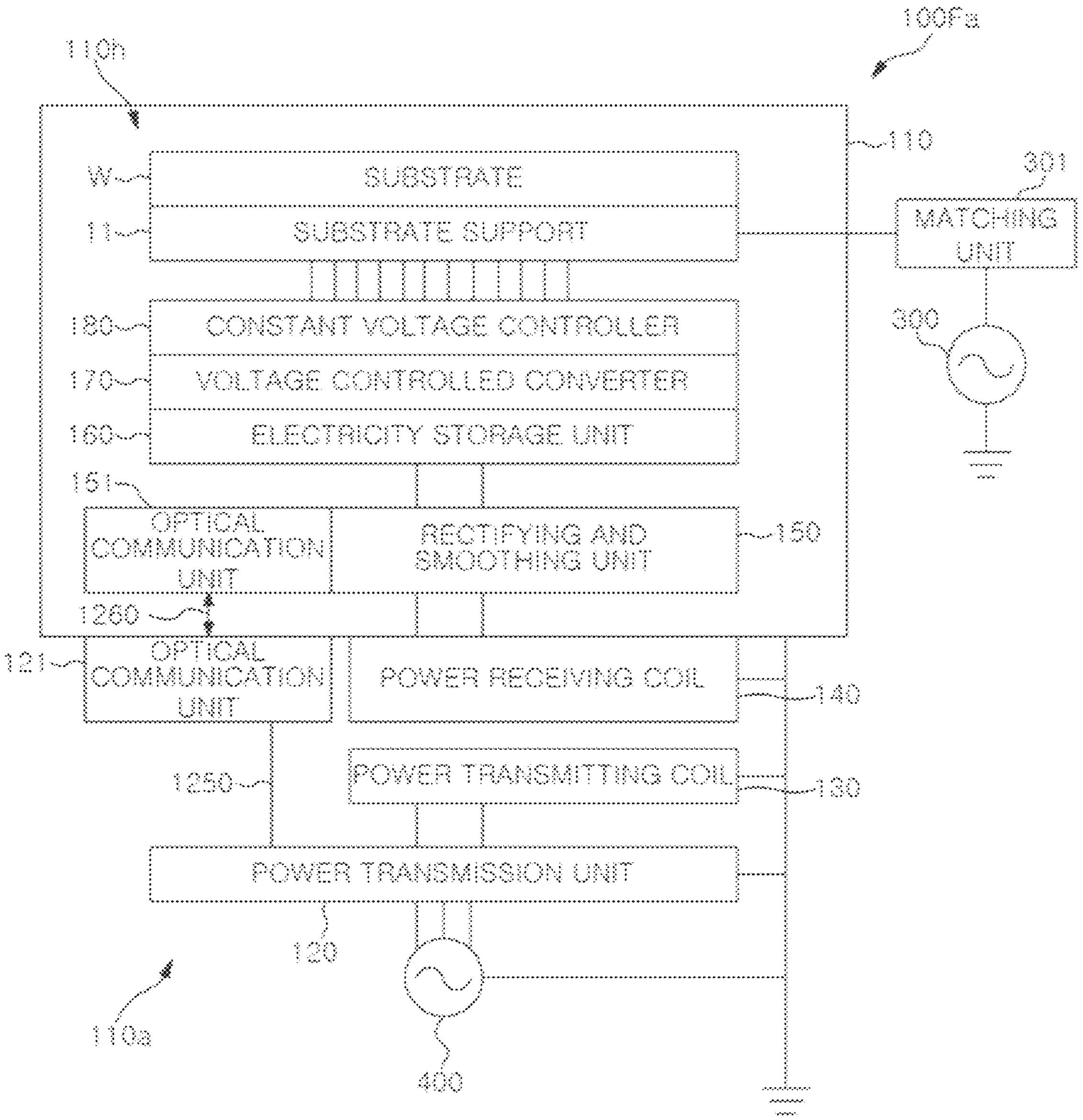
FIG. 20 is a diagram schematically illustrating a plasma processing apparatus according to yet another exemplary embodiment.
Figure 21:
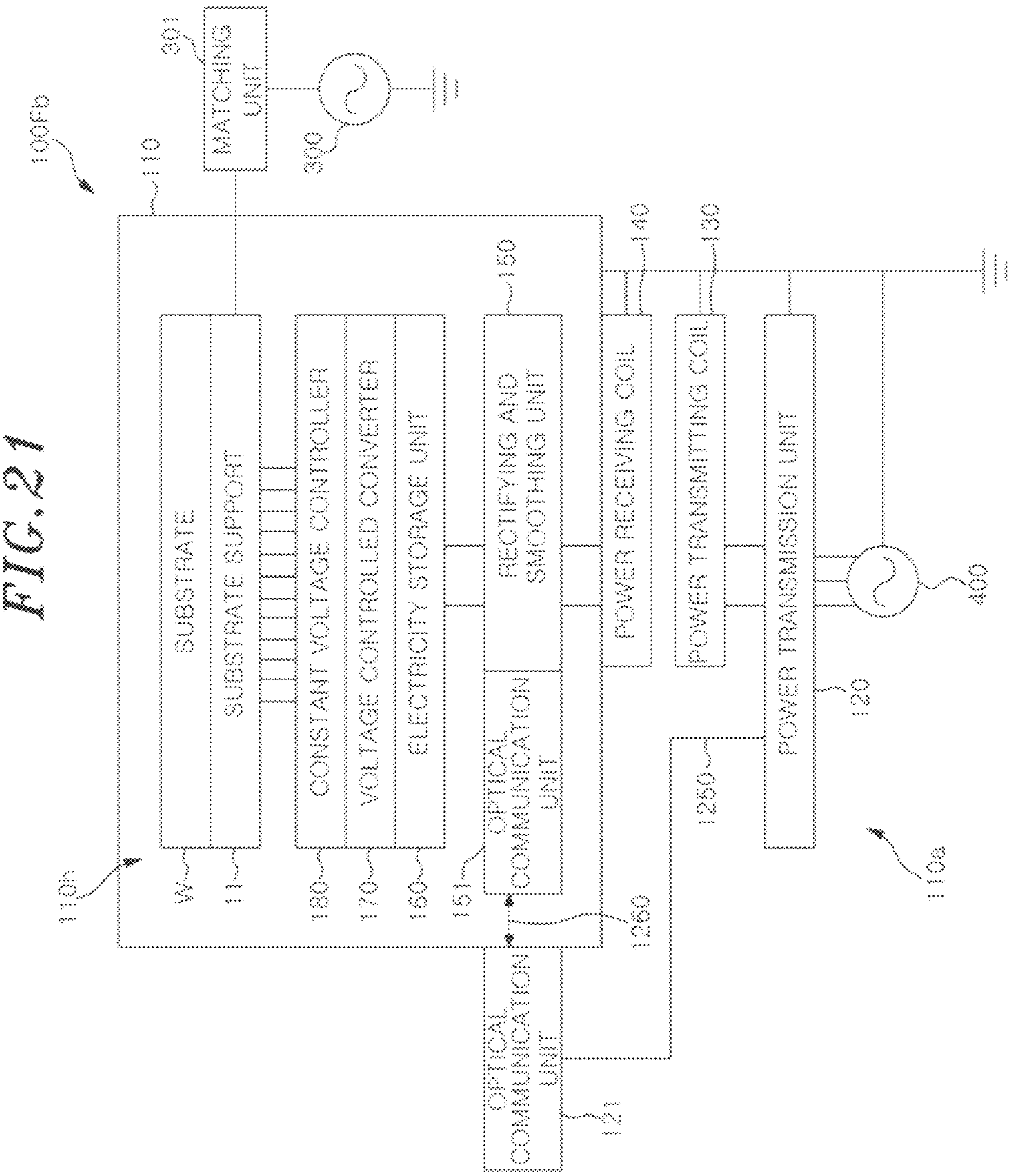
FIG. 21 is a diagram schematically illustrating a plasma processing apparatus according to yet another exemplary embodiment.
Figure 22:
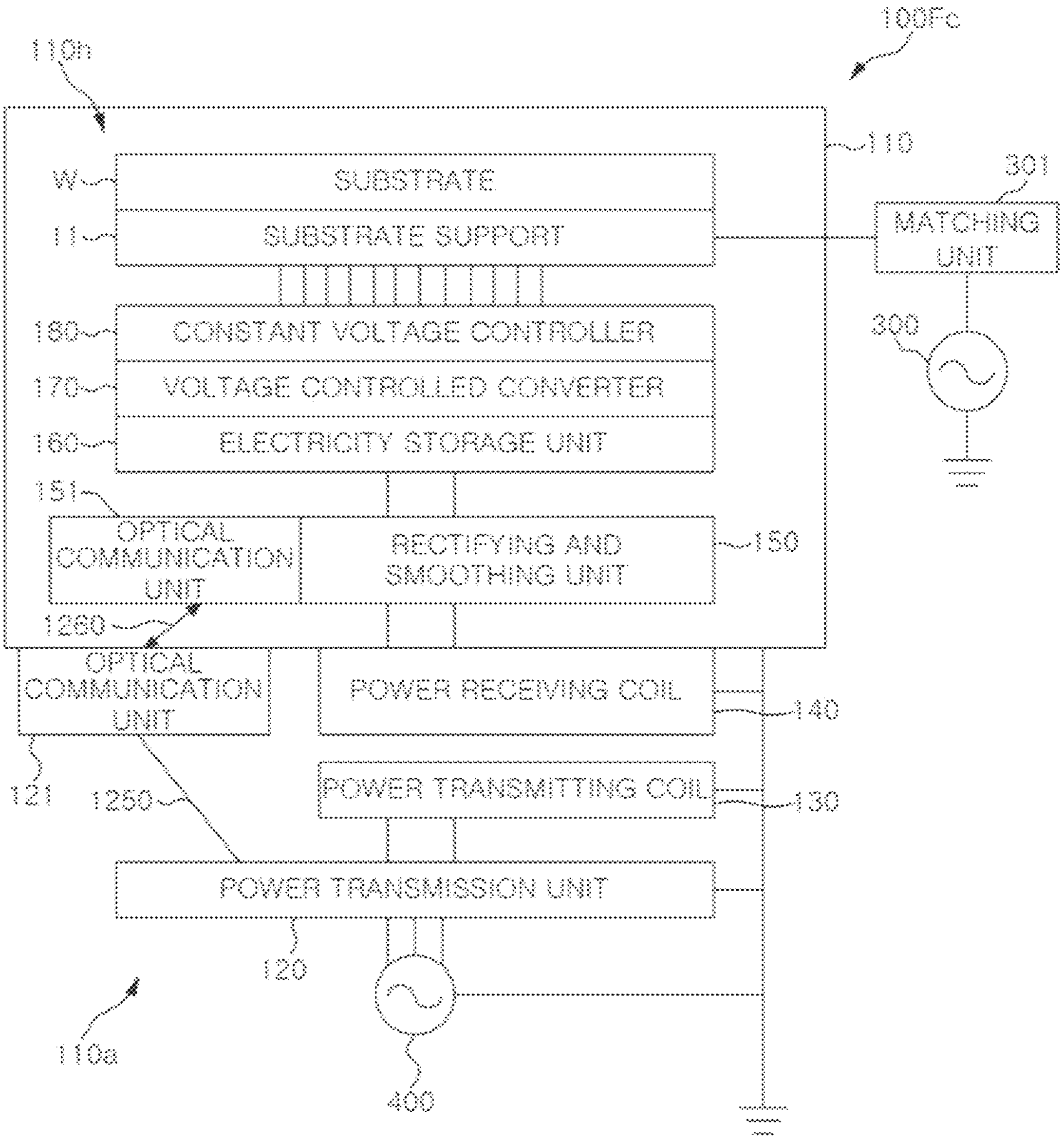
FIG. 22 is a diagram schematically illustrating a plasma processing apparatus according to yet another exemplary embodiment.

FIGS. 19 to 22 are referred. FIG. 19 is a diagram illustrating a communication unit of a power transmission unit and a communication unit of a rectifying and smoothing unit according to another exemplary embodiment. Each of FIGS. 20 to 22 is a diagram schematically illustrating a plasma processing apparatus according to yet another exemplary embodiment. As shown in FIGS. 19 to 22, the communication unit 121 and the communication unit 151 may be configured to transmit signals (optical signals) such as the above-mentioned instruction signal between each other via an optical fiber 1260, that is, by optical fiber communication. When the communication unit 121 and communication unit 151 transmit signals therebetween via the optical fiber 1260, the communication unit 121 and the communication unit 151 may be disposed in any location as long as the bending radius of the optical fiber 1260 falls within the allowable range. Also in the examples shown in these drawings, the RF filter 190 becomes unnecessary.

[Electricity Storage Unit]

FIGS. 23A and 23B are referred. Each of FIGS. 23A and 23B is a diagram illustrating an electricity storage unit according to one exemplary embodiment. As shown in FIG. 23A, the electricity storage unit 160 includes a capacitor 161. The capacitor 161 is connected between the pair of power feeding lines, that is, the positive line 160*p* and the negative line 160*m*. The positive line 160*p* extends from the positive output ($V_{OUT+}$) of the rectifying and smoothing unit 150 toward a load. The negative line 160*m* extends from the negative output ($V_{OUT-}$) of the rectifying and smoothing unit 150 toward the load. The capacitor 161 may be a polarized capacitor. The capacitor 161 may be an electric double layer or lithium ion battery.

As shown in FIG. 23B, the electricity storage unit 160 may include a plurality of capacitors 161. The plurality of capacitors 161 are connected in series between the positive line 160*p* and the negative line 160*m*. The plurality of capacitors 161 may have the same capacitance or may have different capacitances. Each of the plurality of capacitors 161 may be a polarized capacitor. Each of the plurality of capacitors 161 may be an electric double layer or a lithium ion battery. The electricity storage unit 160 needs to be used under conditions in which a total value of the input voltage thereto and the line-to-line potential difference due to normal mode noise is lower than the allowable input voltage. When the electricity storage unit 160 includes the plurality of capacitors 161 connected in series, the allowable input voltage of the electricity storage unit 160 becomes high.

Accordingly, according to the example shown in FIG. 23B, the noise resistance of the electricity storage unit 160 is improved.

[Voltage Controlled Converter]

FIG. 24 is referred. FIG. 24 is a diagram illustrating a voltage control converter according to one exemplary embodiment. The voltage controlled converter 170 is a DC-DC converter. The voltage controlled converter 170 is connected between the electricity storage unit 160 and the constant voltage controller 180. The positive line 160*p* is connected to a positive input ($V_{IN+}$) of the voltage controlled converter 170. The negative line 160*m* is connected to a negative input ($V_{IN-}$) of the voltage controlled converter 170. The positive output ($V_{OUT+}$) of the voltage controlled converter 170 is connected to the positive input ($V_{IN+}$) of the constant voltage controller 180. The negative output ($V_{OUT-}$) of the voltage controlled converter 170 is connected to the negative input ($V_{IN-}$) of the constant voltage controller 180.

The voltage controlled converter 170 may include a controller 172, a low-pass filter 173, a transformer 174, and a capacitor 175. The low-pass filter 173 may include an inductor 1731*a*, a capacitor 1732*a*, and a capacitor 1732*b*. One end of the inductor 1731*a* is connected to the positive input ($V_{IN+}$) of the voltage controlled converter 170. The other end of the inductor 1731*a* is connected to one end of a primary coil of the transformer 174. One end of the capacitor 1732*a* is connected to one end of the inductor 1731*a* and the positive input ($V_{IN+}$) of the voltage controlled converter 170. The other end of the capacitor 1732*a* is connected to the negative input ($V_{IN-}$) of the voltage controlled converter 170. One end of the capacitor 1732*b* is connected to the other end of the inductor 1731*a*. The other end of the capacitor 1732*b* is connected to the negative input ($V_{IN-}$) of the voltage controlled converter 170.

The transformer 174 includes a primary coil 1741, a secondary coil 1742, and a switch 1743. The other end of the primary coil 1741 is connected to the negative input ($V_{IN-}$) of the voltage controlled converter 170 via the switch 1743. One end of the secondary coil 1742 is connected to one end of the capacitor 175 and the positive output ($V_{OUT+}$) of the voltage controlled converter 170. The other end of the secondary coil 1742 is connected to the other end of the capacitor 175 and the negative output ($V_{OUT-}$) of the voltage controlled converter 170.

A driver 1744 is connected to the switch 1743. The driver 1744 opens and closes the switch 1743. When the switch 1743 is closed, that is, when the other end of the primary coil 1741 and the negative input ($V_{IN-}$) are in a conductive state, the other end of the primary coil 1741 is connected to the negative input ($V_{IN-}$) of the voltage controlled converter 170, and DC power from the voltage controlled converter 170 is provided to the constant voltage controller 180. When the switch 1743 is open, that is, when the other end of the primary coil 1741 and the negative input ($V_{IN-}$) are in a non-conductive state, the connection between the other end of the primary coil 1741 and the negative input ($V_{IN-}$) of the voltage controlled converter 170 is cut off, and the supply of DC power from the voltage controlled converter 170 to the constant voltage controller 180 is shut off.

The voltage controlled converter 170 may further include a voltage detector 176*v* and a current detector 176*i*. The voltage detector 176*v* detects a voltage value between both ends of the secondary coil 1742 or the voltage value between the positive output and the negative output of the voltage controlled converter 170. The current detector 176*i* measures a current value between the other end of the secondary coil 1742 and the negative output of the voltage controlled converter 170. The voltage value detected by the voltage detector 176*v* and the current value detected by the current detector 176*i* are notified to the controller 172. The controller 172 may be the same as or different from at least one of the controller 122 or the controller 152.

When the voltage value detected by the voltage detector 176*v* is equal to or higher than the threshold value, the controller 172 controls the driver 1744 to shut off the supply of DC power from the voltage controlled converter 170 to the constant voltage controller 180. The voltage value between the positive output and the negative output of the voltage controlled converter 170 is an added value of the output voltage value of the voltage controlled converter 170 and the line-to-line potential difference due to normal mode noise. In this embodiment, damage to the load of the voltage controlled converter 170 due to an overvoltage caused by the line-to-line potential difference due to normal mode noise may be suppressed.

[Constant Voltage Controller]

FIGS. 25 and 26 are referred. FIGS. 25 and 26 are diagrams illustrating a constant voltage controller according to some exemplary embodiments. The constant voltage controller 180 is connected between the electricity storage unit 160 and at least one power consuming member 240, and is configured to control the application of voltage (application of DC voltage) to at least one power consuming member 240 and the stopping of the application.

The constant voltage controller 180 includes a controller 182 and at least one switch 183. The positive input ($V_{IN+}$) of the constant voltage controller 180 is connected to the power consuming member 240 via the switch 183. The negative input ($V_{IN-}$) of the constant voltage controller 180 is connected to the power consuming member 240. The switch 183 is controlled by the controller 182. When the switch 183 is closed, the DC voltage from the constant voltage controller 180 is applied to the power consuming member 240. When the switch 183 is open, the application of DC voltage from the constant voltage controller 180 to the power consuming member 240 is stopped. Further, the controller 182 may be the same as or different from at least one of the controller 122, the controller 152, or the controller 172.

In the embodiment shown in FIGS. 25 and 26, the plasma processing apparatus includes a plurality of power consuming members 240. The constant voltage controller 180 includes the controller 182 and a plurality of switches 183. The positive input ($V_{IN+}$) of the constant voltage controller 180 is connected to the plurality of power consuming members 240 via the plurality of switches 183. The negative input ($V_{IN-}$) of the constant voltage controller 180 is connected to the plurality of power consuming members 240.

In the embodiment shown in FIGS. 25 and 26, the plurality of power consuming members 240 may include a plurality of heaters (resistive heating elements). The plurality of heaters may be provided within the substrate support 11. In the embodiment shown in FIG. 25, a plurality of resistors 260 are disposed adjacent to each of the plurality of heaters. Each of the plurality of resistors 260 has a resistance value that changes with temperature. Each of the plurality of resistors 260 is, for example, a thermistor. Each of the plurality of resistors 260 is connected in series with a reference resistor (not shown). The constant voltage controller 180 includes a plurality of measuring units 184. Each of the plurality of measuring units 184 applies a reference voltage to a series connection of a corresponding resistor among the plurality of resistors 260 and the reference resistor, and detects the voltage value between both ends of the resistor. Each of the plurality of measuring units 184 notifies the controller 182 of the detected voltage value. The controller 182 specifies the temperature of an area in which the corresponding heater among the plurality of heaters is disposed from the notified voltage value, and controls the application of DC voltage to the corresponding heater so as to bring the temperature of the area closer to the target temperature. Further, instead of the plurality of resistors 260, an optical fiber thermometer may be disposed. In this connection, wiring between the plurality of resistors 260 and the plurality of measuring units 184 is not required, so the influence of high frequency conductive noise on the power consuming member 240 may be eliminated.

In the embodiment shown in FIG. 26, the constant voltage controller 180 includes a voltage detector 185*v* and a plurality of current detectors 185*i*. The voltage detector 185*v* detects the voltage value applied to each of the plurality of heaters. The plurality of current detectors 185*i* measure the value of the current supplied to the corresponding one of the plurality of heaters, that is, the current value. The plurality of measuring units 184 specifies the resistance value of the corresponding one of the plurality of heaters from the current value detected by the corresponding one of the plurality of current detectors 185*i* and the voltage value detected by the voltage detector 185*v*. The controller 182 specifies the temperature of each of a plurality of areas in which each of the plurality of heaters are disposed, based on the detected resistance value of each of the plurality of heaters. The controller 182 controls the application of DC voltage to each of the plurality of heaters so that the temperature of each of the plurality of areas approaches the target temperature.

Example Embodiment Regarding Integration of Power Transmitting Coil Unit and Power Receiving Coil Unit Hereinafter, FIGS. 27 and 28 are referred. FIG. 27 is a diagram illustrating a power transmitting coil unit and a power receiving coil unit according to another exemplary embodiment. FIG. 28 is a diagram illustrating a power transmitting coil unit and a power receiving coil unit according to yet another exemplary embodiment. Each of FIGS. 27 and 28 shows the power transmitting coil unit and the power receiving coil unit in a partially broken state.

As shown in FIGS. 27 and 28, the power transmitting coil unit 130 and the power receiving coil unit 140 may be integrated together. The power transmitting coil 131 of the power transmitting coil unit 130 and the power receiving coil 141 of the power receiving coil unit 140 may be disposed within a shielded space provided by at least one metal case. The at least one metal case is grounded and electromagnetically shields the shielded space from an outside space. At least one ferrite material is provided within the shielded space. The at least one ferrite material closes a space that accommodates the power transmitting coil 131 and the power receiving coil 141.

Hereinafter, the embodiment shown in FIG. 27 will be described in detail. In the embodiment shown in FIG. 27, two metal cases are used as the at least one metal case. That is, the metal casing 130*g* (first metal case) of the power transmitting coil unit 130 and the metal case 140*g* (second metal case) of the power receiving coil unit 140 are used.

The metal case 130*g* is grounded. The metal case 130*g* defines a shielded space 130*s*, and accommodates the power transmitting coil 131 within the shielded space 130*s*. The metal case 130*g* extends on a back surface side of the power transmitting coil 131 relative to the power receiving coil 141, and surrounds the outer periphery of the power transmitting coil 131.

The metal case 130*g* includes a back surface wall 130*gb* and a side wall 130*gs*. The back surface wall 130*gb* and the side wall 130*gs* define the shielded space 130*s*. The back surface wall 130*gb* has a generally flat plate shape and extends on the back surface side of the power transmitting coil 131 relative to the power receiving coil 141. The side wall 130*gs* has a tubular shape, such as a rectangular tube shape or a cylindrical tube shape, and extends from the back surface wall 130*gb* toward the power receiving coil unit 140. The side wall 130*gs* surrounds the outer periphery of the power transmitting coil 131.

The metal case 140*g* is grounded. The metal case 140*g* defines a shielded space 140*s*, and accommodates the power receiving coil 141 within the shielded space 140*s*. The metal case 140*g* extends on the back surface side of the power receiving coil 141 relative to the power transmitting coil 131, and surrounds the outer periphery of the power receiving coil 141.

The metal case 140*g* includes a back surface wall 140*gb* and a side wall 140*gs*. The back surface wall 140*gb* and the side wall 140*gs* define the shielded space 140*s*. The back surface wall 140*gb* has a generally flat plate shape and extends on the back surface side of the power receiving coil 141 relative to the power transmitting coil 131. The side wall 140*gs* has a tubular shape, such as a rectangular tube shape or a cylindrical tube shape, and extends from the back surface wall 140*gb* toward the power transmitting coil unit 130. The side wall 140*gs* surrounds the outer periphery of the power receiving coil 141.

The metal cases 130*g* and 140*g* are disposed so that the tips of their side walls face each other, and an insulating plate 34*i* is sandwiched between the tips of their side walls. That is, the shielded spaces 130*s* and 140*s* are separated by the insulating plate 34*i*. The insulating plate 34*i* is formed from a resin such as PEEK (polyether ether ketone) or PPS (polyphenylene sulfide).

The sidewall 130*gs* includes a flange 130*gf*, and the sidewall 140*gs* includes a flange 140*gf*. The metal cases 130*g* and 140*g* are positioned and fixed to each other by a positioning pins 34*p* with the flanges 130*gf* and 140*gf* facing or abutting each other and electrically conductive. This allows the coil axes of the power transmitting coil 131 and the power receiving coil 141 to coincide with each other, and mechanically ensures the parallelism of the power transmitting coil 131 and the power receiving coil 141. Accordingly, it is possible to provide a technique that enables improvement in the efficiency of power transmission between the power transmitting coil 131 and the power receiving coil 141.

Within the shielded space 130*s* and between the back surface wall 130*gb* and the power transmitting coil 131, the heat sink 134, a back surface portion 1351 (first part) of the ferrite material 135, and the thermally conductive sheet 136 are disposed in this order. The ferrite material 135 is disposed within the shielded space 130*s* and defines a closed space 135*s* with the insulating plate 34*i*. The power transmitting coil 131 is disposed within the space 135*s*.

The back surface portion 1351 of the ferrite material 135 has a generally flat plate shape and extends on the back surface side of the power transmitting coil 131. The ferrite material 135 further includes a side wall portion 1353 (third part). The side wall portion 1353 has a tubular shape such as a rectangular tube shape or a cylindrical tube shape, and extends from the back surface portion 1351 to the insulating plate 34*i*. The side wall portion 1353 surrounds the outer periphery of the power transmitting coil 131. A thermally conductive sheet 137 may be disposed between the side wall portion 1353 and the power transmitting coil 131 so as to surround the outer periphery of the power transmitting coil 131. A tip of the side wall portion 1353 and a tip of a side wall portion 1454 described later face each other with the insulating plate 34*i* interposed therebetween. In addition, the back surface portion 1351 and the side wall portion 1353 may be configured of a single member, or the back surface portion 1351 and the side wall portion 1353 may each be configured of separate members.

Within the shielded space 140*s* and between the back surface wall 140*gb* and the power receiving coil 141, the spacer 143, the heat sink 144, the back surface portion 1452 (second part) of the ferrite material 145, and the thermally conductive sheet 146 are disposed in this order. The ferrite material 145 is disposed within the shielded space 140*s* and defines a closed space 145*s* with the insulating plate 34*i*. The power receiving coil 141 is disposed within the space 145*s*.

The back surface portion 1452 of the ferrite material 145 has a generally flat plate shape and extends on the back surface side of the power receiving coil 141. The ferrite material 145 further includes the side wall portion 1454 (fourth part). The side wall portion 1454 has a tubular shape, such as a rectangular tube shape or a cylindrical tube shape, and extends from the back surface portion 1452 to the insulating plate 34*i*. The side wall portion 1454 surrounds the outer periphery of the power receiving coil 141. A thermally conductive sheet 147 may be disposed between the side wall portion 1454 and the power receiving coil 141 so as to surround the outer periphery of the power receiving coil 141. A tip of the side wall portion 1454 and a tip of the side wall portion 1353 face each other with the insulating plate 34*i* interposed therebetween. In addition, the back surface portion 1452 and the side wall portion 1454 may be configured of a single member, or the back surface portion 1452 and the side wall portion 1454 may each be configured of separate members.

The power transmitting coil unit 130 may further include a fan 130*f*. The fan 130*f* may be a blower fan or an exhaust fan. The fan 130*f* is disposed along the metal case 130*g* on an outer side of the metal case 130*g*. In the example of FIG. 27, the fan 130*f* is disposed along the side wall 130*gs*. The fan 130*f* generates an airflow that passes from the outside of the metal case 130*g* through a plurality of ventilation holes 130*gh* and the shielded space 130*s* to the outside of the metal case 130*g*. In the example of FIG. 27, the plurality of ventilation holes 130*gh* are formed in the side wall 130*gs*.

The power receiving coil unit 140 may further include a fan 140*f*. The fan 140*f* may be a blower fan or an exhaust fan. The fan 140*f* is disposed along the metal case 140*g* on an outer side of the metal case 140*g*. In the example of FIG. 27, the fan 140*f* is disposed along the side wall 140*gs*. The fan 140*f* generates an airflow that passes from the outside of the metal case 140*g* through a plurality of ventilation holes 140*gh* and the shielded space 140*s* to the outside of the metal case 140*g*. In the example of FIG. 27, the plurality of ventilation holes 140*gh* are formed in the side wall 140*gs*.

In the power transmitting coil unit 130 and the power receiving coil unit 140 shown in FIG. 27, the metal cases 130*g* and 140*g* suppress leakage of high frequency noise to the outside. Moreover, it is possible to prevent foreign matter from entering the inside of each of the power transmitting coil unit 130 and the power receiving coil unit 140.

Furthermore, the ferrite material 135 and the ferrite material 145 suppress leakage of magnetic flux. Accordingly, high power feeding efficiency between the power transmitting coil 131 and the power receiving coil 141 may be obtained without increasing the number of turns of each of the power transmitting coil 131 and the power receiving coil 141. Accordingly, the resistance value of each of the power transmitting coil 131 and the power receiving coil 141 may be reduced. Moreover, each of the power transmitting coil 131 and the power receiving coil 141 may be made smaller.

Furthermore, each of the ferrite material 135 and the ferrite material 145 has a side wall portion, and thus has a relatively large volume. Accordingly, even when each of the ferrite materials 135 and 145 generates heat due to conductive noise, the temperature rise is small. Additionally, each of the ferrite materials 135 and 145 has a relatively large volume and therefore a relatively large inductance. The relatively large inductance of each of the ferrite materials 135 and 145 and the small resistance of each of the power transmitting coil 131 and the power receiving coil 141 result in a high Q value of each of the power transmitting coil 131 and the power receiving coil 141. Accordingly, high efficiency of power transmission between the power transmitting coil 131 and the power receiving coil 141 is ensured.

Further, each of the ferrite material 135 and the ferrite material 145 may be made of manganese zinc based ferrite, nickel zinc based ferrite, or a nanocrystalline soft magnetic material. In this connection, when the transmission frequency is 1 MHz or less, a high trapping effect of the magnetic flux may be obtained at the transmission frequency due to the high magnetic permeability, and conductive noise may be efficiently converted into heat.

Hereinafter, the embodiment shown in FIG. 28 will be described in detail. In the embodiment shown in FIG. 28, a single metal case 340*g* is used as the at least one metal case.

The metal case 340*g* is grounded. The metal case 340*g* defines a shielded space 340*s*, and accommodates the power transmitting coil 131 and the power receiving coil 141 within the shielded space 340*s*.

The metal case 340*g* includes a first back surface wall 340*g*1, a second back surface wall 340*g*2, and a side wall 340*g*3. The first back surface wall 340*g*1, the second back surface wall 340*g*2, and the side wall 340*g*3 define the shielded space 340*s*. The first back surface wall 340*g*1 has a generally flat plate shape and extends on the back surface side of the power transmitting coil 131 relative to the power receiving coil 141. The second back surface wall 340*g*2 has a generally flat plate shape and extends on the back surface side of the power receiving coil 141 relative to the power transmitting coil 131. The side wall 130*gs* has a tubular shape, such as a rectangular or cylindrical tube shape, and extends from the first back surface wall 340*g*1 to the second back surface wall 340*g*2. The side wall 130*gs* surrounds the outer periphery of the power transmitting coil 131 and the outer periphery of the power receiving coil 141.

Within the shielded space 340*s* and between the first back surface wall 340*g*1 and the power transmitting coil 131, the heat sink 134, a back surface portion 3451 (first part) of the ferrite material 345, and the thermally conductive sheet 136 are disposed in this order. The back surface portion 3451 has a generally flat plate shape and extends on the back surface side of the power transmitting coil 131.

Additionally, within the shielded space 340*s* and between the second back surface wall 340*g*2 and the power receiving coil 141, the spacer 143, the heat sink 144, a back surface portion 3452 (second part) of the ferrite material 345, and the thermally conductive sheet 146 are disposed in this order. The back surface portion 3452 has a generally flat plate shape and extends on the back surface side of the power receiving coil 141.

The ferrite material 345 is disposed within the shielded space 340*s* and defines a closed space 345*s*. The power transmitting coil 131 and the power receiving coil 141 are disposed within the space 345*s*.

The ferrite material 345 further includes a side wall portion 3453 (third part). The side wall portion 3453 has a tubular shape such as a rectangular tube shape or a cylindrical tube shape, and extends from the back surface portion 3451 to the back surface portion 3452. The side wall portion 3453 surrounds the outer periphery of the power transmitting coil 131 and the outer periphery of the power receiving coil 141. A thermally conductive sheet 347 may be disposed between each of the power transmitting coil 131 and the power receiving coil 141 and the side wall portion 3453 so as to surround the outer periphery of the power transmitting coil 131 and the outer periphery of the power receiving coil 141. In addition, the back surface portion 3451, the back surface portion 3452, and the side wall portion 3453 may be configured of a single member. Alternatively, the back surface portion 3451, the back surface portion 3452, and the side wall portion 3453 may each be configured of separate members.

In addition, the fan 340*f* may be disposed along the metal case 340*g* on an outer side of the metal case 340*g*. The fan 340*f* may be a blower fan or an exhaust fan. In the example of FIG. 28, the fan 340*f* is disposed along the side wall 340*g*3. The fan 340*f* generates an airflow that passes from the outside of the metal case 340*g* through a plurality of ventilation holes 340*g*h and the shielded space 340*s* of the metal case 340*g* to the outside of the metal case 340*g*. In the example of FIG. 28, the plurality of ventilation holes 340*gh* are formed in the side wall 340*g*3.

In the power transmitting coil unit 130 and the power receiving coil unit 140 shown in FIG. 28, the metal case 340*g* suppresses leakage of high frequency noise to the outside. Moreover, it is possible to prevent foreign matter from entering the inside of each of the power transmitting coil unit 130 and the power receiving coil unit 140.

Furthermore, the ferrite material 345 suppresses leakage of magnetic flux. Accordingly, high power feeding efficiency between the power transmitting coil 131 and the power receiving coil 141 may be obtained without increasing the number of turns of each of the power transmitting coil 131 and the power receiving coil 141. Accordingly, the resistance value of each of the power transmitting coil 131 and the power receiving coil 141 may be reduced. Moreover, each of the power transmitting coil 131 and the power receiving coil 141 may be made smaller.

Furthermore, the ferrite material 345 has a side wall portion, and thus has a relatively large volume. Accordingly, even when the ferrite material 345 generates heat due to conductive noise, the temperature rise is small. Additionally, the ferrite material 345 has a relatively large volume and therefore a relatively large inductance. The relatively large inductance of the ferrite material 345 and the small resistance of each of the power transmitting coil 131 and the power receiving coil 141 result in a high Q value for each of the power transmitting coil 131 and the power receiving coil 141. Accordingly, high efficiency of power transmission between the power transmitting coil 131 and the power receiving coil 141 is ensured.

Further, the ferrite material 345 may be made of manganese zinc ferrite, nickel zinc ferrite, or a nanocrystalline soft magnetic material. In this connection, when the transmission frequency is 1 MHz or less, a high trapping effect of the magnetic flux may be obtained at the transmission frequency due to the high magnetic permeability, and conductive noise may be efficiently converted into heat.

Exemplary Embodiment Regarding Alignment of Power Transmitting Coil Unit and Power Receiving Coil Unit Hereinafter, FIG. 29 is referred. FIG. 29 is a diagram illustrating a power transmitting coil unit and a power receiving coil unit according to yet another exemplary embodiment. FIG. 29 shows the power transmitting coil unit and the power receiving coil unit in a partially broken state. Hereinafter, the power transmitting coil unit and the power receiving coil unit shown in FIG. 29 will be described from the viewpoint of differences from the power transmitting coil unit and the power receiving coil unit shown in FIG. 11. In the following description, each of the power transmitting coil 131 in the power transmitting coil unit 130 and the power receiving coil 141 in the power receiving coil unit 140 may be referred to as a "coil."

In the embodiment shown in FIG. 29, each of the power transmitting coil unit 130 and the power receiving coil unit 140 has a mechanism for positioning the coil within its metal case. In the embodiment shown in FIG. 29, the location of the coil within the metal case is determined and fixed by a positioning mechanism. Further, the relative location relationship between the power transmitting coil 131 and the power receiving coil 141 is fixed by fixing the metal cases of the power transmitting coil unit 130 and the power receiving coil unit 140 to each other by a fixing mechanism. This allows the relative location relationship between the power transmitting coil 131 and the power receiving coil 141 to be determined with high precision. As a result, it is possible to suppress variations in power feeding efficiency and obtain high power feeding efficiency.

As shown in FIG. 29, in the power transmitting coil unit 130, the metal case 130*g* includes the above-mentioned back surface wall 130*gb* and the side wall 130*gs*, similar to the metal case 130*g* shown in FIG. 27. The opening at the tip of the side wall 130*gs* is closed by an insulating plate 130*i*. The insulating plate 130*i* is formed from a resin such as PEEK or PPS. In addition, when the power transmitting coil unit 130 and the power receiving coil unit 140 are configured not to be detached, the insulating plate 130*i* does not need to be provided.

The power transmitting coil unit 130 may include a spacer 133 as a positioning mechanism for the power transmitting coil 131. The spacer 133 is disposed on a flat inner wall surface of the back surface wall 130*gb*. In the power transmitting coil unit 130, the power transmitting coil 131 is disposed on the spacer 133 with the heat sink 134, the ferrite material 135, and the thermally conductive sheet 136 interposed therebetween, thereby determining the location of the power transmitting coil 131. In a specific example, the power transmitting coil 131 is disposed on the spacer 133, and thereby disposed parallel to the back surface wall 130*gb* within the metal case 130*g*. In addition, the end faces of the power transmitting coil 131 are aligned with the end faces of each of the spacer 133, the heat sink 134, the ferrite material 135, and the thermally conductive sheet 136, and are fixed to one another by adhesion or the like, so that the location of the power transmitting coil 131 within the metal case 130*g* is determined and fixed.

Further, in the power receiving coil unit 140, the metal case 140*g* includes the above-mentioned back surface wall

140*gb* and the side wall 140*gs*, similar to the metal case 140*g* shown in FIG. 27. The opening at the tip of the side wall 140*gs* is closed by the insulating plate 140*i*. The insulating plate 140*i* is made of a resin such as PEEK or PPS. In addition, when the power transmitting coil unit 130 and the power receiving coil unit 140 are configured not to be detached, the insulating plate 140*i* does not need to be provided.

The power receiving coil unit 140 may include the spacer 143 as a positioning mechanism for the power receiving coil 141. The spacer 143 is disposed on the flat inner wall surface of the back surface wall 140*gb*. In the power receiving coil unit 140, the power receiving coil 141 is disposed on the spacer 143 with the heat sink 144, the ferrite material 145, and the thermally conductive sheet 146 interposed therebetween, thereby determining the location of the power receiving coil 141. In a specific example, the power receiving coil 141 is disposed on the spacer 143, and thereby disposed parallel to the back surface wall 140*gb* within the metal case 140*g*. In addition, the end faces of the power receiving coil 141 are aligned with the end faces of the spacer 143, the heat sink 144, the ferrite material 145, and the thermally conductive sheet 146, and are fixed to one another by adhesion or the like, so that the location of the power receiving coil 141 within the metal case 140*g* is determined and fixed.

The side wall 130*gs* of the metal case 130*g* and the side wall 140*gs* of the metal case 140*g* are fixed to each other by a fixing mechanism. The fixing mechanism may include the insulating member 340*i*. The insulating member 340*i* may be made of a resin such as PEEK or PPS. The insulating member 340*i* is disposed along the outer wall surface of the side wall 130*gs* of the metal case 130*g* and the outer wall surface of the side wall 140*gs* of the metal case 140*g*. The insulating member 340*i* has a plate, curved surface, or tubular shape so as to be sandwiched with the shape of the outer wall surface of the side wall 130*gs* of the metal case 130*g* and the outer wall surface of the side wall 140*gs* of the metal case 140*g*. The insulating member 340*i* is fixed to the side wall 130*gs* of the metal case 130*g* and the side wall 140*gs* of the metal case 140*g* by fasteners such as screws. As a result, the relative location relationship between the power transmitting coil 131 and the power receiving coil 141 is fixed.

As shown in FIG. 29, the power transmitting coil unit 130 may include a sensor 130*ps*, and the power receiving coil unit 140 may include a sensor 140*ps*. The sensor 130*ps* is disposed within the metal case 130*g*, and the sensor 140*ps* is disposed within the metal case 140*g*. Each of the sensors 130*ps* and 140*ps* is a non-contact sensor including an infrared sensor and/or a distance measuring sensor. The relative location relationship between the power transmitting coil 131 and the power receiving coil 141 may be adjusted using the sensors 130*ps* and 140*ps*. Further, the power transmitting coil unit 130 does not necessarily have to include the sensor 130*ps*, and the power receiving coil unit 140 does not necessarily have to include the sensor 140*ps*.

Exemplary Embodiment Regarding Countermeasures Against Conductive Noise Using Ferrite Material in Power Transmitting Coil Unit and Power Receiving Coil Unit Hereinafter, reference will be made to FIGS. 30A, 30B, 31A, 31B, 32A, 32B, 33A, and 33B. FIG. 30A is a cross-sectional view of a coil unit according to one exemplary embodiment, and FIG. 30B is a plan view of a plurality of ferrite materials provided between a base plate and a thermally conductive sheet in the coil unit shown in FIG. 30A. FIG. 30A shows a cross section of the coil unit taken along line XXXA-XXXA shown in FIG. 30B. FIG. 31A is a cross-sectional view of a coil unit according to another exemplary embodiment, and FIG. 31B is a plan view of a plurality of ferrite materials provided between a base plate and a thermally conductive sheet in the coil unit shown in FIG. 31A. FIG. 31A shows a cross section of the coil unit taken along line XXXIA-XXXIA shown in FIG. 31B. FIG. 32A is a cross-sectional view of a coil unit according to yet another exemplary embodiment, and FIG. 32B is a plan view of a plurality of ferrite materials provided between a base plate and a thermally conductive sheet in the coil unit shown in FIG. 32A. FIG. 32A shows a cross section of the coil unit taken along line XXXIIA-XXXIIA shown in FIG. 32B. FIG. 33A is a cross-sectional view of a coil unit according to yet another exemplary embodiment, and FIG. 33B is a plan view of a plurality of ferrite materials provided between a base plate and a thermally conductive sheet in the coil unit shown in FIG. 33A. FIG. 33A shows a cross section of the coil unit taken along line XXXIIIA-XXXIIIA shown in FIG. 33B. The configuration of a coil unit 500 shown in these drawings may be adopted as a configuration in which at least one of the power transmitting coil unit 130 and the power receiving coil unit 140 is disposed within the metal case.

The coil unit 500 includes a coil 501, a spacer 503, a base plate 508, a plurality of ferrite materials 505, and a thermally conductive sheet 506. The coil 501 is used as the power transmitting coil 131 in the power transmitting coil unit 130 and as the power receiving coil 141 in the power receiving coil unit 140. The spacer 503 supports the base plate 508. The base plate 508 is, for example, a glass epoxy substrate. The plurality of ferrite materials 505 are provided between the base plate 508 and the coil 501. The thermally conductive sheet 506 is provided between each of the plurality of ferrite materials 505 and the coil 501. The coil unit 500 provides a hole 500*h* for leading a lead wire from the coil 501 to a space below the base plate 508.

In the embodiment shown in FIGS. 30A and 30B, the plurality of ferrite materials 505 form a single stage and are arranged along one direction perpendicular to the main surface of the base plate 508. The plurality of ferrite materials 505 are disposed so as to avoid the holes 500*h*. In the embodiment shown in FIGS. 30A and 30B, the coil unit 500 further includes an inner ferrite material 507. The inner ferrite material 507 is disposed inside the coil 501.

In the embodiment shown in FIGS. 31A and 31B, the plurality of ferrite materials 505 form two stages. The plurality of ferrite materials 505 may form three or more stages. In each stage, the plurality of ferrite materials 505 are arranged along one direction perpendicular to the main surface of the base plate 508. The plurality of ferrite materials 505 are disposed so as to avoid the holes 500*h*. In the embodiment shown in FIGS. 31A and 31B, the inner ferrite material 507 may or may not be disposed inside the coil 501.

In the embodiment shown in FIGS. 32A and 32B, the plurality of ferrite materials 505 form a single stage and are arranged along a first direction perpendicular to the main surface of the base plate 508. The plurality of ferrite materials 505 are disposed so as to avoid the holes 500*h*. Some of the plurality of ferrite materials 505 are disposed on both sides of the hole 500*h* in a second direction that is perpendicular to the main surface of the base plate 508 and perpendicular to the first direction. In the embodiment shown in FIGS. 32A and 32B, the inner ferrite material 507 may or may not be disposed inside the coil 501.

In the embodiment shown in FIGS. 33A and 33B, the plurality of ferrite materials 505 form two stages. The plurality of ferrite materials 505 may form three or more stages. In each stage, the plurality of ferrite materials 505 are arranged along the first direction perpendicular to the main surface of the base plate 508. The plurality of ferrite materials 505 are disposed so as to avoid the hole 500*h*. Some of the plurality ferrite materials 505 are disposed on both sides of the hole 500*h* in the second direction that is perpendicular to the main surface of the base plate 508 and perpendicular to the first direction. In the embodiment shown in FIGS. 33A and 33B, the inner ferrite material 507 may or may not be disposed inside the coil 501.

In each embodiment, the plurality of ferrite materials 505 and the inner ferrite material 507 may be made of manganese zinc based ferrite, nickel zinc based ferrite, or a nanocrystalline soft magnetic material.

In each of the embodiments shown in FIGS. 30A, 30B, 31A, 31B, 32A, 32B, 33A, and 33B, the ferrite material contributes a large total volume to the coil unit 500. Accordingly, even when high frequency noise causes heat to be generated in these ferrite materials, the temperature rise in these ferrite materials is small. Accordingly, it is possible to use high frequency power having a large power level as the high frequency power such as the first RF signal and/or the second RF signal. Further, the configuration of the coil unit 500 may be adopted both for the power transmitting coil unit 130 and the power receiving coil unit 140. Alternatively, the configuration of the coil unit 500 may be adopted only in the power receiving coil unit 140, which is particularly susceptible to heat generation due to eddy currents caused by conductive noise.

Exemplary Embodiment Regarding Inner Ferrite Material in Power Transmitting Coil Unit and Power Receiving Coil Unit Hereinafter, various exemplary embodiments of the inner ferrite material in the integrated power transmitting coil unit 130 and the power receiving coil unit 140 will be described with reference to FIGS. 34 to 49. The inner ferrite material extends from an inner area of one of the power transmitting coil 131 and the power receiving coil 141 toward an inner area of the other coil. The inner ferrite material may be formed from manganese zinc based ferrite, nickel zinc based ferrite, or a nanocrystalline soft magnetic material.

The inner ferrite material improves the Q value of each of the power transmitting coil 131 and the power receiving coil 141, the coupling coefficient between the power transmitting coil 131 and the power receiving coil 141, and the power transmission efficiency between the power transmitting coil 131 and the power receiving coil 141. Accordingly, the inner ferrite material improves the performance of wireless power feeding. In addition, the distance between the power transmitting coil 131 and the power receiving coil 141 may be increased, and conductive noise from the power receiving coil 141 to the power transmitting coil 131 may be reduced. Moreover, it is possible to reduce the size of each of the power transmitting coil 131 and the power receiving coil 141 while ensuring a desired Q value.

FIG. 34 is a diagram illustrating a power transmitting coil unit and a power receiving coil unit according to yet another exemplary embodiment. Hereinafter, the embodiment shown in FIG. 34 will be described from the viewpoint of differences from the embodiment in FIG. 28. In the embodiment of FIG. 34, a columnar inner ferrite material 348 extends from a back surface portion 3451 of the ferrite material 345 to a back surface portion 3452 of the ferrite material 345 through an inner area of the power transmitting coil 131 and an inner area of the power receiving coil 141.

FIG. 35 is a diagram illustrating a power transmitting coil unit and a power receiving coil unit according to yet another exemplary embodiment. Hereinafter, the embodiment shown in FIG. 35 will be described from the viewpoint of differences from the embodiment in FIG. 34. In the embodiment of FIG. 35, the inner ferrite material 348 penetrates the back surface portion 3451 of the ferrite material 345 and the back surface portion 3452 of the ferrite material 345. The inner ferrite material 348 extends from the heat sink 134 to the heat sink 144 through the inner area of the power transmitting coil 131 and the inner area of the power receiving coil 141.

FIG. 36 is a diagram illustrating a power transmitting coil unit and a power receiving coil unit according to yet another exemplary embodiment. Hereinafter, the embodiment shown in FIG. 36 will be described from the viewpoint of differences from the embodiment in FIG. 34.

The power transmitting coil unit 130 includes the ferrite material 135. The ferrite material 135 includes the back surface portion 1351 and the side wall portion 1353. Within the shielded space 340*s* and between the first back surface wall 340*g*1 and the power transmitting coil 131, the heat sink 134, the back surface portion 1351, and the thermally conductive sheet 136 are disposed in this order. The back surface portion 1351 has a generally flat plate shape and extends on the back surface side of the power transmitting coil 131. The side wall portion 1353 has a tubular shape such as a rectangular tube shape or a cylindrical tube shape, and extends from the back surface portion 1351 toward the power receiving coil unit 140 so as to surround the outer periphery of the power transmitting coil 131. The thermally conductive sheet 137 is provided between the power transmitting coil 131 and the side wall portion 1353 so as to surround the outer periphery of the power transmitting coil 131.

The power receiving coil unit 140 includes the ferrite material 145. The ferrite material 145 includes the back surface portion 1452 and the side wall portion 1454. Within the shielded space 340*s* and between the second back surface wall 340*g*2 and the power receiving coil 141, the heat sink 144, the back surface portion 1452, and the thermally conductive sheet 146 are disposed in this order. The back surface portion 1452 has a generally flat plate shape and extends on the back surface of the power receiving coil 141. The side wall portion 1454 has a tubular shape such as a rectangular tube shape or a cylindrical tube shape, and extends from the back surface portion 1452 toward the power transmitting coil unit 130 so as to surround the outer periphery of the power receiving coil 141. The thermally conductive sheet 147 is provided between the power receiving coil 141 and the side wall portion 1454 so as to surround the outer periphery of the power receiving coil 141.

The side wall portion 1353 of the ferrite material 135 is provided on an outer side of the side wall portion 1454 of the ferrite material 145. The ferrite material 135 and the ferrite material 145 define the space 345*s* in which the power transmitting coil 131 and the power receiving coil 141 are accommodated.

The power transmitting coil 131, the heat sink 134, the ferrite material 135, the thermally conductive sheet 136, and the thermally conductive sheet 137 of the power transmitting coil unit 130 may be moved by a drive system 340*d* in a direction approaching the power receiving coil unit 140 (hereinafter referred to as the "approaching direction") and in a direction away from the power receiving coil unit 140 (hereinafter referred to as the "moving away direction").

In the state shown in FIG. 36, the inner ferrite material 348 extends from the back surface portion 1452 through the area inside the power receiving coil 141 to the area inside the power transmitting coil 131. When the power transmitting coil 131, the heat sink 134, the ferrite material 135, the thermally conductive sheet 136, and the thermally conductive sheet 137 are moved in the approaching direction by the drive system 340*d*, one end of the inner ferrite material 348 may abut against the back surface portion 1351.

FIG. 37 is a diagram illustrating a power transmitting coil unit and a power receiving coil unit according to yet another exemplary embodiment. Hereinafter, the embodiment shown in FIG. 37 will be described from the viewpoint of differences from the embodiment in FIG. 36. In the embodiment in FIG. 37, the inner ferrite material 348 extends from the back surface portion 1351 through the area inside the power transmitting coil 131 to the area inside the power receiving coil 141. When the power transmitting coil 131, the heat sink 134, the ferrite material 135, the thermally conductive sheet 136, the thermally conductive sheet 137, and the inner ferrite material 348 are moved in the approaching direction by the drive system 340*d*, the other end of the inner ferrite material 348 may abut against the back surface portion 1452.

FIG. 38 is a diagram illustrating a power transmitting coil unit and a power receiving coil unit according to yet another exemplary embodiment. Hereinafter, the embodiment shown in FIG. 38 will be described from the viewpoint of differences from the embodiment in FIG. 36. In the embodiment shown in FIG. 38, the inner ferrite material 348 extends from the back surface portion 1452 through the area inside the power receiving coil 141 and the area inside the power transmitting coil 131 to the back surface portion 1351. When the drive system 340*d* moves the power transmitting coil 131, the heat sink 134, the ferrite material 135, the thermally conductive sheet 136, and the thermally conductive sheet 137 in the approaching direction, one end of the inner ferrite material 348 may abut against the heat sink 134 through the through hole in the back surface portion 1351.

FIG. 39 is a diagram illustrating a power transmitting coil unit and a power receiving coil unit according to yet another exemplary embodiment. Hereinafter, the embodiment shown in FIG. 39 will be described from the viewpoint of differences from the embodiment in FIG. 37. In the embodiment in FIG. 39, the inner ferrite material 348 extends from the back surface portion 1351 through the area inside the power transmitting coil 131 and the area inside the power receiving coil 141 to the back surface portion 1452. When the drive system 340*d* moves the power transmitting coil 131, the heat sink 134, the ferrite material 135, the thermally conductive sheet 136, the thermally conductive sheet 137, and the inner ferrite material 348 in the approaching direction, the other end of the inner ferrite material 348 may abut against the heat sink 144 through the through hole in the back surface portion 1452.

Each of FIGS. 40 and 41 is a diagram illustrating a power transmitting coil unit and a power receiving coil unit according to yet another exemplary embodiment. Hereinafter, the embodiments shown in FIGS. 40 and 41 will be described from the viewpoint of differences from the embodiment in FIG. 36. In each of the embodiments in FIG. 40 and FIG. 41, a columnar inner ferrite material 3481 and a columnar inner ferrite material 3482 are used instead of the inner ferrite material 348. In addition, the length of the inner ferrite material 3481 in the embodiment of FIG. 40 is shorter than the length of the inner ferrite material 3481 in the embodiment of FIG. 41. In addition, the length of the inner ferrite material 3482 in the embodiment of FIG. 40 is longer than the length of the inner ferrite material 3482 in the embodiment of FIG. 41. As shown in FIGS. 40 and 41, the length of the inner ferrite material 3481 may be shorter or longer than the length of the inner ferrite material 3482.

The inner ferrite material 3481 protrudes from the back surface portion 1351 through the area inside the power transmitting coil 131 toward the power receiving coil 141 from the power transmitting coil 131. The inner ferrite material 3482 protrudes from the back surface portion 1452 through the area inside the power receiving coil 141 toward the power transmitting coil 131 from the power receiving coil 141.

When the drive system 340*d* moves the power transmitting coil 131, the heat sink 134, the ferrite material 135, the thermally conductive sheet 136, the thermally conductive sheet 137, and the inner ferrite material 3481 in an approaching direction, the tip of the inner ferrite material 3481 may abut against the tip of the inner ferrite material 3482.

FIG. 42 is a diagram illustrating a power transmitting coil unit and a power receiving coil unit according to yet another exemplary embodiment. Hereinafter, the embodiment shown in FIG. 42 will be described from the viewpoint of differences from the embodiment in FIG. 40. In the state shown in FIG. 42, the tip of the inner ferrite material 3481 is located on a plane that includes the tip of the inner ferrite material 3482. In the embodiment shown in FIG. 42, the inner ferrite material 3482 provides an internal bore that extends from its tip into the interior of the inner ferrite material 3482.

When the drive system 340*d* moves the power transmitting coil 131, the heat sink 134, the ferrite material 135, the thermally conductive sheet 136, the thermally conductive sheet 137, and the inner ferrite material 3481 in an approaching direction, the tip of the inner ferrite material 3481 is accommodated in an inner bore of the inner ferrite material 3482. In addition, the inner ferrite material 3481 may provide the inner bore, and the tip of the inner ferrite material 3482 may be accommodated in the inner bore of the inner ferrite material 3481.

FIG. 43 is a diagram illustrating a power transmitting coil unit and a power receiving coil unit according to yet another exemplary embodiment. Hereinafter, the embodiment shown in FIG. 43 will be described from the viewpoint of differences from the embodiment in FIG. 36.

In the embodiment shown in FIG. 43, the power transmitting coil unit 130 includes a base plate 138 instead of the heat sink 134. The base plate 138 is, for example, a glass epoxy substrate. In addition, in the power transmitting coil unit 130, the ferrite material 135 has a generally plate shape, similar to the back surface portion 1351 described above, and extends on the back surface side of the power transmitting coil 131. The base plate 138 may have at least one hollow portion in the surface that contacts the ferrite material 135. In this connection, the cooling efficiency of the ferrite material 135 may be improved.

The power receiving coil unit 140 includes a base plate 148 instead of the heat sink 144. The base plate 148 is, for example, a glass epoxy substrate. In addition, in the power receiving coil unit 140, the side wall portion 1454 of the ferrite material 145 extends from the back surface portion 1452 toward the power transmitting coil unit 130, and surrounds the outer periphery of the power transmitting coil 131, the outer periphery of the thermally conductive sheet 136, and the outer periphery of the ferrite material 135. The base plate 148 may have at least one hollow portion in the surface that contacts the ferrite material 145. In this connection, the cooling efficiency of the ferrite material 145 may be improved.

When the drive system 340*d* moves the power transmitting coil 131, the base plate 138, the ferrite material 135, the thermally conductive sheet 136, and the inner ferrite material 3481 in the approaching direction, the tip of the inner ferrite material 348 passes through the through hole of the base plate 138 and protrudes from the base plate 138 toward the first back surface wall 340*g*1.

Further, in the embodiment shown in FIG. 43, a fan 340*f* is disposed along the second back surface wall 340*g*2. The plurality of ventilation holes 340*gh* are formed in the first back surface wall 340*g*1 and the second back surface wall 340*g*2.

Hereinafter, FIGS. 44A, 44B, and 44C are referred. Each of FIGS. 44A, 44B, and 44C is a diagram illustrating an example of the location relationship between each of the power transmitting coil and the power receiving coil and an inner ferrite material.

As shown in FIG. 44A, the inner ferrite material 348 may be in contact with the power transmitting coil 131 and the power receiving coil 141. Furthermore, the inner ferrite material 3481 may be in contact with the power transmitting coil 131, and the inner ferrite material 3482 may be in contact with the power receiving coil 141.

As shown in FIG. 44B, the inner ferrite material 348 extends from the area inside the power transmitting coil 131 but does not have to reach the area inside the power receiving coil 141. Alternatively, the inner ferrite material 348 may extend from the area inside the power receiving coil 141 and not reach the area inside the power transmitting coil 131.

As shown in FIG. 44C, the inner ferrite material 348 does not have to be in contact with the power transmitting coil 131 and the power receiving coil 141. Furthermore, the inner ferrite material 3481 does not have to be in contact with the power transmitting coil 131, and the inner ferrite material 3482 does not have to be in contact with the power receiving coil 141.

Figure 45A:
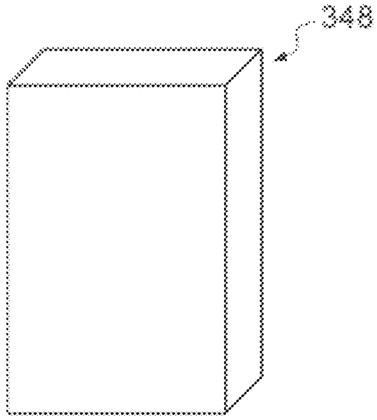

Hereinafter, FIG. 45A to E are referred. FIG. 45A to 45E are diagrams illustrating various examples of the inner ferrite material. As shown in FIG. 45A, the inner ferrite material 348 may be a single prism. Each of the inner ferrite material 3481 and the inner ferrite material 3482 may also be a single prism.

Figure 45B:
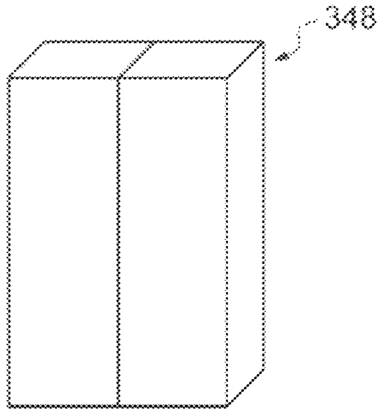

As shown in FIG. 45B, the inner ferrite material 348 may be a prism made up of two or more prisms. Each of the inner ferrite material 3481 and the inner ferrite material 3482 may also be a prism made up of two or more prisms.

Figure 45C:
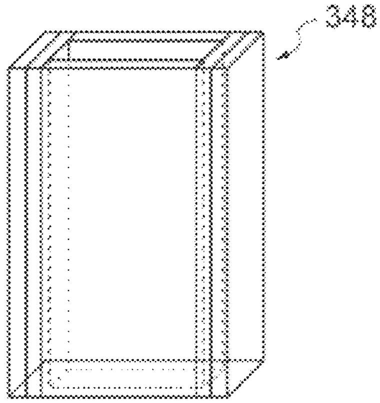

As shown in FIG. 45C, the inner ferrite material 348 may be in the shape of a rectangular parallelepiped, and may have an inner bore or be hollow. The inner ferrite material 348 may be constructed from several plate materials. Moreover, each of the inner ferrite material 3481 and the inner ferrite material 3482 may also be in the shape of a rectangular parallelepiped, and may have an inner bore or be hollow. Each of the inner ferrite material 3481 and the inner ferrite material 3482 may also be made up of several plate materials.

Figure 45D:
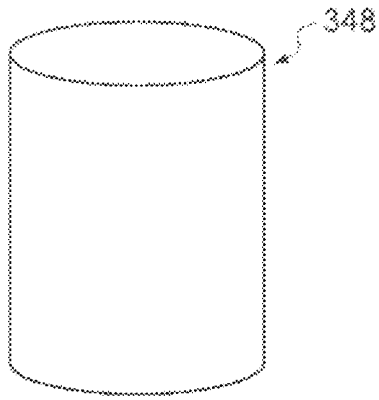
Figure 45E:
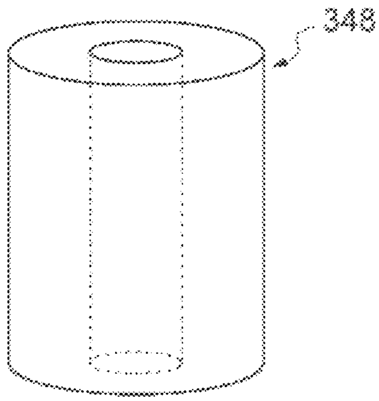

As shown in FIG. 45D, the inner ferrite material 348 may have a cylindrical tube shape. Each of the inner ferrite material 3481 and the inner ferrite material 3482 may also have a cylindrical tube shape. As shown in FIG. 45E, the inner ferrite material 348 may have a cylindrical tube shape. Each of the inner ferrite material 3481 and the inner ferrite material 3482 may also have a cylindrical tube shape.

Hereinafter, FIGS. 46A to 46C and FIGS. 47A to 47B are referred. FIG. 46A to 46C and FIGS. 47A to 47B are diagrams illustrating various examples of the inner ferrite material. Each of FIGS. 46A to 46C and FIGS. 47A to 47B is a plan view showing the tip surface of the inner ferrite material.

As shown in FIG. 46A, the inner ferrite material 348 may have a rectangular parallelepiped shape. In addition, as shown in FIG. 46A, the inner ferrite material 348 may be in a lattice shape. In addition, the inner ferrite material 348 may be formed from a plurality of plate materials. The plurality of spaces provided within the inner ferrite material 348 may be evenly or unevenly disposed. Alternatively, the inner ferrite material 348 may be configured by inserting one or more members having different shapes into one or more spaces provided therein. The different shape may be, for example, a cylindrical tube shape.

As shown in FIGS. 46B and 46C, the inner ferrite material 348 may be formed from a plurality of members. In each of the examples of FIGS. 46B and 46C, each of the plurality of members has a cylindrical tube shape. As shown in FIG. 46B, the plurality of members may be arranged two-dimensionally and parallel to each other. As shown in FIG. 46C, the plurality of members may be arranged parallel to each other and surrounding a space. Each of the plurality of members may have a cylindrical tube shape. Alternatively, one or more of the plurality of members may have a cylindrical tube shape, and the other members may have a cylindrical tube shape.

The number, shape, and arrangement of the plurality of members of the inner ferrite material 348 may be selected appropriately depending on the shape of the inner areas of the power transmitting coil 131 and the power receiving coil 141. For example, as shown in FIG. 47A, the shape of the plurality of members of the inner ferrite material 348 may be a hexagonal prism. In addition, as shown in FIG. 47B, the inner ferrite material 348 may have any shape formed from a plurality of plate-like portions. In addition, each of the inner ferrite material 3481 and the inner ferrite material 3482 may be configured similarly to any of the various examples described above regarding the inner ferrite material 348.

Hereinafter, FIGS. 48A to 48C and FIGS. 49A and 49B are referred. FIGS. 48A to 48C and FIGS. 49A and 49B are diagrams illustrating various examples of the ferrite material in the power transmitting coil unit and the power receiving coil unit.

As shown in FIG. 48A, the inner ferrite material 348 may be formed integrally with the back surface portion 1452 or the back surface portion 3452. In addition, the inner ferrite material 3482 may be formed integrally with the back surface portion 1452 or the back surface portion 3452.

As shown in FIG. 48B, the inner ferrite material 348 may be formed integrally with the back surface portion 1351 or the back surface portion 3451. In addition, the inner ferrite material 3481 may be formed integrally with the back surface portion 1351 or the back surface portion 3451.

As shown in FIG. 48C, the inner ferrite material 348 may be formed integrally with the back surface portion 1351 and the back surface portion 1452. The inner ferrite material 348 may be formed integrally with the back surface portion 3451 and the back surface portion 3452.

As shown in FIG. 49A, the inner ferrite material 348 may be formed integrally with the back surface portion 1452 and the sidewall portion 1454. The inner ferrite material 348 may be integrally formed with the back surface portion 3452 and the side wall portion 3453. In addition, the inner ferrite material 3482 may be formed integrally with the back surface portion 1452 and the side wall portion 1454. The inner ferrite material 3482 may be integrally formed with the back surface portion 3452 and the side wall portion 3453.

As shown in FIG. 49B, the inner ferrite material 348 may be formed integrally with the back surface portion 1351 and the side wall portion 1353. The inner ferrite material 348 may be integrally formed with the back surface portion 3451 and the side wall portion 3453. In addition, the inner ferrite material 3481 may be formed integrally with the back surface portion 1351 and the side wall portion 1353. The inner ferrite material 3481 may be formed integrally with the back surface portion 3451 and the side wall portion 3453.

Exemplary Embodiment Relating to Cooling Mechanisms for Power Transmitting Coil Unit and Power Receiving Coil Unit Hereinafter, various exemplary embodiments relating to the cooling mechanisms for the power transmitting coil unit 130 and the power receiving coil unit 140 will be described with reference to FIGS. 50 to 60. The cooling mechanism cools coils such as the power transmitting coil 131 and the power receiving coil 141 and the ferrite material. The cooling mechanism prevents damage to components in the power transmitting coil unit 130 and the power receiving coil unit 140. Furthermore, since the ferrite material is cooled by the cooling mechanism, high-frequency power having a high power level may be used as high-frequency power such as the first RF signal and the second RF signal.

FIG. 50 is a diagram illustrating a power transmitting coil unit and a power receiving coil unit according to yet another exemplary embodiment. FIG. 51A is a diagram illustrating an example of a heat sink for the power receiving coil unit shown in FIG. 50, and FIG. 51B is a diagram illustrating an example of a heat sink for the power transmitting coil unit shown in FIG. 50. Hereinafter, the embodiment shown in FIG. 50 will be described from the viewpoint of differences from the embodiment in FIG. 27.

In the embodiment shown in FIG. 50, the power transmitting coil unit 130 and the power receiving coil unit 140 are not integrated and are separate from each other. In the power transmitting coil unit 130, an opening at the tip of the side wall 130*gs* is closed by the insulating plate 130*i*. The insulating plate 130*i* is formed from a resin such as PEEK or PPS. The power transmitting coil unit 130 does not have the thermally conductive sheet 137 and the side wall portion 1353. In the power transmitting coil unit 130, the ferrite material 135 extends on the back surface side of the power transmitting coil 131, similar to the back surface portion 1351 described above. As shown in FIG. 51B, the heat sink 134 includes a plurality of fins 134*f*. The plurality of fins 134*f* are arranged alternately with a plurality of gaps and parallel to one another.

In the embodiment shown in FIG. 50, an opening at the tip of the side wall 140*gs* of the metal case 140*g* of the power receiving coil unit 140 is closed by the insulating plate 140*i*. The insulating plate 140*i* is made of a resin such as PEEK or PPS. The power receiving coil unit 140 does not have the thermally conductive sheet 147 and the side wall portion 1454. In the power receiving coil unit 140, the ferrite material 145 extends on the back surface side of the power receiving coil 141, similar to the back surface portion 1452 described above. As shown in FIG. 51A, the heat sink 144 includes a plurality of fins 144*f*. The plurality of fins 144*f* are arranged alternately with the plurality of gaps and parallel to one another.

In the embodiment shown in FIG. 50, the fan 130*f* is a blower fan that forms an airflow that passes through the plurality of fins 134*f* and the plurality of alternating gaps, as indicated by the arrows in FIG. 50, from the plurality of ventilation holes 130*gh* to the outside of the power transmitting coil unit 130. In addition, as indicated by the arrows in FIG. 50, the fan 130*f* forms an airflow that passes through the space between the power transmitting coil 131 and the insulating plate 130*i* and reaches the outside of the power transmitting coil unit 130 through the plurality of ventilation holes 130*gh*. This causes the power transmitting coil 131 and the ferrite material 135 to cool. Further, the fan 130*f* may be an exhaust fan. When the fan 130*f* is an exhaust fan, an airflow is formed in the power transmitting coil unit 130 in the opposite direction to the airflow indicated by the arrows in FIG. 50.

In the embodiment shown in FIG. 50, the fan 140*f* is a blower fan that forms an airflow that passes through the plurality of fins 144*f* and the plurality of alternating gaps, as indicated by the arrows in FIG. 50, from the plurality of ventilation holes 140*gh* to the outside of the power receiving coil unit 140. In addition, as indicated by the arrows in FIG. 50, the fan 140*f* forms an airflow that passes through the space between the power receiving coil 141 and the insulating plate 140*i* and reaches the outside of the power receiving coil unit 140 from the plurality of ventilation holes 140*gh*. This causes the power receiving coil 141 and the ferrite material 145 to cool. In addition, the fan 140*f* may be an exhaust fan. When the fan 140*f* is an exhaust fan, an airflow is formed in the power receiving coil unit 140 in the opposite direction to the airflow indicated by the arrows in FIG. 50.

FIG. 52 is a diagram illustrating a power transmitting coil unit and a power receiving coil unit according to yet another exemplary embodiment. Hereinafter, the embodiment shown in FIG. 52 will be described from the viewpoint of differences from the embodiment in FIG. 50.

In the embodiment shown in FIG. 52, some of the plurality of ventilation holes 130*gh* are formed in the back surface wall 130*gb*. The fan 130*f* is provided along the back surface wall 130*gb* on an outer side of the metal case 130*g*. The heat sink 134, the ferrite material 135, the thermally conductive sheet 136, and the power transmitting coil 131 provide a first gas flow path that connects the space between the power transmitting coil 131 and the insulating plate 130*i* to the plurality of ventilation holes 130*gh* of the back surface wall 130*gb*.

In the embodiment shown in FIG. 52, some of the plurality of ventilation holes 140*gh* are formed in the back surface wall 140*gb*. The fan 140*f* is provided along the back surface wall 140*gb* on an outer side of the metal case 140*g*. The heat sink 144, the ferrite material 145, the thermally conductive sheet 146, and the power receiving coil 141 provide a second gas flow path that connects the space between the power receiving coil 141 and the insulating plate 140*i* to the plurality of ventilation holes 140*gh* of the back surface wall 140*gb*.

In the embodiment shown in FIG. 52, the fan 130*f* is a blower fan that forms an airflow that passes through the plurality of fins 134*f* and the plurality of alternating gaps, as indicated by the arrows in FIG. 52, from the plurality of ventilation holes 130*gh* of the side wall 130*gs* to the outside of the power transmitting coil unit 130. In addition, as indicated by the arrows in FIG. 52, the fan 130*f* forms an airflow that passes through the space between the insulating plate 130*i* and the power transmitting coil 131 and the first gas flow path, and reaches the outside of the power transmitting coil unit 130 from the plurality of ventilation holes 130*gh* of the side wall 130*gs*. This causes the power transmitting coil 131 and the ferrite material 135 to cool. In addition, the fan 130*f* may be an exhaust fan. When the fan 130*f* is an exhaust fan, an airflow is formed in the power transmitting coil unit 130 in the opposite direction to the airflow indicated by the arrows in FIG. 52.

In the embodiment shown in FIG. 52, the fan 140*f* is a blower fan that forms an airflow that passes through the plurality of fins 144*f* and the plurality of alternating gaps, as indicated by the arrows in FIG. 52, from the plurality of ventilation holes 140*gh* of the side wall 140*gs* to the outside of the power receiving coil unit 140. In addition, as indicated by the arrows in FIG. 52, the fan 140*f* forms an airflow that passes through the space between the insulating plate 140*i* and the power receiving coil 141 and the second gas flow path, and reaches the outside of the power receiving coil unit 140 from the plurality of ventilation holes 140*gh* of the side wall 140*gs*. This causes the power receiving coil 141 and the ferrite material 145 to cool. In addition, the fan 140*f* may be an exhaust fan. When the fan 140*f* is an exhaust fan, an airflow is formed in the power receiving coil unit 140 in the opposite direction to the airflow indicated by the arrows in FIG. 52.

FIG. 53 is a diagram illustrating a power transmitting coil unit and a power receiving coil unit according to yet another exemplary embodiment. The embodiment shown in FIG. 53 is identical to the embodiment shown in FIG. 27. In the embodiment shown in FIG. 53, a plurality of ventilation holes are formed in the side wall portion 1353 of the ferrite material 135 and the thermally conductive sheet 137 in order to form the airflows indicated by the arrows. Further, a plurality of ventilation holes are formed in the side wall portion 1454 of the ferrite material 145 and the thermally conductive sheet 147 to form the airflows as indicated by the arrows. The plurality of ventilation holes in each of the side walls 1353 and 1454 has a size that ensures the effect of confining magnetic flux in each of the side walls 1353 and 1454.

In the embodiment shown in FIG. 53, the fan 130*f* is a blower fan that forms an airflow that passes through the plurality of fins 134*f* and the plurality of alternating gaps, as indicated by the arrows in FIG. 53, from the plurality of ventilation holes 130*gh* to the outside of the power transmitting coil unit 130. In addition, as indicated by the arrows in FIGS. 53, the fan 130*f* forms an airflow that passes through the space between the insulating plate 34*i* and the power transmitting coil 131 and the plurality of ventilation holes of the thermally conductive sheet 137 and the side wall portion 1353, and reaches the outside of the power transmitting coil unit 130 from the plurality of ventilation holes 130*gh*. This causes the power transmitting coil 131 and the ferrite material 135 to cool. In addition, the fan 130*f* may be an exhaust fan. When the fan 130*f* is an exhaust fan, an airflow is formed in the power transmitting coil unit 130 in the opposite direction to the airflow indicated by the arrows in FIG. 53.

In the embodiment shown in FIG. 53, the fan 140*f* is a blower fan that forms an airflow that passes through the plurality of fins 144*f* and the plurality of alternating gaps, as indicated by the arrows in FIG. 53, from the plurality of ventilation holes 140*gh* to the outside of the power receiving coil unit 140. In addition, as indicated by the arrows in FIG. 53, the fan 140*f* forms an airflow that passes through the space between the insulating plate 34*i* and the power receiving coil 141 and the plurality of ventilation holes of the thermally conductive sheet 147 and the side wall portion 1454, and reaches the outside of the power receiving coil unit 140 from the plurality of ventilation holes 140*gh*. This causes the power receiving coil 141 and the ferrite material 145 to cool. In addition, the fan 140*f* may be an exhaust fan. When the fan 140*f* is an exhaust fan, an airflow is formed in the power receiving coil unit 140 in the opposite direction to the airflow indicated by the arrows in FIG. 53.

FIG. 54 is a diagram illustrating a power transmitting coil unit and a power receiving coil unit according to yet another exemplary embodiment. Hereinafter, the embodiment shown in FIG. 54 will be described from the viewpoint of the differences from the embodiment in FIG. 53.

In the embodiment shown in FIG. 54, some of the plurality of ventilation holes 130*gh* are formed in the back surface wall 130*gb*. The fan 130*f* is provided along the back surface wall 130*gb* on an outer side of metal case 130*g*. The heat sink 134, the ferrite material 135, the thermally conductive sheet 136, and the power transmitting coil 131 provide a first gas flow path that connects the space between the power transmitting coil 131 and the insulating plate 34*i* to the plurality of ventilation holes 130*gh* of the back surface wall 130*gb*.

In addition, in the embodiment shown in FIG. 54, some of the plurality of ventilation holes 140*gh* are formed in the back surface wall 140*gb*. The fan 140*f* is provided along the back surface wall 140*gb* on an outer side of metal case 140*g*. The heat sink 144, the ferrite material 145, the thermally conductive sheet 146, and the power receiving coil 141 provide a second gas flow path that connects the space between the power receiving coil 141 and the insulating plate 34*i* to the plurality of ventilation holes 140*gh* of the back surface wall 140*gb*.

In the embodiment shown in FIG. 54, the fan 130*f* is a blower fan that forms an airflow that passes through the plurality of fins 134*f* and the plurality of alternating gaps, as indicated by the arrows in FIG. 54, from the plurality of ventilation holes 130*gh* of the side wall 130*gs* to the outside of the power transmitting coil unit 130. In addition, as indicated by the arrows in FIG. 54, the fan 130*f* forms an airflow that passes through the first gas flow path, the space between the power transmitting coil 131 and the insulating plate 34*i*, and the plurality of ventilation holes of the side wall portion 1353 and the thermally conductive sheet 137, and reaches the outside of the power transmitting coil unit 130 from the plurality of ventilation holes 130*gh* of the side wall 130*gs*. This causes the power transmitting coil 131 and the ferrite material 135 to cool. In addition, the fan 130*f* may be an exhaust fan. When the fan 130*f* is an exhaust fan, an airflow is formed in the power transmitting coil unit 130 in the opposite direction to the airflow indicated by the arrows in FIG. 54.

In the embodiment shown in FIG. 54, the fan 140*f* is a blower fan that forms an airflow that passes through the plurality of fins 144*f* and the plurality of alternating gaps, as indicated by the arrows in FIG. 54, from the plurality of ventilation holes 140*gh* of the side wall 140*gs* to the outside of the power receiving coil unit 140. In addition, as indicated by the arrows in FIG. 54, the fan 140*f* forms an airflow that passes through the second gas flow path, the space between the power receiving coil 141 and the insulating plate 34*i*, and the plurality of ventilation holes of the side wall portion 1454 and the thermally conductive sheet 147, and reaches the outside of the power receiving coil unit 140 from the plurality of ventilation holes 140*gh* of the side wall 140*gs*.

This causes the power receiving coil 141 and the ferrite material 145 to cool. In addition, the fan 140*f* may be an exhaust fan. When the fan 140*f* is an exhaust fan, an airflow is formed in the power receiving coil unit 140 in the opposite direction to the airflow indicated by the arrows in FIG. 54.

FIG. 55 is a diagram illustrating a power transmitting coil unit and a power receiving coil unit according to yet another exemplary embodiment. The embodiment shown in FIG. 55 is identical to the embodiment shown in FIG. 28. In the embodiment shown in FIG. 55, a plurality of ventilation holes are formed in the side wall portion 3453 of the ferrite material 345 and the thermally conductive sheet 347 in order to form the airflows indicated by the arrows. The plurality of ventilation holes in the side wall portion 3453 have a size that ensures the effect of confining magnetic flux in the side wall portion 3453.

In the embodiment shown in FIG. 55, the fan 340*f* is a blower fan that forms an airflow that passes through the plurality of alternating gaps and the plurality of fins 134*f* of the heat sink 134, as indicated by the arrows in FIG. 55, and reaches the outside of the power transmitting coil unit 130 from the plurality of ventilation holes 340*gh*. In addition, as indicated by the arrows in FIG. 55, the fan 340*f* forms an airflow that passes through the plurality of alternating gaps and the plurality of fins 144*f* of the heat sink 144, from the plurality of ventilation holes 340*gh* to the outside of the power receiving coil unit 140. In addition, as indicated by the arrows in FIG. 55, the fan 340*f* forms an airflow that passes through the plurality of ventilation holes in the thermally conductive sheet 347 and the side wall portion 3453, as well as the space between the power transmitting coil 131 and the power receiving coil 141, and reaches the outside of the power transmitting coil unit 130 and the power receiving coil unit 140 from the plurality of ventilation holes 340*gh*. This causes the power transmitting coil 131, the ferrite material 345, and the power receiving coil 141 to cool. In addition, the fan 340*f* may be an exhaust fan. When the fan 340*f* is an exhaust fan, an airflow is formed in the power transmitting coil unit 130 and the power receiving coil unit 140 in the opposite direction to the airflow indicated by the arrows in FIG. 55.

FIG. 56 is a diagram illustrating a power transmitting coil unit and a power receiving coil unit according to yet another exemplary embodiment. Hereinafter, the embodiment shown in FIG. 56 will be described from the viewpoint of differences from the embodiment in FIG. 55.

In the embodiment shown in FIG. 56, some of the plurality of ventilation holes 340*gh* are formed in the first back surface wall 340*g*1 and the second back surface wall 340*g*2. In the embodiment shown in FIG. 56, the fan 130*f* is provided along the first back surface wall 340*g*1 on an outer side of the metal case 340*g*. Furthermore, the fan 140*f* is provided along the second back surface wall 340*g*2 on an outer side of the metal case 340*g*.

In the embodiment of FIG. 56, the heat sink 134, the back surface portion 3451 of the ferrite material 345, the thermally conductive sheet 136, and the power transmitting coil 131 provide a first gas flow path that connects the space between the power transmitting coil 131 and the power receiving coil 141 to the plurality of ventilation holes 340*gh* of the first back surface wall 340*g*1. In addition, the heat sink 144, the back surface portion 3452 of the ferrite material 345, the thermally conductive sheet 146, and the power receiving coil 141 provide a second gas flow path that connects the space between the power transmitting coil 131 and the power receiving coil 141 to the plurality of ventilation holes 340*gh* of the second back surface wall 340*g*2.

In the embodiment shown in FIG. 56, the fan 130*f* is a blower fan that forms an airflow that passes through the plurality of fins 134*f* and the plurality of alternating gaps, as indicated by the arrows in FIG. 56, from the plurality of ventilation holes 130*gh* of the side wall 340*g*3 to the outside of the power transmitting coil unit 130. In addition, as indicated by the arrows in FIG. 56, the fan 130*f* forms an airflow that passes through the first gas flow path, the space between the power transmitting coil 131 and the power receiving coil 141, and the plurality of ventilation holes in the side wall portion 3453 and the thermally conductive sheet 347, and reaches the outside of the power transmitting coil unit 130 from the plurality of ventilation holes 340*gh* of the side wall 340*g*3. This causes the power transmitting coil 131 and the ferrite material 345 to cool. In addition, the fan 130*f* may be an exhaust fan. When the fan 130*f* is an exhaust fan, an airflow is formed in the power transmitting coil unit 130 in the opposite direction to the airflow indicated by the arrows in FIG. 56.

In the embodiment shown in FIG. 56, the fan 140*f* is a blower fan that forms an airflow that passes through the plurality of fins 144*f* and the plurality of alternating gaps, as indicated by the arrows in FIG. 56, from the plurality of ventilation holes 340*gh* of the side wall 340*g*3 to the outside of the power receiving coil unit 140. In addition, as indicated by the arrows in FIG. 56, the fan 140*f* forms an airflow that passes through the second gas flow path, the space between the power receiving coil 141 and the power transmitting coil 131, and the plurality of ventilation holes in the side wall portion 3453 and the thermally conductive sheet 347, and reaches the outside of the power receiving coil unit 140 from the plurality of ventilation holes 340*gh* of the side wall 340*g*3. This causes the power receiving coil 141 and the ferrite material 345 to cool. In addition, the fan 140*f* may be an exhaust fan. When the fan 140*f* is an exhaust fan, an airflow is formed in the power receiving coil unit 140 in the opposite direction to the airflow indicated by the arrows in FIG. 56.

FIG. 57A is a cross-sectional view of a coil unit according to another exemplary embodiment, and 57B is a plan view of a cooling plate in the coil unit shown in FIG. 57A. The coil unit 500 shown in FIG. 57A may be used as at least one of the power transmitting coil unit 130 and the power receiving coil unit 140.

As shown in FIG. 57A, the coil unit 500 includes a metal case 500*g*, a fan 500*f*, the coil 501, a heat sink 504, the ferrite material 505, and a cooling plate 509. The metal case 500*g* is used as the metal case 130*g*, the metal case 140*g*, or the metal case 340*g*. The opening at the tip of the side wall of the metal case 500*g* may be closed by an insulating plate 500*i*. The metal case 500*g* is formed with a plurality of ventilation holes 500*gh*, such as the plurality of ventilation holes 130*gh*, 140*gh*, or 340*gh*. In addition, the fan 500*f* is used as the fan 130*f*, 140*f*, or 340*f*.

The coil 501 is used as the power transmitting coil 131 in the power transmitting coil unit 130 and as the power receiving coil 141 in the power receiving coil unit 140. The heat sink 504 is used as the heat sink 134 in the power transmitting coil unit 130 and as the heat sink 144 in the power receiving coil unit 140. The ferrite material 505 is provided between the heat sink 504 and the coil 501.

The cooling plate 509 is provided between the ferrite material 505 and the coil 501. The cooling plate 509 may be in contact with either or both of the ferrite material 505 and the coil 501. The cooling plate 509 is a hollow plate material, and accommodates a coolant in an internal space 509*h*. The cooling plate 509 cools the coil 501 and the ferrite material 505. In the example of FIG. 57A, the outer diameter of the cooling plate 509 is the same as the outer diameter of the coil 501, but the outer diameter of the space 509*h* may also be the same as the outer diameter of the coil 501. In this connection, the outer diameter of the cooling plate 509 is larger than the outer diameter of the coil 501. In addition, the cooling plate 509 may be made of an insulating material such as ceramic. In addition, the coolant is a fluid and may be a dielectric. The coolant may include at least one selected from water, brine, or air.

FIG. 58 is a cross-sectional view of a coil unit according to yet another exemplary embodiment. FIG. 59 is a diagram illustrating two cooling plates in the coil unit shown in FIG. 58. Hereinafter the coil unit shown in FIG. 58 will be described from the viewpoint of the differences from the coil unit shown in FIG. 57A.

The coil unit 500 shown in FIG. 58 includes, instead of the cooling plate 509, two cooling plates 509*a* and 509*b*. The cooling plates 509*a* and 509*b* are provided on the back surface side of the coil 501. The ferrite material 505 is provided between the cooling plate 509*b* and the coil 501. The cooling plate 509*b* may be in contact with the ferrite material 505. The cooling plate 509*a* is provided between the ferrite material 505 and the coil 501. The cooling plate 509*a* may be in contact with either or both of the ferrite material 505 and the coil 501.

As shown in FIG. 59, the cooling plate 509*a* has a coolant flow path 509*af* therein. Furthermore, the cooling plate 509*b* has a coolant flow path 509*bf* therein.

A chiller unit 500*c* is provided outside the coil unit 500. The chiller unit 500*c* supplies the coolant to the coolant flow paths 509*af* and 509*bf*, and recovers the coolant from the coolant flow paths 509*af* and 509*bf*. The coil 501 and the ferrite material 505 are cooled by the cooling plates 509*a* and 509*b*. In addition, the coolant is a fluid and may be a dielectric. The coolant may include at least one selected from water, brine, or air. In one embodiment, the chiller unit 500*c* may be connected to an inlet of the coolant flow path 509*af*. In addition, an outlet of the coolant flow path 509*af* may be connected to the inlet of the coolant flow path 509*bf*. Furthermore, the outlet of the coolant flow path 509*bf* may be connected to the chiller unit 500*c*.

FIG. 60 is a diagram illustrating a power transmitting coil unit and a power receiving coil unit according to yet another exemplary embodiment. Hereinafter, the exemplary embodiment of FIG. 60 will be described from the viewpoint of the differences from the exemplary embodiment of FIG. 55.

In the exemplary embodiment in FIG. 60, the cooling plate 509*b* is provided between the power transmitting coil 131 and the back surface portion 3451 of the ferrite material 345 instead of the thermally conductive sheet 136. The cooling plate 509*b* may be in contact with one or both of the power transmitting coil 131 and the back surface portion 3451 of the ferrite material 345. Moreover, instead of the thermally conductive sheet 146, the cooling plate 509*a* is provided between the power receiving coil 141 and the back surface portion 3452 of the ferrite material 345. The cooling plate 509*a* may be in contact with either or both of the power receiving coil 141 and the back surface portion 3452 of the ferrite material 345.

The cooling plate 509*a* has the coolant flow path 509*af* therein (see FIG. 59). Moreover, the cooling plate 509*b* has the coolant flow path 509*bf* therein (see FIG. 59).

A chiller unit 500*c* is provided outside the power transmitting coil unit 130 and the power receiving coil unit 140. The chiller unit 500*c* supplies the coolant to the coolant flow paths 509*af* and 509*bf*, and recovers the coolant from the coolant flow paths 509*af* and 509*bf*. The cooling plates 509*a* and 509*b* cool the power transmitting coil 131, the ferrite material 345, and the power receiving coil 141. In addition, the coolant is a fluid and may be a dielectric. The coolant may include at least one selected from water, brine, or air. In one embodiment, the chiller unit 500*c* may be connected to the inlet of the coolant flow path 509*af*. In addition, the outlet of the coolant flow path 509*af* may be connected to the inlet of the coolant flow path 509*bf*. Furthermore, the outlet of the coolant flow path 509*bf* may be connected to the chiller unit 500*c*.

Exemplary Embodiments Relating to Power Transmitting Coil and Power Receiving Coil Hereinafter, various exemplary embodiments of the coil 501 that may be used as each of the power transmitting coil 131 and the power receiving coil 141 will be described with reference to FIGS. 61A to 72B.

The inner diameter of each of the coils 501 in the various exemplary embodiments may be less than 150 mm, and its outer diameter may be less than 350 mm. In addition, the winding direction of the power transmitting coil 131 and the winding direction of the power receiving coil 141 may be opposite to each other in order to achieve a high coupling coefficient.

FIG. 61A is a cross-sectional view of a coil according to one exemplary embodiment, and FIG. 61B is a cross-sectional view of a wire rod of the coil according to one exemplary embodiment. A wire rod 521 of the coil 501 shown in FIGS. 61A and 61B is wound from an inner side to an outer side around the central axis of the coil 501 to form a single layer. The wire rod 521 is configured by stacking a plurality of wire strands 522 and has a rectangular cross-sectional shape. Each of the plurality of wire strands 522 is a flat wire. The plurality of wire strands 522 are bundled in layers in a direction from an inner side to an outer side of the coil 501. Each of the plurality of wire strands 522 may be covered with an insulating coating film such as polyurethane.

FIG. 62A is a cross-sectional view of a coil according to another exemplary embodiment, and FIG. 62B is a cross-sectional view of a wire rod of the coil according to another exemplary embodiment. Hereinafter, the coil 501 shown in FIGS. 62A and 62B will be described from the viewpoint of the differences from the coil 501 shown in FIGS. 61A and 61B. In the coil 501 shown in FIGS. 62A and 62B, each of the plurality of wire strands 522 configuring the wire rod 521 is a flat wire. In the coil 501 shown in FIGS. 62A and 62B, the plurality of wire strands 522 configuring the wire rod 521 are bundled in layers along the thickness direction of the coil 501.

FIG. 63A is a cross-sectional view of a coil according to yet another exemplary embodiment, and FIG. 63B is a cross-sectional view of a wire rod of the coil according to yet another exemplary embodiment. Hereinafter, the coil 501 shown in FIGS. 63A and 63B will be described from the viewpoint of the differences from the coil 501 shown in FIGS. 61A and 61B. In the coil 501 shown in FIGS. 63A and 63B, the plurality of wire strands 522 configuring the wire rod 521 have a rectangular cross-sectional shape. The plurality of wire strands 522 are arranged two-dimensionally along a direction from an inner side to an outer side of the coil 501 and along the thickness direction of the coil 501 so as to be in close contact with each other.

In each of the various coils 501 shown in FIGS. 61A to 63B, the wire rod 521 is configured of the plurality of wire strands 522 and has a larger cross-sectional area than a wire rod of a single wire having a circular cross-sectional shape. Accordingly, each of these coils 501 has a high inductance. In addition, since the wire rod 521 is configured of the plurality of wire strands 522, the AC resistance component of the coil 501 is smaller than the AC resistance component of a coil configured of the wire rod of the single wire.

FIG. 64A is a cross-sectional view of a coil according to yet another exemplary embodiment, and FIG. 64B is a cross-sectional view of a wire rod of the coil according to yet another exemplary embodiment. Hereinafter, the coil 501 shown in FIGS. 64A and 64B will be described from the viewpoint of the differences from the coil 501 shown in FIGS. 61A and 61B.

In the coil 501 shown in FIGS. 64A and 64B, the wire rod 521 is a Litz wire and has the plurality of wire strands 522. The plurality of wire strands 522 configuring the wire rod 521 have a rectangular cross-sectional shape. The plurality of wire strands 522 are arranged two-dimensionally along a direction from an inner side to an outer side of the coil 501 and along the thickness direction of the coil 501 so as to be in close contact with each other. The insulating coating film of the wire rod 521 is made of, for example, Tetron fiber.

In the coil 501 shown in FIGS. 64A and 64B, the wire rod 521 is configured of the plurality of wire strands 522 and has a larger cross-sectional area than a typical Litz wire. Accordingly each of these coils 501 has a high inductance. In addition, a typical Litz wire has a circular cross-sectional shape, and the plurality of wire strands configuring the same also have a circular cross-sectional shape. In addition, the coil 501 shown in FIGS. 64A and 64B has a larger cross-sectional area than a typical Litz wire, and therefore may have a greater number of wire strands than a typical Litz wire. Accordingly, the AC resistance component of the coil 501 is smaller than the AC resistance component of a coil configured of a typical Litz wire.

Furthermore, according to the coil 501 shown in FIGS. 64A and 64B, even when the wire rod 521 is pulled and adjacent turns of the wire rod 521 are brought into close contact with each other while the wire rod 521 is wound, the amount of deformation occurring in the wire rod 521 may be made smaller than the amount of deformation occurring in a typical Litz wire. Furthermore, according to the coil 501 shown in FIGS. 64A and 64B, it is possible to prevent some of the plurality of turns of the wire rod 521 from floating in the thickness direction of the coil 501 relative to the other turns.

Each of FIGS. 65A and 65B is a plan view of a coil according to yet another exemplary embodiment. Each of FIGS. 66A and 66B is a plan view of a coil according to yet another exemplary embodiment. The planar shape of the coil 501 is not limited, and may be selected from a variety of shapes as shown in these drawings.

As shown in FIG. 65A, the planar shape of the coil 501 may be an annular shape, and the wire rod 521 may be wound in a circular ring shape around the central axis of the coil 501. As shown in FIG. 65B, the planar shape of the coil 501 may be an angled ring shape, and the wire rod 521 may be wound from an inner side to an outer side around the central axis of the coil 501.

As shown in FIG. 66(*a*), the planar shape of the coil 501 may be a combination of an angled ring shape and a circular ring shape. The wire rod 521 is wound from an inner side to an outer side around the central axis of coil 501 to provide a portion of the circular ring shape inside a portion of the angled ring shape of coil 501. In addition, as shown in FIG. 66(*b*), the planar shape of the coil 501 may be C-shaped or horseshoe-shaped.

Figure 67A:
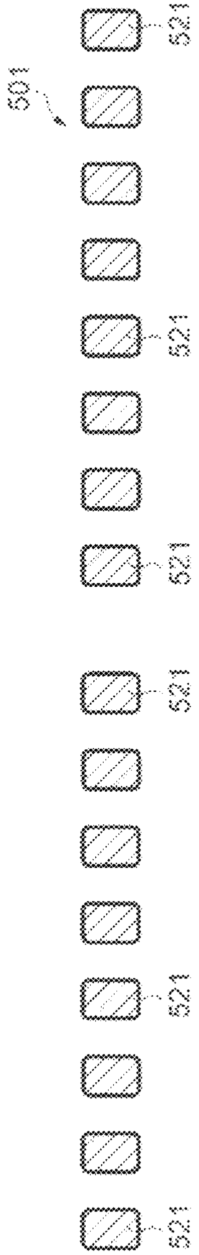
Figure 67B:
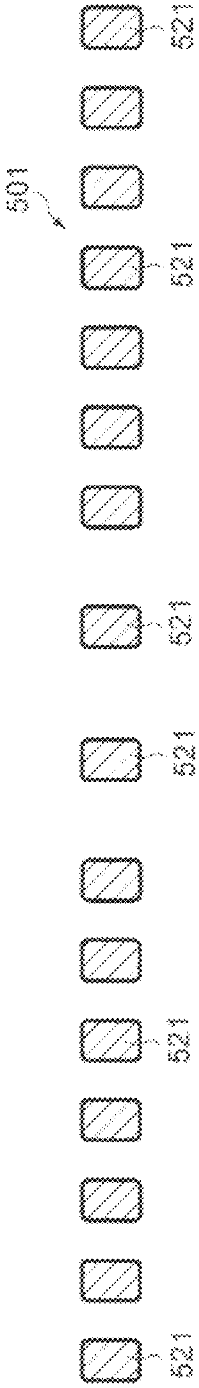
Figure 67C:
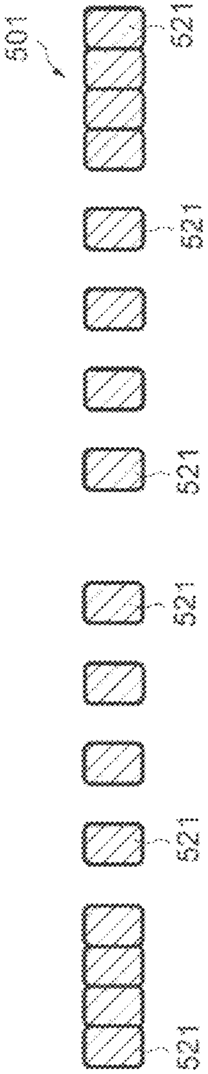
Figure 67D:
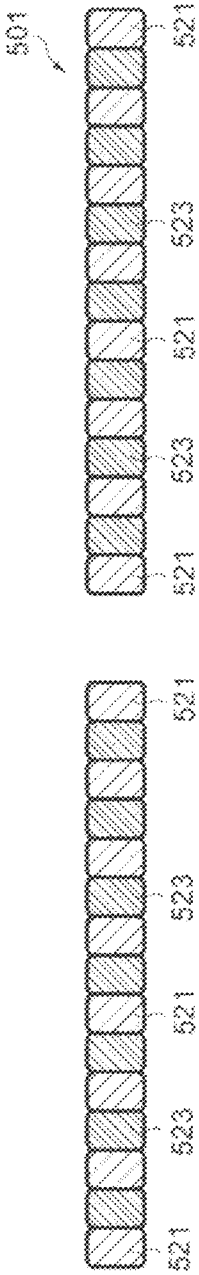

Each of FIG. 67A to 67D is a cross-sectional view of a coil according to yet another exemplary embodiment. As shown in FIG. 67A, the wire rod 521 of the coil 501 may be wound such that the pitch between the turns of the wire rod 521 in the coil 501 is equal. As shown in FIG. 67(*b*), the wire rod 521 of the coil 501 may be wound such that the turns have an uneven pitch. As shown in FIG. 67C, adjacent turns of the wire rod 521 of the coil 501 may be in close contact with each other. As shown in FIG. 67D, the wire rod 521 of the coil 501 may be wound so that members 523 are interposed between the turns. The member 523 may be made of a magnetic material or a dielectric material. The height of the member 523 may be the same as the height of the wire rod 521 or may be different. The width of the member 523 may be the same as or different from the width of the wire 521.

Each of FIGS. 68A and 68B is a cross-sectional view of a coil according to yet another exemplary embodiment. As shown in FIGS. 68A and 68B, in the coil 501, the wire rod 521 may be wound to form a plurality of layers. The plurality of layers may be spaced apart as shown in FIG. 68A or may be in close contact as shown in FIG. 68B.

Each of FIGS. 69A and 69B is a cross-sectional view of a coil according to yet another exemplary embodiment. As shown in FIGS. 69A and 69B, the cross-sectional shape of the coil 501 may be convex or concave. For example, the cross-sectional shape of the coil 501 may be conical or dome-shaped.

FIG. 70 is a cross-sectional view of a coil according to another exemplary embodiment. As shown in FIG. 70, in the coil 501, the wire rod 521 may be wound to form a plurality of layers. In at least one of the plurality of layers, the wire rod 521 may be wound such that members 523 are interposed between the turns. The member 523 may be made of a magnetic material or a dielectric material. The height of the member 523 may be the same as the height of the wire rod 521 or may be different. The width of the member 523 may be the same as or different from the width of the wire rod 521.

FIG. 71 is a cross-sectional view of a coil according to another exemplary embodiment. Each of FIGS. 72A and 72B is a cross-sectional view of a coil according to yet another exemplary embodiment. As shown in these drawings, in the coil 501, the wire rod 521 may be wound in a spiral shape. The pitch between the turns of the wire rod 521 may be equal or may be unequal. As shown in FIG. 71, adjacent turns of the wire rod 521 may be in close contact with each other. As shown in FIGS. 72A and 72B, adjacent turns of the wire rod 521 may be spaced apart. As shown in FIG. 72B, the wire rod 521 may be fixed by a comb-like member 524. The member 524 may be formed from an insulating material, for example a resin such as PEEK or PPS. Alternatively, the member 524 may be formed from a magnetic material. The member 524 may be configured of a single member or a plurality of members.

Although various exemplary embodiments have been described above, various additions, omissions, substitutions, and modifications may be made without being limited to the above-described exemplary embodiments. In addition, elements from different embodiments may be combined to form other embodiments.

Herein, various exemplary embodiments included in the present disclosure are described in [E1] to [E8] below.

[E1]

A plasma processing apparatus comprising:

a plasma processing chamber;

a substrate support disposed within the plasma processing chamber;

a high frequency power supply configured to generate high frequency power;

an electrode or an antenna electrically connected to the high frequency power supply to receive the high frequency power for generating a plasma from a gas within the plasma processing chamber;

a power consuming member disposed within the plasma processing chamber or the substrate support;

an electricity storage unit electrically connected to the power consuming member;

a power transmitting coil provided outside the plasma processing chamber;

a power receiving coil electrically connected to the electricity storage unit and capable of receiving power from the power transmitting coil by electromagnetic induction coupling;

at least one metal case that provides a shielded space and accommodates the power transmitting coil and the power receiving coil within the shielded space; and at least one ferrite material that is disposed within the shielded space and is provided to close a space in which the power transmitting coil and the power receiving coil are disposed.

[E2]

The plasma processing apparatus of E1, wherein the at least one metal case comprises:

a first metal case extending along a back surface side of the power transmitting coil relative to the power receiving coil and surrounding an outer periphery of the power transmitting coil; and a second metal case extending along a back surface side of the power receiving coil relative to the power transmitting coil and surrounding an outer periphery of the power receiving coil.

[E3]

The plasma processing apparatus of E2, wherein the at least one ferrite material comprises:

a first portion provided at the back surface side of the power transmitting coil;

a second portion provided at the back surface side of the power receiving coil;

a third portion extending from the first portion to surround the outer periphery of the power transmitting coil; and a fourth portion extending from the second portion to surround the outer periphery of the power receiving coil.

[E4]

The plasma processing apparatus of E3, further comprising an insulating plate disposed between the first metal case and the second metal case, wherein:

the third portion extends from the first portion to the insulating plate;

the fourth portion extends from the second portion to the insulating plate; and a tip of the third portion and a tip of the fourth portion face each other with the insulating plate interposed therebetween.

[E5]

The plasma processing apparatus of E1, wherein the at least one metal case is a single case providing the shielded space.

[E6]

The plasma processing apparatus of E5, wherein the at least one ferrite material comprises:

a first portion provided at a back surface side of the power transmitting coil relative to the power receiving coil;

a second portion provided at a back surface side of the power receiving coil relative to the power transmitting coil; and a third portion surrounding an outer periphery of the power transmitting coil and an outer periphery of the power receiving coil, and extending between the first portion and the second portion.

[E7]

The plasma processing apparatus of any one of E1 to E6, wherein the at least one ferrite material comprises at least one inner ferrite material extending from an inner area of the power receiving coil to an inner area of the power receiving coil.

[E8]

The plasma processing apparatus of any one of E1 to E7, wherein the at least one ferrite material is made of manganese zinc based ferrite, nickel zinc based ferrite or a nanocrystalline soft magnetic material.

From the foregoing, it will be understood that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A plasma processing apparatus comprising:

a plasma processing chamber;

a substrate support disposed within the plasma processing chamber;

a high frequency power supply configured to generate high frequency power;

an electrode or an antenna electrically connected to the high frequency power supply to receive the high frequency power for generating a plasma from a gas within the plasma processing chamber;

a power consuming member disposed within the plasma processing chamber or the substrate support;

an electricity storage unit electrically connected to the power consuming member;

a power transmitting coil provided outside the plasma processing chamber;

a power receiving coil electrically connected to the electricity storage unit and capable of receiving power from the power transmitting coil by electromagnetic induction coupling;

at least one metal case that provides a shielded space and accommodates the power transmitting coil and the power receiving coil within the shielded space; and at least one ferrite material that is disposed within the shielded space and is provided to close a space in which the power transmitting coil and the power receiving coil are disposed.

2. The plasma processing apparatus of claim 1, wherein the at least one metal case comprises:

a first metal case extending along a back surface side of the power transmitting coil relative to the power receiving coil and surrounding an outer periphery of the power transmitting coil; and a second metal case extending along a back surface side of the power receiving coil relative to the power transmitting coil and surrounding an outer periphery of the power receiving coil.

3. The plasma processing apparatus of claim 2, wherein the at least one ferrite material comprises:

a first portion provided at the back surface side of the power transmitting coil;

a second portion provided at the back surface side of the power receiving coil;

a third portion extending from the first portion to surround the outer periphery of the power transmitting coil; and a fourth portion extending from the second portion to surround the outer periphery of the power receiving coil.

4. The plasma processing apparatus of claim 2, wherein the at least one ferrite material comprises at least one inner ferrite material extending from an inner area of the power receiving coil to an inner area of the power transmitting coil.

5. The plasma processing apparatus of claim 2, wherein the at least one ferrite material is made of manganese zinc based ferrite, nickel zinc based ferrite or a nanocrystalline soft magnetic material.

6. The plasma processing apparatus of claim 3, further comprising an insulating plate disposed between the first metal case and the second metal case, wherein:

the third portion extends from the first portion to the insulating plate;

the fourth portion extends from the second portion to the insulating plate; and a tip of the third portion and a tip of the fourth portion face each other with the insulating plate interposed therebetween.

7. The plasma processing apparatus of claim 3, wherein the at least one ferrite material comprises at least one inner ferrite material extending from an inner area of the power receiving coil to an inner area of the power transmitting coil.

8. The plasma processing apparatus of claim 3, wherein the at least one ferrite material is made of manganese zinc based ferrite, nickel zinc based ferrite or a nanocrystalline soft magnetic material.

9. The plasma processing apparatus of claim 1, wherein the at least one metal case is a single case providing the shielded space.

10. The plasma processing apparatus of claim 9, wherein the at least one ferrite material comprises:

a first portion provided at a back surface side of the power transmitting coil relative to the power receiving coil;

a second portion provided at a back surface side of the power receiving coil relative to the power transmitting coil; and a third portion surrounding an outer periphery of the power transmitting coil and an outer periphery of the power receiving coil, and extending between the first portion and the second portion.

11. The plasma processing apparatus of claim 1, wherein the at least one ferrite material comprises at least one inner ferrite material extending from an inner area of the power receiving coil to an inner area of the power transmitting coil.

12. The plasma processing apparatus of claim 1, wherein the at least one ferrite material is made of manganese zinc based ferrite, nickel zinc based ferrite or a nanocrystalline soft magnetic material.

* * * * *